(12) United States Patent
Yasuda

(10) Patent No.: US 8,581,331 B2
(45) Date of Patent: Nov. 12, 2013

(54) NONVOLATILE SEMICONDUCTOR MEMORY DEVICE

(71) Applicant: Kabushiki Kaisha Toshiba, Minato-ku (JP)

(72) Inventor: Naoki Yasuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/855,127

(22) Filed: Apr. 2, 2013

(65) Prior Publication Data

US 2013/0214345 A1     Aug. 22, 2013

Related U.S. Application Data

(60) Continuation of application No. 13/545,376, filed on Jul. 10, 2012, now Pat. No. 8,426,909, which is a continuation of application No. 13/103,617, filed on May 9, 2011, now Pat. No. 8,237,217, which is a division of application No. 12/234,126, filed on Sep. 19, 2008, now Pat. No. 7,956,406.

(30) Foreign Application Priority Data

Sep. 26, 2007   (JP) .................................. 2007-250291

(51) Int. Cl.
    *H01L 29/792*     (2006.01)
(52) U.S. Cl.
    USPC .......................................... 257/324; 438/396
(58) Field of Classification Search
    USPC ........................................................ 257/324
    See application file for complete search history.

(56) References Cited

U.S. PATENT DOCUMENTS

| 6,353,242 | B1 | 3/2002 | Watanabe et al. |
| 6,693,321 | B1 | 2/2004 | Zheng et al. |
| 7,037,785 | B2 | 5/2006 | Dong et al. |
| 7,479,425 | B2 * | 1/2009 | Ang et al. ..................... 438/257 |

(Continued)

FOREIGN PATENT DOCUMENTS

| JP | 8-17945 | 1/1996 |
| JP | 8-153814 | 6/1996 |

(Continued)

OTHER PUBLICATIONS

Japanese Office Action mailed May 8, 2012, in Japanese Patent Application No. 2009-261279 (with English Translation).

(Continued)

*Primary Examiner* — Thao P. Le
(74) *Attorney, Agent, or Firm* — Oblon, Spivak, McClelland, Maier & Neustadt, L.L.P.

(57) ABSTRACT

A nonvolatile semiconductor memory device includes a charge storage layer on a first insulating film, a second insulating film which is provided on the charge storage layer, formed of layers, and a control gate electrode on the second insulating film. The second insulating film includes a bottom layer (A) provided just above the charge storage layer, a top layer (C) provided just below the control gate electrode, and a middle layer (B) provided between the bottom layer (A) and the top layer (C). The middle layer (B) has higher barrier height and lower dielectric constant than both the bottom layer (A) and the top layer (C). The average coordination number of the middle layer (B) is smaller than both the average coordination number of the top layer (C) and the average coordination number of the bottom layer (A).

19 Claims, 28 Drawing Sheets

(56) References Cited

U.S. PATENT DOCUMENTS

| | | | |
|---|---|---|---|
| 7,781,824 B2 | 8/2010 | Yasuda | |
| 7,855,114 B2 * | 12/2010 | Zheng et al. | 438/257 |
| 7,902,588 B2 | 3/2011 | Nishikawa et al. | |
| 7,956,406 B2 | 6/2011 | Yasuda | |
| 7,989,876 B2 | 8/2011 | Yasuda | |
| 8,030,701 B2 | 10/2011 | Yasuda | |
| 8,232,585 B2 * | 7/2012 | Mouli | 257/272 |
| 8,283,228 B2 * | 10/2012 | Alsmeier | 438/257 |
| 8,415,736 B2 * | 4/2013 | Nakasaki et al. | 257/316 |
| 8,466,022 B2 * | 6/2013 | Tanaka | 438/264 |
| 2003/0080366 A1 | 5/2003 | Tamura | |
| 2005/0157549 A1 * | 7/2005 | Mokhlesi et al. | 365/185.01 |
| 2006/0160303 A1 * | 7/2006 | Ang et al. | 438/257 |
| 2007/0004154 A1 | 1/2007 | Hong et al. | |
| 2008/0093657 A1 | 4/2008 | Son et al. | |
| 2008/0194066 A1 | 8/2008 | Weimer | |
| 2008/0296653 A1 | 12/2008 | Ozawa et al. | |
| 2008/0311710 A1 | 12/2008 | Herner et al. | |
| 2009/0001446 A1 | 1/2009 | Kim | |
| 2009/0021984 A1 | 1/2009 | Wang | |
| 2010/0074029 A1 | 3/2010 | Katayama | |
| 2011/0147827 A1 * | 6/2011 | Simsek-Ege et al. | 257/326 |

FOREIGN PATENT DOCUMENTS

| | | |
|---|---|---|
| JP | 2003-68897 | 3/2003 |
| JP | 2005-311300 | 11/2005 |
| JP | 2006-5006 | 1/2006 |
| JP | 2006-310662 | 11/2006 |
| JP | 2007-53171 | 3/2007 |
| JP | 2007-53392 | 3/2007 |
| JP | 2007-73926 | 3/2007 |
| JP | 2007-73969 | 3/2007 |
| JP | 2007-88422 | 4/2007 |
| JP | 2007-123825 | 5/2007 |
| JP | 2007-123945 | 5/2007 |
| JP | 2007-134681 | 5/2007 |
| KR | 10-0648860 B1 | 11/2006 |

OTHER PUBLICATIONS

Office Action issued on May 11, 2011, in corresponding to Chinese Patent Application No. 200810161780.0 (with English Translation).

G. Lucovsky et al., "Bonding constraints and defect formation at interfaces between crystalline and advanced single layer and composite gate dielectrics", Applied Physics Letter, vol. 74, No. 14, Apr. 5, 1999, pp. 2005-2007.

G. Lucosky, "High-K Gate Dielectrics", Edited by M. Houssa, Institute of Physics Publishing Limited, 2004, p. 339.

Zong Liang Huo et al., "Band Engineered Charge Trap Layer for Highly Reliable MLC Flash Memory", 2007 Symposium on VLSI Technology Digest of Technical Papers, 8B-1, 2007, pp. 138-139.

K. Iwamoto et al., "Performance improvement of n-MOSFETs with constituent gradient HfO2/SiO2 interface", Microelectronic Engineering, vol. 80, 2005, pp. 202-205.

Eiichi Suzuki et al., "Traps created at the interface between the nitride and the oxide on the nitride by thermal oxidation", Appl. Phys. Lett., vol. 42, No. 7, Apr. 1, 1983, pp. 608-610.

* cited by examiner

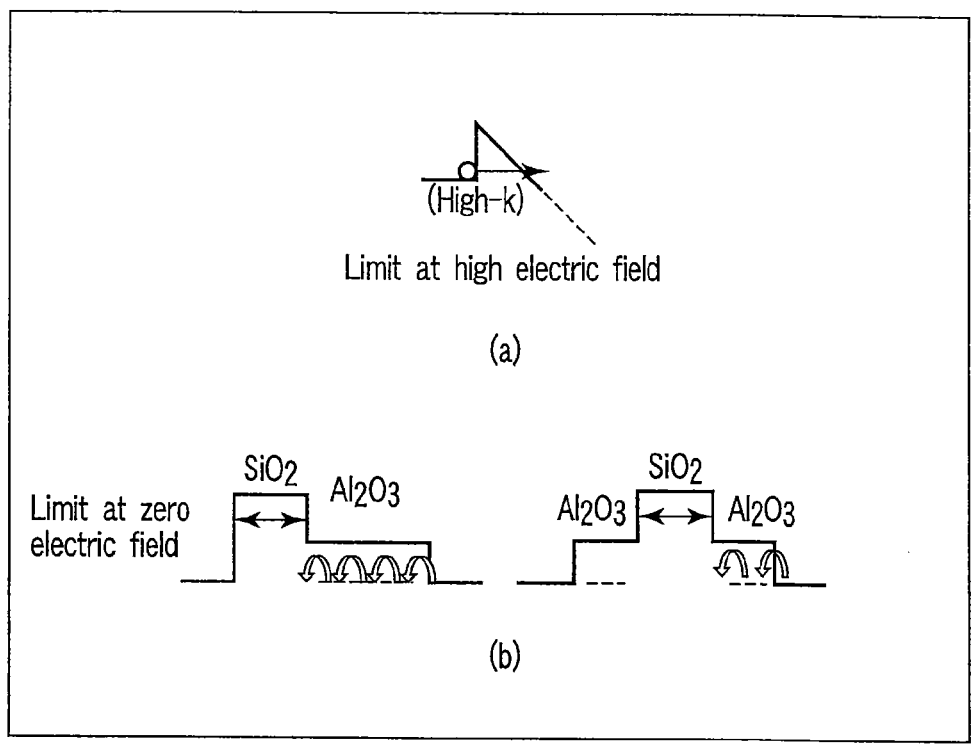
F I G. 1

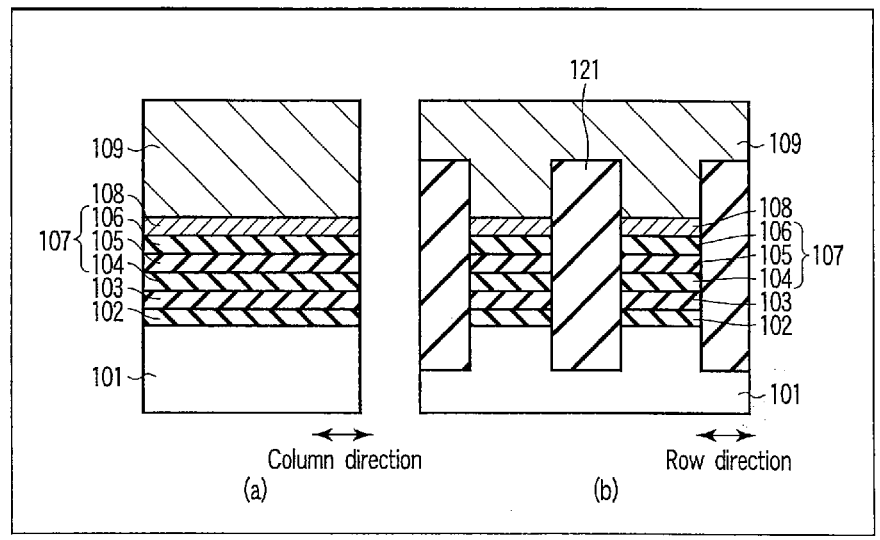
F I G. 9
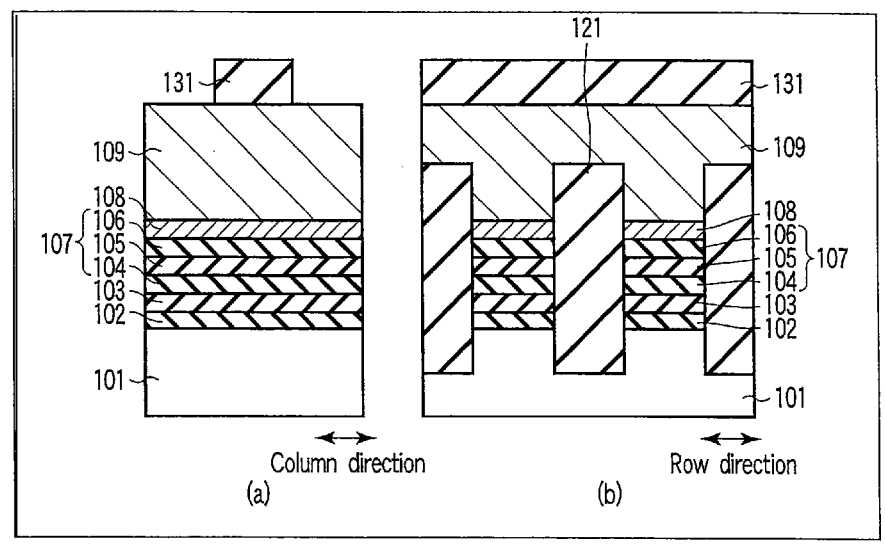
F I G. 10

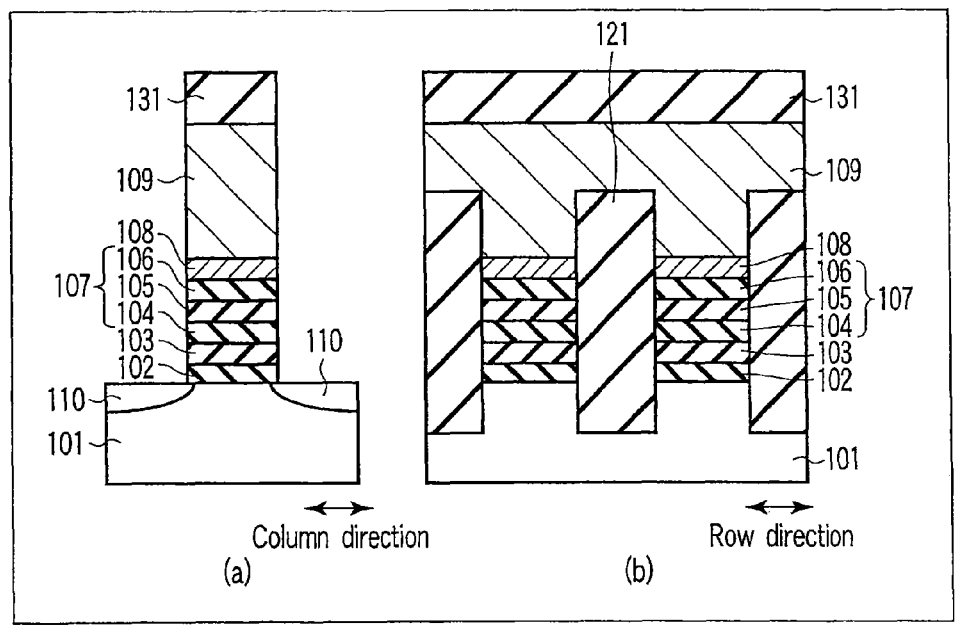
F I G. 11
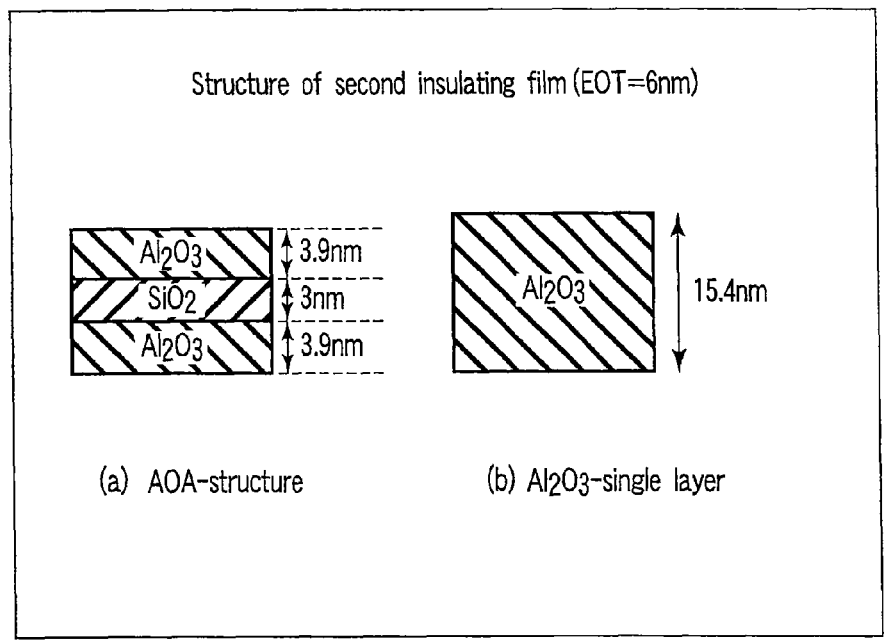
F I G. 12

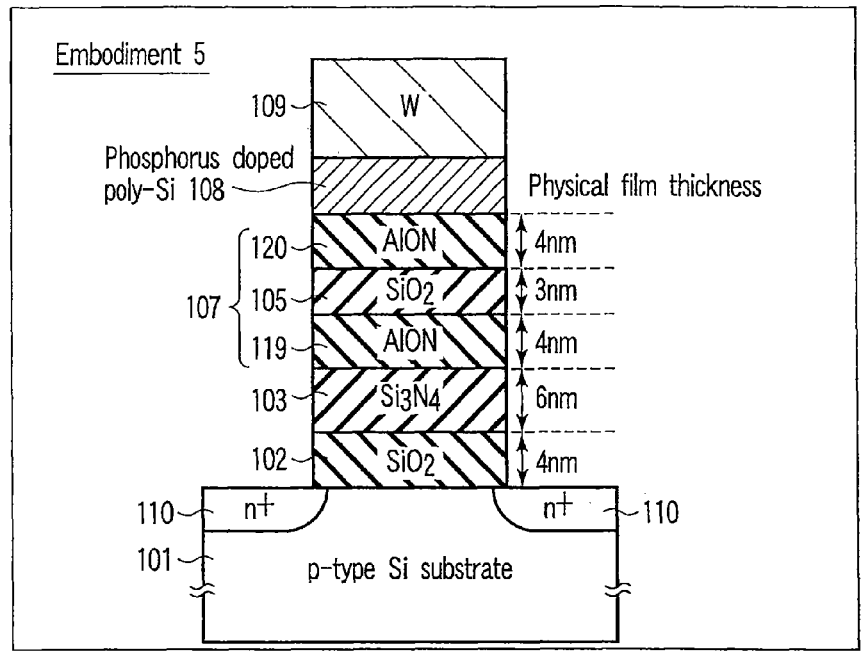
F I G. 24
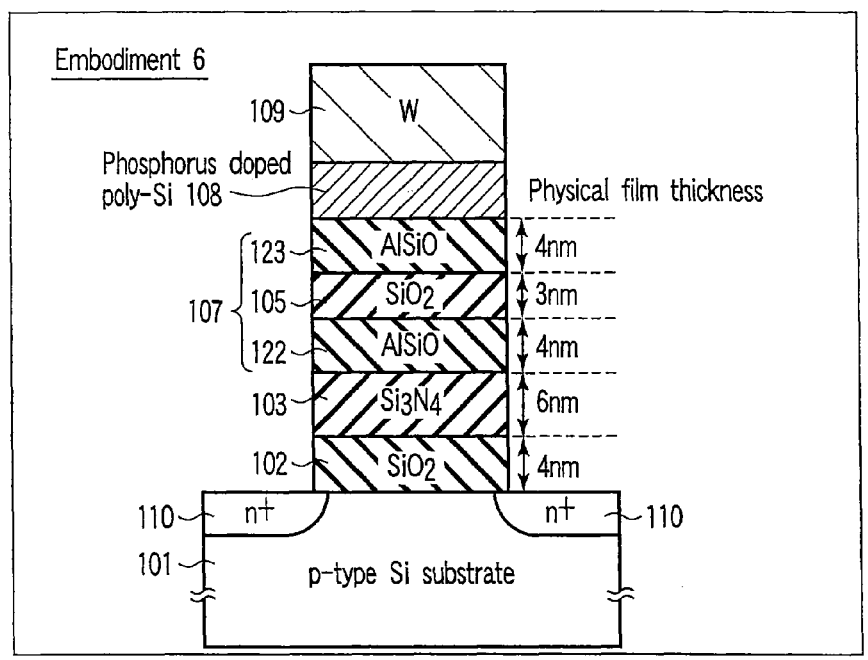
F I G. 25

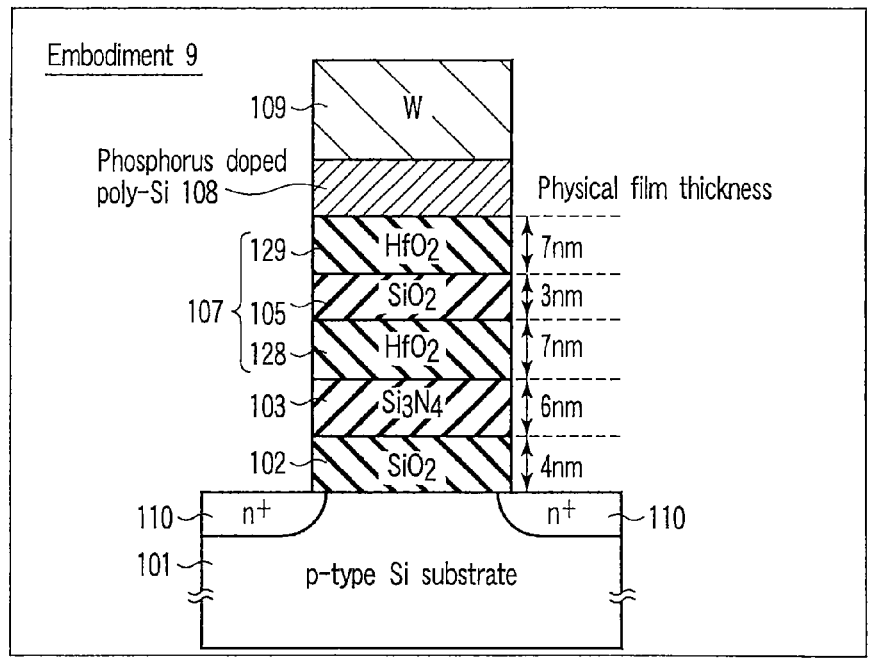
F I G. 28
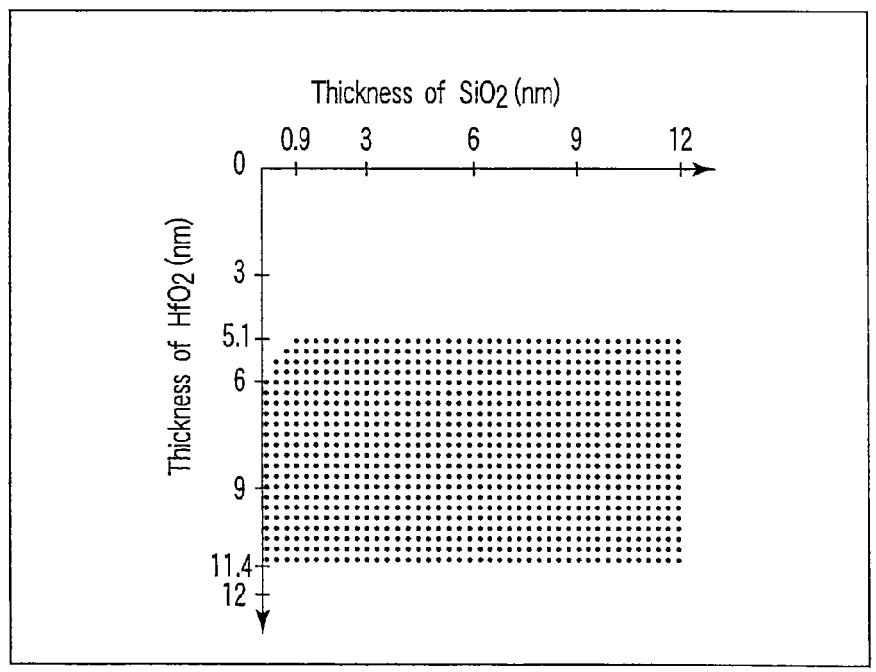
F I G. 29

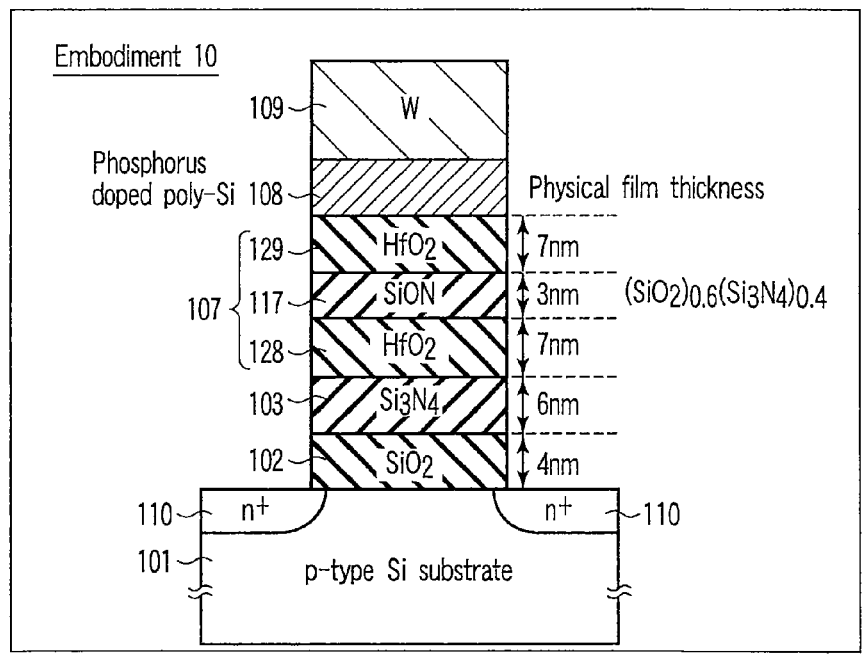
F I G. 30
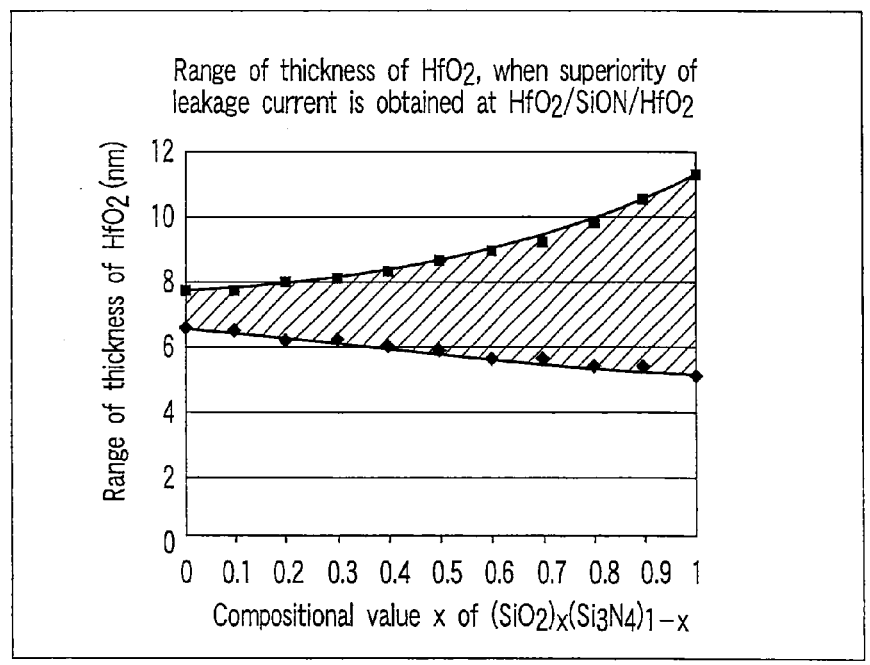
F I G. 31

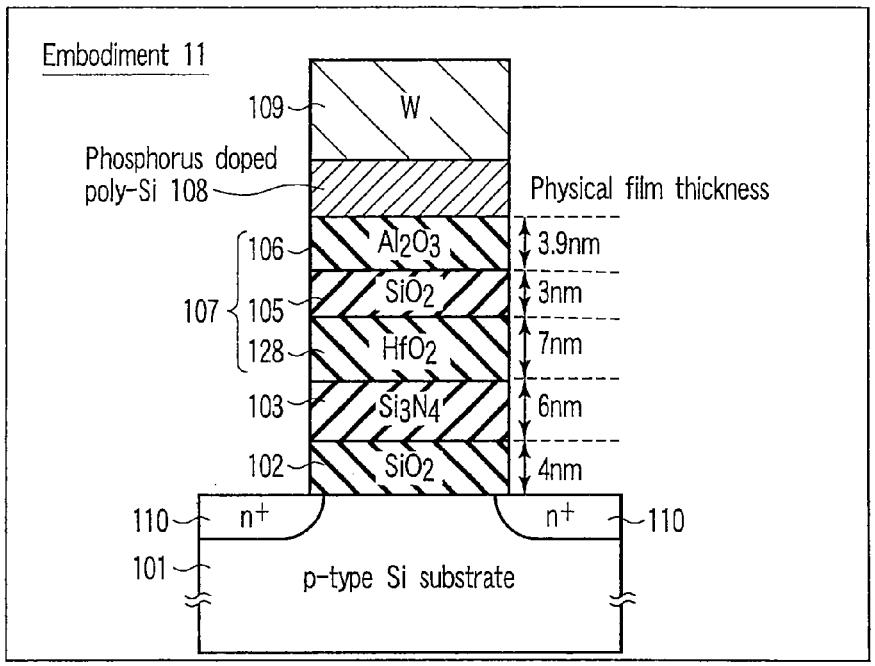
F I G. 32
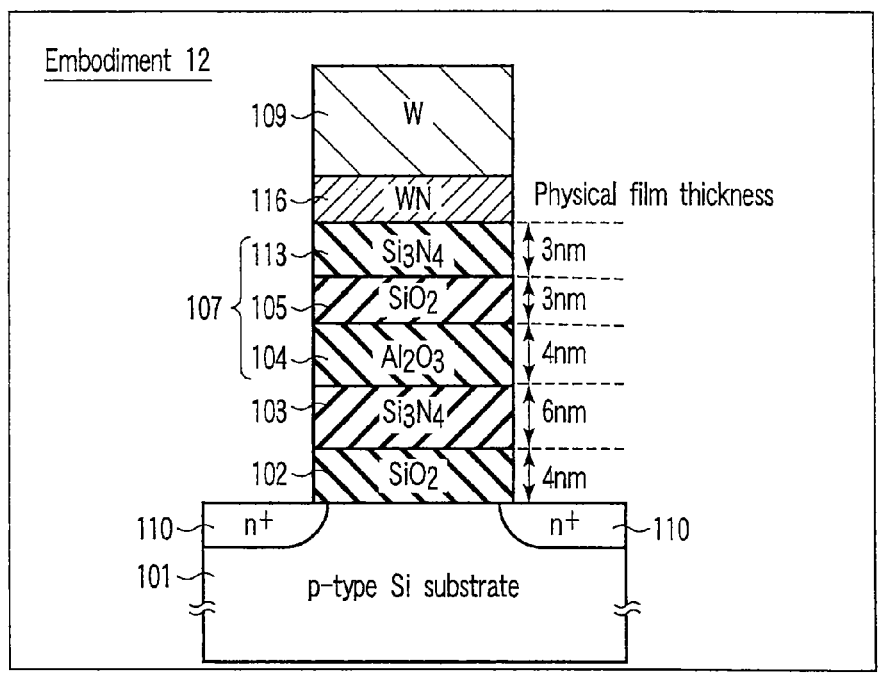
F I G. 33

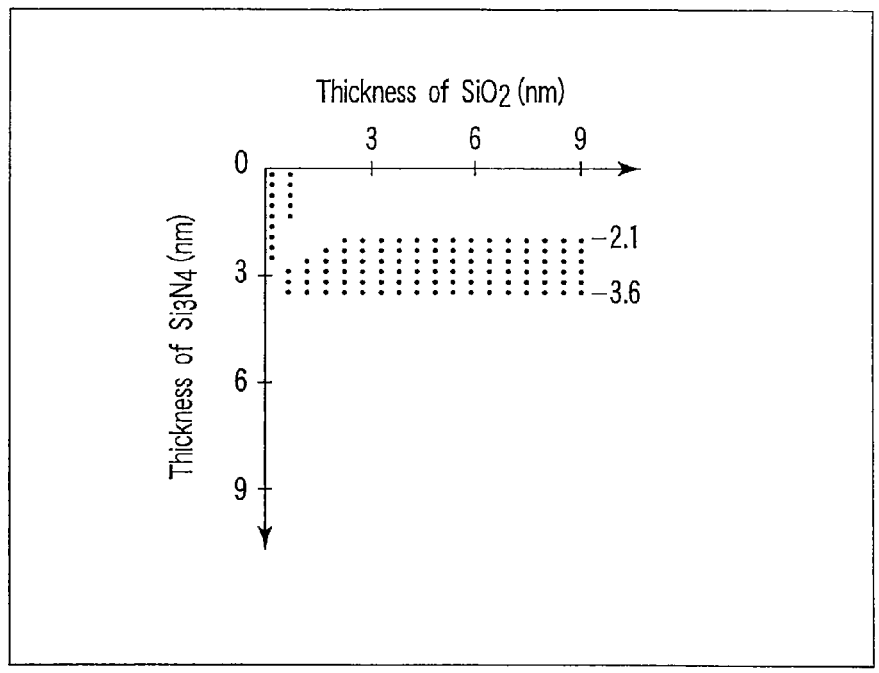
F I G. 34
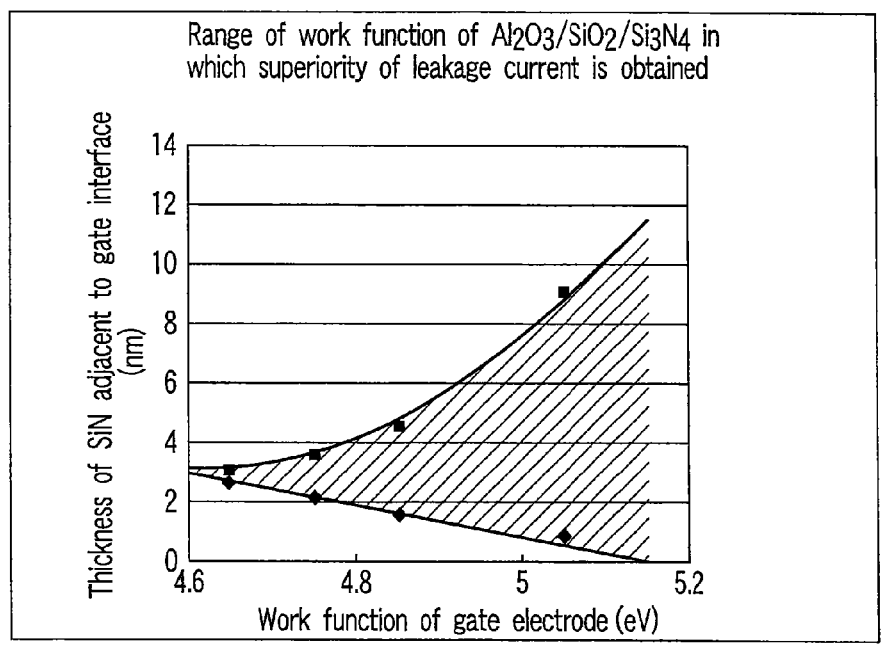
F I G. 35

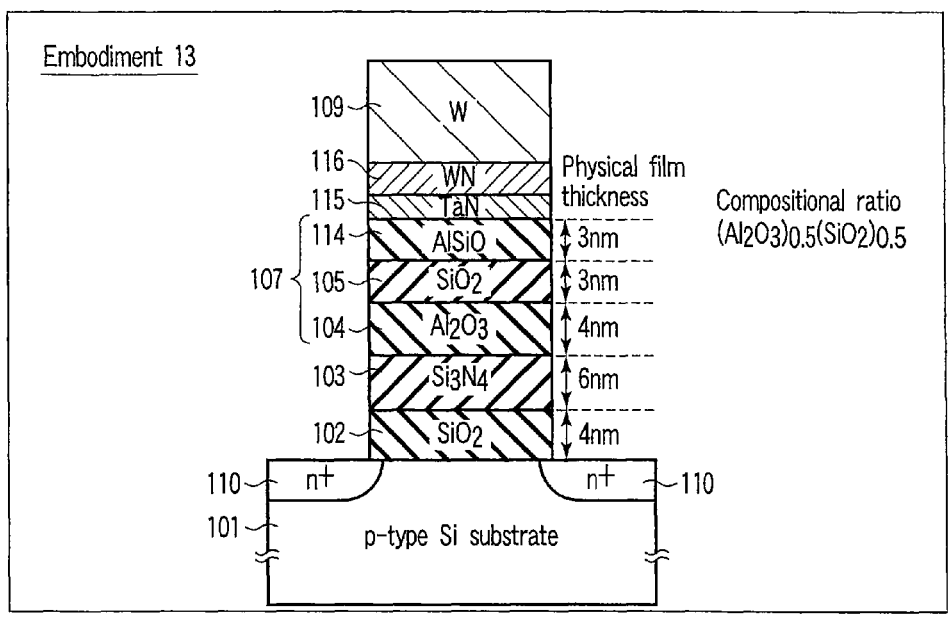
F I G. 36

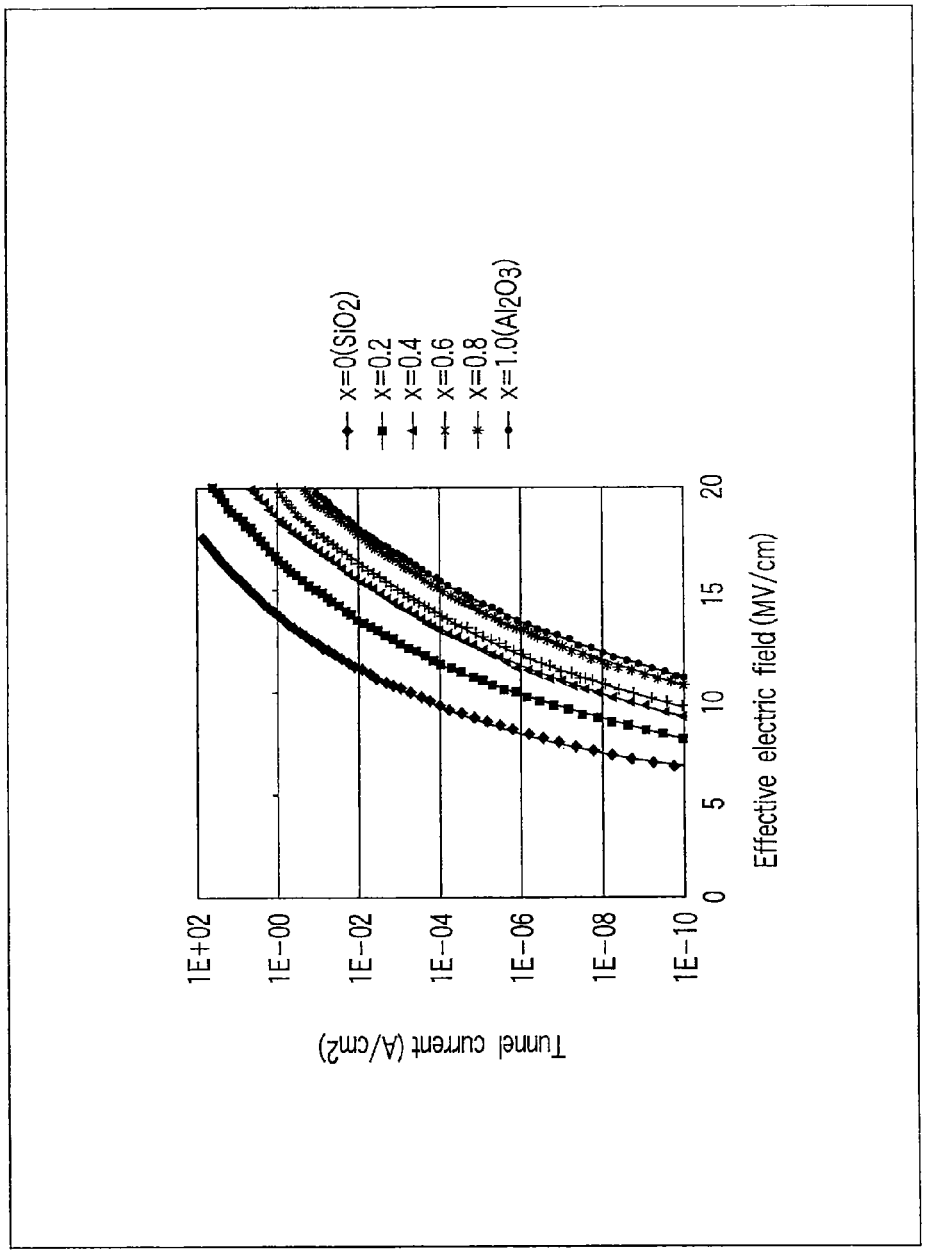
F I G. 37

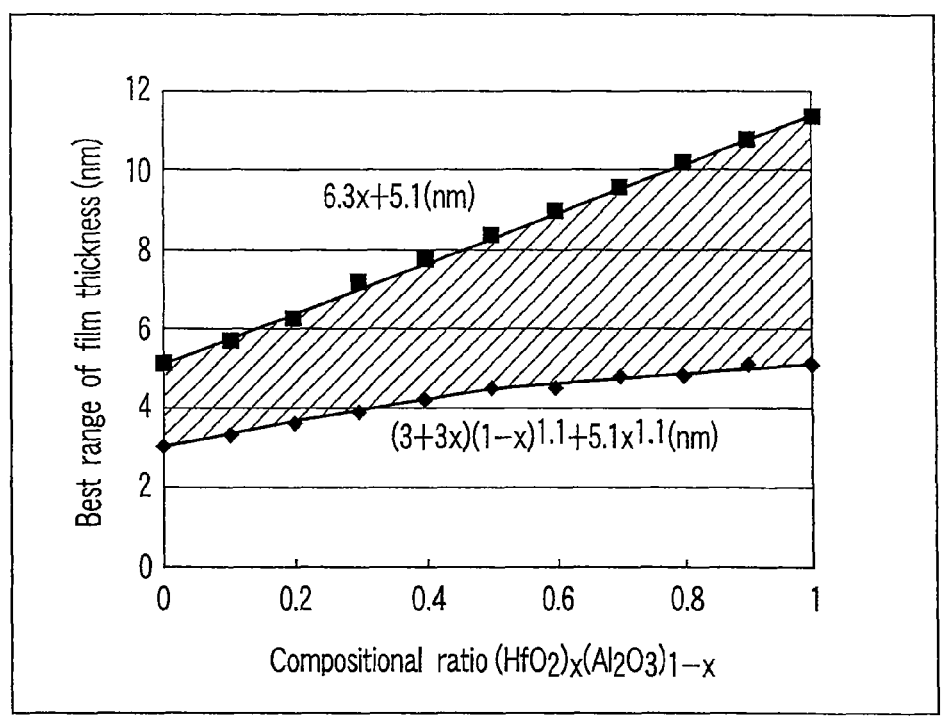
F I G. 47

NONVOLATILE SEMICONDUCTOR MEMORY DEVICE

CROSS-REFERENCE TO RELATED APPLICATIONS

This application is a continuation of U.S. application Ser. No. 13/545,376 filed Jul. 10, 2012, which is a continuation of U.S. application Ser. No. 13/103,617 filed May 9, 2011, which is a divisional of U.S. application Ser. No. 12/234,126 filed Sep. 19, 2008, and is based upon and claims the benefit of priority from prior Japanese Patent Application No. 2007-250291, filed Sep. 26, 2007, the entire contents of each of which are incorporated herein by reference.

BACKGROUND OF THE INVENTION

1. Field of the Invention

The present invention relates to a nonvolatile semiconductor memory device having a memory cell with stack gate structure, and particularly, is used for a fine NAND type flash memory.

2. Description of the Related Art

A stack gate structure of a memory cell in the NAND type flash memory is formed of a first insulating film formed on a Si substrate, a charge storage layer formed on the first insulating film, and further a second insulating film formed on the charge storage layer. The first insulating film is named as "a tunnel insulating film", and when applying high electric field to this insulating film, exchanging charges between the Si substrate and the charge storage layer is performed.

Additionally, although the charge storage layer was a floating gate electrode formed of polycrystalline silicon conventionally, introduction of the charge storage layer formed of an insulating film such as a silicon nitride film is taking place in accordance with the progress of microfabrication of the memory cell.

The second insulating film is named as "an inter-poly insulating film" when the charge storage layer is the floating gate formed of the polycrystalline silicon, while when the charge storage layer is formed of the insulating film, the second insulating film is named as "a block insulating film". Also in both cases, it is necessary for the second insulating film to have higher insulating properties as compared with the first insulating film.

A high dielectric constant (High-k) insulating film formed of metal oxide has an effect to suppress a leakage current in a high electric field region, because physical thickness can be made to increase without increasing electric thickness. For that reason, there is investigated using the high-dielectric-constant (High-k) insulating film as the second insulating film of the memory cell (for instance, refer to JP-A 2003-68897 (KOKAI)).

However, the High-k insulating film involves larger amount of defects within a film and an interface, as compared with the insulating film of a silicon oxide film system. For that reason, in the memory cell in which the High-k insulating film is used for the second insulating film, while the window of a threshold voltage at the time of write/erase is enlarged, deterioration of data retention characteristics is caused by a leakage current at a low electric field region.

As described above, in the conventional second insulating film, there is a problem that it is not possible to improve both high electric field leakage current characteristics and low electric field leakage current characteristics simultaneously.

BRIEF SUMMARY OF THE INVENTION

A nonvolatile semiconductor memory device according to an aspect of the present invention comprises source/drain layers provided separately from each other on a surface of a semiconductor substrate, a first insulating film provided on a channel between the source/drain layers, a charge storage layer provided on the first insulating film, a second insulating film which is provided on the charge storage layer, formed of a plurality of layers, and a control gate electrode provided on the second insulating film. The second insulating film includes a bottom layer (A) provided above the charge storage layer, a top layer (C) provided below the control gate electrode, and a middle layer (B) provided between the bottom layer (A) and the top layer (C), and the middle layer (B) has higher barrier height and lower dielectric constant than both the bottom layer (A) and the top layer (C). Further, an average atomic coordination number of the middle layer (B) is smaller than both an average coordination number of the top layer (C) and an average coordination number of the bottom layer (A), as to average coordination numbers of elements forming respective films of the second insulating film.

A nonvolatile semiconductor memory device according to an aspect of the present invention comprises source/drain layers provided separately from each other on a surface of a semiconductor substrate, a first insulating film provided on a channel between the source/drain layers, a charge storage layer provided on the first insulating film, a second insulating film which is provided on the charge storage layer, formed of a plurality of layers, and a control gate electrode provided on the second insulating film. The second insulating film includes a bottom layer (A) provided above the charge storage layer, a top layer (C) provided below the control gate electrode, and a middle layer (B) provided between the bottom layer (A) and the top layer (C), and the middle layer (B) is formed of one of an oxide or an oxynitride, whose compositional ratio of silicon is larger than both the bottom layer (A) and the top layer (C).

A nonvolatile semiconductor memory device according to an aspect of the present invention comprises source/drain layers provided separately from each other on a surface of a semiconductor substrate, a first insulating film provided on a channel between the source/drain layers, a charge storage layer provided on the first insulating film, a second insulating film which is provided on the charge storage layer, and a control gate electrode provided on the second insulating film. A dielectric constant, a barrier height and an average coordination number of the second insulating film vary continuously in a thickness direction, and in a middle part of the second insulating film in the thickness direction, the dielectric constant and the average coordination number become minimum, while the barrier height becomes maximum.

A nonvolatile semiconductor memory device according to an aspect of the present invention comprises source/drain layers provided separately from each other on a surface of a semiconductor substrate, a first insulating film provided on a channel between the source/drain layers, a charge storage layer provided on the first insulating film, a second insulating film which is provided on the charge storage layer, and a control gate electrode provided on the second insulating film. A dielectric constant, a barrier height and an average coordination number of the second insulating film vary continuously in a thickness direction, and a middle part of the second insulating film in the thickness direction where the dielectric constant and the barrier height result in extremal values is formed of one of oxide and oxynitride whose compositional ratio of silicon is larger than other parts of the second insulating film.

BRIEF DESCRIPTION OF THE SEVERAL VIEWS OF THE DRAWING

FIG. 1 is an explanation view of electric conduction in a high electric field region and a low electric field region;

FIG. 9 is a cross sectional view showing a method of manufacturing a cell structure of the embodiment 1;

FIG. 10 is a cross sectional view showing a method of manufacturing a cell structure of the embodiment 1;

FIG. 11 is a cross sectional view showing a method of manufacturing a cell structure of the embodiment 1;

FIG. 12 is an explanation view showing a structure as an object of comparison of a leakage current;

FIG. 24 is a cross sectional view showing a cell structure of an embodiment 5;

FIG. 25 is a cross sectional view showing a cell structure of an embodiment 6;

FIG. 28 is a cross sectional view showing a cell structure of an embodiment 9;

FIG. 29 is a view showing an appropriate thickness range of hafnia and a silicon oxide film;

FIG. 30 is a cross sectional view showing a cell structure of an embodiment 10;

FIG. 31 is a view showing relation between range of a thickness of hafnia and a compositional value of a silicon oxynitride film;

FIG. 32 is a cross sectional view showing a cell structure of an embodiment 11;

FIG. 33 is a cross sectional view showing a cell structure of an embodiment 12;

FIG. 34 is a view showing an appropriate thickness range of a silicon nitride film and a silicon oxide film;

FIG. 35 is a view showing relation between a work function of a gate electrode and a thickness of a silicon nitride film at a gate interface;

FIG. 36 is a cross sectional view showing a cell structure of an embodiment 13;

FIG. 37 is a characteristic view showing compositional dependency of current vs. effective electric field characteristics of aluminum silicate;

FIG. 47 is a view showing relation between a compositional ratio of hafnium aluminate and range of an optimum thickness.

DETAILED DESCRIPTION OF THE INVENTION

A nonvolatile semiconductor memory device of an aspect of the present invention will be described below in detail with reference to the accompanying drawings.

1. PRINCIPLE OF THE PRESENT INVENTION

First, there will be explained a basic concept for suppressing a leakage current of the second insulating film as a block insulating film in both a high electric field region and a low electric field region.

The block insulating film is defined below:

The block insulating film is an insulator which blocks an electron flow between a charge storage layer and a control gate electrode.

As shown in FIG. 1A, a tunneling current is the dominant leakage current in a high electric field region. The tunneling current is determined by an "entrance" where charges are injected into the second insulating film, that is, being determined by insulating film materials in the vicinity of a cathode edge. Therefore, using high dielectric constant insulating film materials in the vicinity of the cathode edge is more advantageous to suppress the leakage current in a high electric field region.

Meanwhile, since a high electric field operation of a memory cell has both write and erase, and opposite voltages are applied for these operations, the high dielectric constant insulating film may be located at both ends of the second insulating film.

On the other hand, in order to suppress the leakage current of the second insulating film in a low electric field region, it is conceivable that an insulating film of a silicon oxide film system, which has low density of defects that act as a path for electric conduction, is to be inserted into the second insulation film.

FIG. 1B shows a schematic view of the electric conduction corresponding to limits of zero electric field. As the electric field becomes lower, it becomes less important where the silicon oxide film system is located in the second insulating film.

That is, blocking performance of leakage current in a low electric field region is determined by the thickness of the silicon oxide film system, irrelevant to its position in the thickness direction.

Accordingly, it is desirable for the second insulating film to have a structure as being such that there is provided the high dielectric constant insulating film outside, with a middle insulating film layer of the silicon oxide film system with low defects sandwiched inside.

In this case, since the insulating film of the silicon oxide film system provided in the middle region has a higher potential barrier (barrier height) than the high dielectric constant insulating film, the effect to reduce the leakage current is expected not only in the low electric field region but also in the high electric field region, as described later.

Note that "barrier height" (or "band offset") is defined as an energy level of the conduction band edge of each layer with that of the Si substrate as a reference, in the condition that no external electric field is applied, and an energy band is flat.

Figure 2:
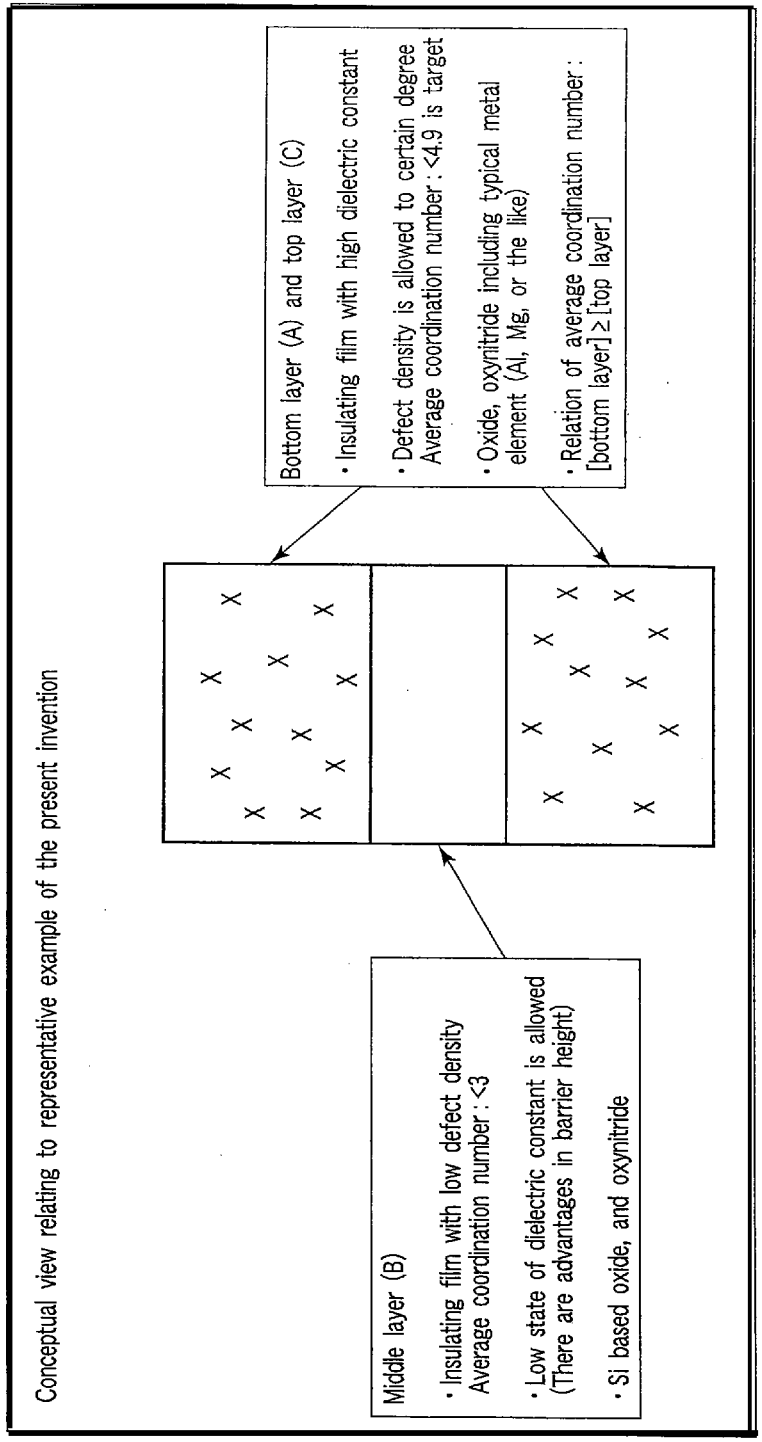
FIG. 2 is a conceptual view relating to representative example of the present invention.

As shown in FIG. 2, according to the above concept, in the present invention, there is adopted a constitution in which a middle layer (B) as a low dielectric constant insulating film is sandwiched between a bottom layer (A) and a top layer (C), as high dielectric constant insulating films.

Attention should be paid to the concept that decreasing defects within a film is most important for suppression of low electric field leakage current, and that increasing the dielectric constant of a film is most important for suppression of high electric field leakage current.

Because, the leakage current caused by in-film defects has gradual electric field dependency, and becomes dominant in the low electric field region, while an intrinsic leakage current determined by the dielectric constant of the film and the barrier height has a steep electric field dependency, and becomes predominant in the high electric field region.

Since the bottom layer (A) and the top layer (C) mainly exercise functions to suppress the leakage current in the high electric region, it is the first priority that the dielectric constant is high. Accordingly, the in-film defects may be allowed in some degrees. On the other hand, since the main purpose of the middle layer (B) is to block the low electric field leakage current, material selection should be performed in such a way that low defect concentration is the first priority.

Meanwhile, in large cases, the dielectric constant of the middle layer (B) tends to become low when the material selection of the middle layer (B) is performed so that low defect concentration is the first priority. Although it may seem that this phenomenon is contradictory to the decrease of leakage current in the high electric field region, as a matter of fact, it is not.

When an insulating film of the silicon oxide film system with low dielectric constant is used positively as the middle layer (B), an unexpected effect is obtained as being such that not only the low electric field leakage current decreases, but also the leakage current in the high electric field region decreases.

Figure 3A:
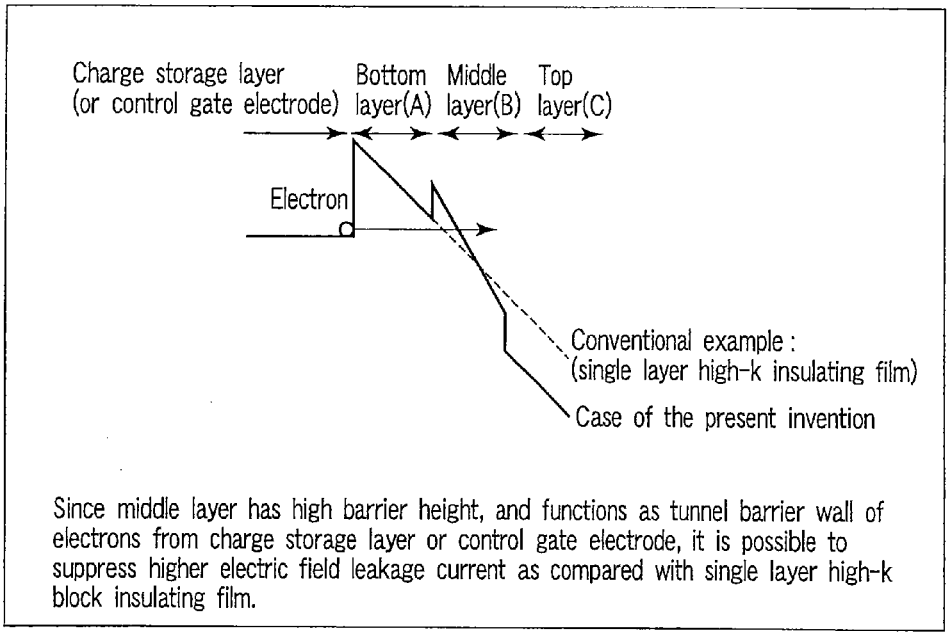
FIGS. 3A and 3B are explanation views showing a role of the second insulating film of the present invention.
Figure 3B:
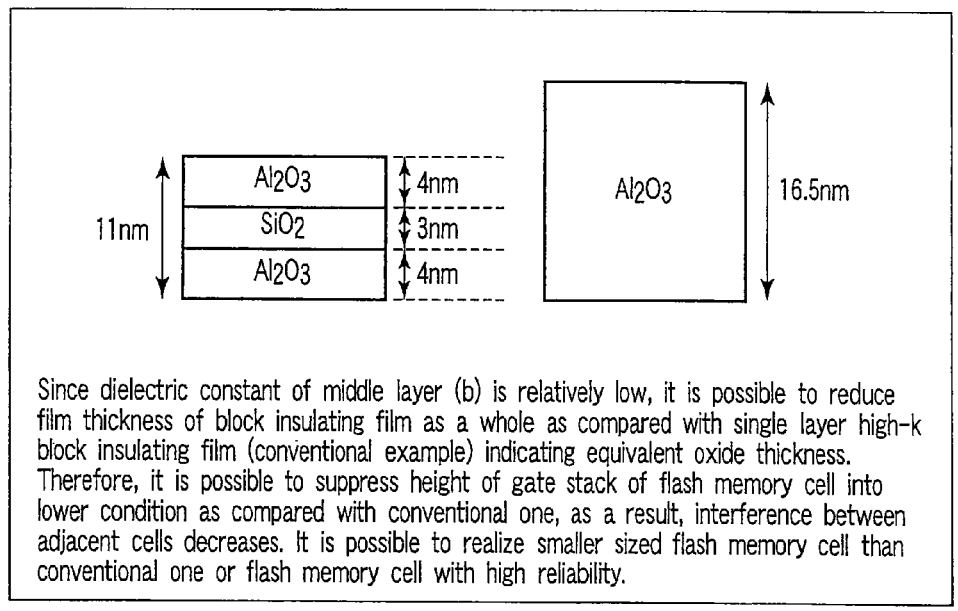

Because the insulating film with the low dielectric constant has generally a high barrier height, as shown in FIG. 3A, the barrier of the middle layer (B) functions as a tunneling barrier for electrons in the high electric field region.

This effect cannot be obtained with a block insulating film formed of a single-layered high dielectric constant insulating film. By using the low dielectric constant middle layer (B) with low defect density, the effect of decreasing the leakage current is obtained not only in the low electric field region but also in the high electric field region.

Additionally, with respect to relation between the bottom layer (A) and the top layer (C), there should be paid attention that the higher defect density may be allowed for the bottom layer (A) as compared with the top layer (C). This is because the charge storage layer exists just under the bottom layer (A), and therefore the defects of the bottom layer (A) may function as an integrated portion of traps of the charge storage layer.

In contrast, in the top layer (C), since there is a control gate just above the top layer (C), when the top layer (C) performs capture and emission of electric charges, instability of threshold voltage or deterioration of data retention characteristics become generated. Therefore, the defect density of the top layer (C) should be maintained low compared with the bottom layer (A).

One method to maintain the low defect density of the top layer (C) is to use insulating film materials with lower dielectric constant compared with the bottom layer (A). In this case, increase of leakage current in the high electric field region accompanied with lower dielectric constant can be compensated by deepening a work function of the control gate electrode.

Next, there will be described quantification of the "defect density" in the films which has been used in the discussion so far.

Although it is difficult to measure and to evaluate directly the defect density in the films, it has been found that the defect density within the insulating film corresponds to constraints imposed on the bonds of constituent atoms, according to the research by G. Lucovsky et al.

This "bond constraint" is proportional to an average coordination number: $N_{av}$ of atoms forming the insulating film. Therefore, the "average coordination number" can be used as a quantitative index relating to the defect density. Additionally, it is known that $N_{av}=3$ becomes the boundary (critical point) for determining whether the defect density is large or small. (for instance, refer to G. Lucovsky, Y. Wu, H. Niimi, V. Misra, L. C. Phillips, "Bonding constraints and defect formation at interfaces between crystalline silicon and advanced single layer and composite gate dielectrics," Appl. Phys. Lett. 74, 2005 (1999)).

The average coordination number of the respective elements is indicated, for instance, in Table 4.2.1 of p. 339 of "High-k Gate Dielectrics," Edited by M. Houssa, Institute of Physics Publishing Limited (2004). When referring to this Table, the average coordination number for typical insulating film materials used in the present invention is represented as follows.

The average coordination number $N_{av}$ of the silicon oxynitride film (including the silicon oxide film, and the silicon nitride film): $(SiO_2)_x(Si_3N_4)_{1-x}$ ($0 \leq x \leq 1$) is calculated below.

Si atom has 4-fold coordination, oxygen atom has 2-fold coordination, and nitrogen atom has 3-fold coordination. Since existence ratios of the respective atoms are [Si]:[O]:[N]= $(3-2x)/(7-4x)$, $2x/(7-4x)$, $4(1-x)/(7-4x)$, the average coordination number $N_{av}$ of the silicon oxynitride film is represented as:

$$N_{av} = 4\frac{3-2x}{7-4x} + 2\frac{2x}{7-4x} + 3\frac{4(1-x)}{7-4x} = \frac{8(3-2x)}{7-4x} \quad (1)$$

For silicon nitride ($Si_3N_4$), in which the compositional ratio is $x=0$, $N_{av}$ is $N_{av}=24/7=3.43$. Since $N_{av}$ becomes $N_{av}>3$, silicon nitride falls in the category of the film with many defects.

On the other hand, for the limit of silicon oxide ($SiO_2$), in which the compositional ratio is $x=1$, $N_{av}$ is $N_{av}=8/3=2.67$. Since $N_{av}$ becomes $N_{av}<3$, silicon oxide is the film with few defects. By putting $N_{av}$ to $N_{av}=3$ in the formula (1), the corresponding compositional ratio x is obtained as 0.75.

For another example, the average coordination number of hafnium aluminate (including alumina, hafnia) $(HfO_2)_x$ $(Al_2O_3)_{1-x}$ ($0 \leq x \leq 1$) is calculated below.

Hf atom has 8-fold coordination, Al atom has 4.5-fold coordination (Al of 4-fold coordination and Al of 6-fold coordination exist at the ratio of 3:1), and oxygen atom has $\{3(1-x)+4x\}$-fold coordination (oxygen bonded to alumina has 3-fold coordination, and oxygen bonded to hafnia has 4-fold coordination, this is average value thereof).

Since existence ratios of the respective atoms are [Hf]:[Al]:[O]=$x/(5-2x)$, $2(1-x)/(5-2x)$, $(3-x)/(5-2x)$, the average coordination number $N_{av}$ of hafnium aluminate is calculated as:

$$N_{av} = 8\frac{x}{5-2x} + 4.5\frac{2(1-x)}{5-2x} + \{3(1-x)+4x\}\frac{3-x}{5-2x} = \frac{18-x-x^2}{5-2x} \quad (2)$$

For the limit of alumina ($Al_2O_3$) in which the compositional ratio is $x=0$, $N_{av}$ is $N_{av}=3.6$. Thus, alumina is an insulating film with relatively small number of defects. On the other hand, for hafnia ($HfO_2$) in which the compositional ratio is $x=1$, $N_{av}$ is $N_{av}=5.33$. Thus hafnia is a film which falls in the category of the film with high average coordination number and many defects.

Next, there is investigated how the average coordination number should be in the respective layers.

As for the middle layer (B), it can be said that an insulating film with few absolute amount of defect density is necessary, and that its condition is $N_{av} \leq 3$. When realizing this condition of the average coordination number with silicon oxynitride $(SiO_2)_x(Si_3N_4)_{1-x}$, the compositional range is $0.75 \leq x \leq 1$.

Therefore, when the middle layer (B) is formed of the silicon oxynitride film (including silicon oxide film), it is desirable to adopt the compositional range of $0.75 \leq x \leq 1$.

There is investigated the average coordination number to be adopted by the bottom layer (A) and the top layer (C), in the following.

For instance, as shown in G. Lucovsky, Y. Wu, H. Niimi, V. Misra, L. C. Phillips, "Bonding constraints and defect formation at interfaces between crystalline silicon and advanced single layer and composite gate dielectrics," Appl. Phys. Lett. 74, 2005 (1999)), the defect density increases in approximately proportional to the square of an over-coordination of the average coordination number.

Thus the relation between $N_{av}$ and the defect density is shown in Table 1, by referring to experimental results of silicon oxynitride films and taking into account that the defect density for $N_{av}=3$ is about $10^{11}$ cm$^{-2}$.

It should be noted here that there is no distinction between the block insulating film and the charge storage layer when the defect density in the block insulating film becomes an order of $10^{13}$ cm$^{-2}$, since the defect density of the block insulating film becomes the same degree as the trap density of the charge storage layer.

Therefore, the defect density in the block insulating film around $10^{13}$ cm$^{-2}$ means that the blocking insulating film gives predominant influence over the deterioration of the data retention characteristics of MONOS (metal/oxide/nitride/oxide/silicon) type flash memory. For that reason, generally, it is difficult to use the insulating film whose average coordination number is higher than 4.9 (refer to Table 1) as the block insulating film.

However, as an exception, average coordination number higher than 4.9 may be allowed for the bottom layer (A) from the viewpoint that it is positioned at immediately above the charge storage layer, and that its defects can function integrally with the traps of the charge storage layer.

TABLE 1

| $N_{av}$ | $(N_{av}-N_{av}*)^2$ | Corresponding defect density (cm$^{-2}$) |
|---|---|---|
| 3.0 | 0.1 | $\sim 10^{11}$ |
| 3.4 | 0.5 | $\sim 10^{12}$ |
| 4.9 | 5 | $\sim 10^{13}$ |

From the above consideration, the average coordination number of the top layer (C) is to be $N_{av}<4.9$. It is also desirable for the average coordination number of the bottom layer (A) to be $N_{av}<4.9$; however, exceptionally, the average coordination number more than 4.9 may be used.

As one example, when adopting the hafnium aluminate for the insulating film materials of the bottom layer (A) and the top layer (C), from the formula (2), the average coordination number $N_{av}=4.9$ corresponds to $x=0.81$ as the compositional ratio of $(HfO_2)_x(Al_2O_3)_{1-x}$. Therefore, when forming the top layer (C) with the hafnium aluminate (including alumina), the compositional ratio should be made smaller than 0.81.

On the other hand, when forming the bottom layer (A) with the hafnium aluminate (including alumina, hafnia), it is desirable for the compositional ratio to be not more than 0.81; however, the compositional ratio not less than 0.81 may be allowed.

Additionally, the composition and the average coordination number of the top layer (C) should be prioritized in the case where the bottom layer (A) and the top layer (C) are formed with the same material. For instance, when forming the bottom layer (A) and the top layer (C) by the hafnium aluminate with the same composition, the both compositional ratios should be 0.81 or less.

Finally, from the viewpoint of the average coordination number, combinations of the most desirable bottom layer (A), middle layer (B) and top layer (C) are shown in Table 2.

TABLE 2

| | First | Second | Third | Four-th |
|---|---|---|---|---|
| Top layer (C) | $N_{av}<4.9$ | $N_{av}<4.9$ | $N_{av} \geq 4.9$ | $N_{av}<4.9$ |
| Middle layer (B) | $N_{av}<3$ | $N_{av}<3$ | $N_{av}<3$ | $N_{av} \geq 3$ |
| Bottom layer (A) | $N_{av}<4.9$ | $N_{av} \geq 4.9$ | $N_{av} \geq 4.9$ | $N_{av}<4.9$ |

Here, the combinations of the first to the fourth average coordination number are arranged in the order in which the present invention shows larger effect in turn.

The first desirable case is that $N_{av}$ is $N_{av}<4.9$ in the bottom layer (A), $N_{av}$ is $N_{av}<3$ in the middle layer (B) and $N_{av}$ is $N_{av}$<4.9 in the top layer (C). For the whole layers, each of the layers has desirable average coordination number and the defect density.

The second desirable case is that $N_{av}$ is $N_{av}$≥4.9 in the bottom layer (A), $N_{av}$ is $N_{av}$<3 in the middle layer (B) and $N_{av}$ is $N_{av}$<4.9 in the top layer (C). For this case, although the defect density of the bottom layer (A) is large, relatively preferable characteristics can be obtained as a MONOS cell, since the defects of the bottom layer (A) can function integrally with the traps of the charge storage layer, as described above.

The third desirable case is that $N_{av}$ is $N_{av}$≥4.9 in the bottom layer (A), $N_{av}$ is $N_{av}$<3 in the middle layer (B) and $N_{av}$ is $N_{av}$≥4.9 in the top layer (C). For this case, although both defect densities of the bottom layer (A) and the top layer (C) are large, relatively large deterioration of a MONOS cell is not generated because the defect density of the middle layer (B) is small, and therefore the leakage current does not flow by coupling the defects of the bottom layer (A) and that of the top layer (C).

The fourth desirable case is that $N_{av}$ is $N_{av}$<4.9 in the bottom layer (A), $N_{av}$ is $N_{av}$≥3 in the middle layer (B) and $N_{av}$ is $N_{av}$<4.9 in the top layer (C). For this case, although the defect density of the middle layer (B) is fairly large, it is conceivable that the characteristics of a MONOS cell are within an allowable range, because both the defect densities of the bottom layer (A) and the top layer (C) are small and the leakage current due to the defects are relatively hardly to flow.

Meanwhile, when comparing the second insulating film of the present invention with a single layered high dielectric constant insulating film with the equivalent electric thickness, it becomes possible for the second insulating film to decrease the physical film thickness while suppressing the leakage current.

This leads to suppression of the height of a memory cell gate stack structure having the second insulating film of the present invention, resulting in decrease of mutual interference between adjacent cells. Therefore, it is possible to realize a smaller sized flash memory cell than the conventional one, and a flash memory cell with high reliability.

2. REFERENCE EXAMPLE

There will be described a memory cell as a premise of the present invention, before describing embodiments. Note that the present invention is applicable to a floating gate type memory cell and a nano dot type memory cell, as well, although the following reference example is described with the MONOS type memory cell.

Figure 4:
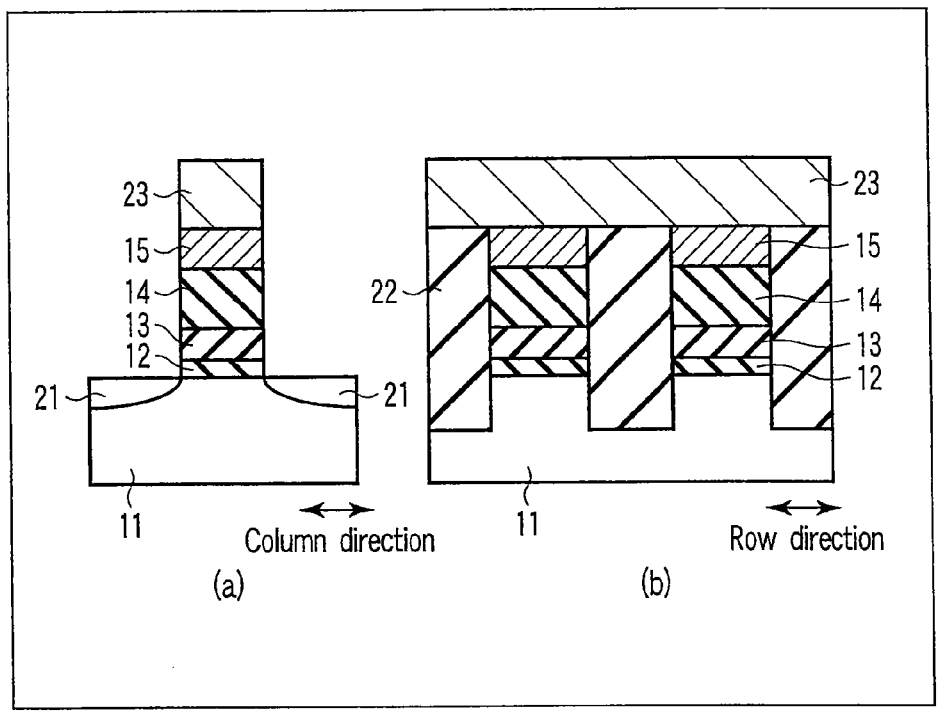
FIG. 4 is a cross sectional view showing a memory cell structure of a reference embodiment.

FIG. 4 shows a memory cell according to the reference example of the present invention.

This memory cell is a MONOS type memory cell whose charge storage layer is formed of the insulating film. FIG. 4 (a) is a cross sectional view along a channel length direction, and FIG. 4 (b) is a cross sectional view along a channel width direction. In these drawings, the channel length direction is a column direction toward which a bit line extends, and channel width direction is a row direction toward which a word line (control gate electrode) extends.

First, as shown in FIG. 4 (a), two source/drain diffusion layers 21 are provided separately from each other on a surface of a silicon substrate (including a well) 11 doped with p type impurities. Space between the source/drain diffusion layers 21 is a channel region, and when the memory cell becomes ON state, a channel for making the two source/drain diffusion layers 21 electrically conductive is formed in the channel region.

On the channel region, a tunnel $SiO_2$ film (the first insulating film) 12 with a thickness of approximately 3 to 4 nm is provided. On the first insulating film 12, a silicon nitride film 13 (charge storage layer) with a thickness of approximately 6 nm, an alumina (the second insulating film) 14 with a thickness of 15 nm and a phosphorus-doped polycrystalline silicon film (control gate electrode) 15 with a thickness of 100 nm are stacked.

The source/drain diffusion layer 21 is formed by impurity ion implantation into the silicon substrate 11 in a self-aligned manner by using the stacked gate as a mask.

As shown in FIG. 4 (b), a plurality of stacked structures (gate part) with the tunnel oxide film 12, the silicon nitride film 13, the alumina 14 and the phosphorus-doped polycrystalline silicon film 15 are formed in the row direction, and these are separated mutually by device isolation insulating layers 22 in the form of STI (Shallow Trench Isolation) structure.

The device isolation insulating layer 22 fills a slit-shaped trench having the depth between the upper surface of the phosphorus-doped polycrystalline silicon film 15, and the silicon substrate 11 (for instance, approximately 100 nm).

The upper surface of the phosphorus-doped polycrystalline silicon film 15 is approximately the same height as the upper surface of the device isolation insulating layer 22. Then, the word line 23 extending in the row direction is provided on the phosphorus-doped polycrystalline silicon film 15 and on the device isolation insulating layer 22. The word line 23 is formed of, for instance, a conductive film made of tungsten with a thickness of approximately 100 nm.

In this structure, data retention characteristics of the memory cell deteriorate, and long term reliability of the NAND flash memory cannot be guaranteed because the second insulating film is the alumina as one kind of high dielectric constant insulating films, and in particular, the leakage current in the low electric field region caused by in-film defects cannot be negligible.

3. EMBODIMENTS

Hereinafter, there will be described embodiments of the present invention in detail using the drawings.

(1) Embodiment 1

Figure 5:
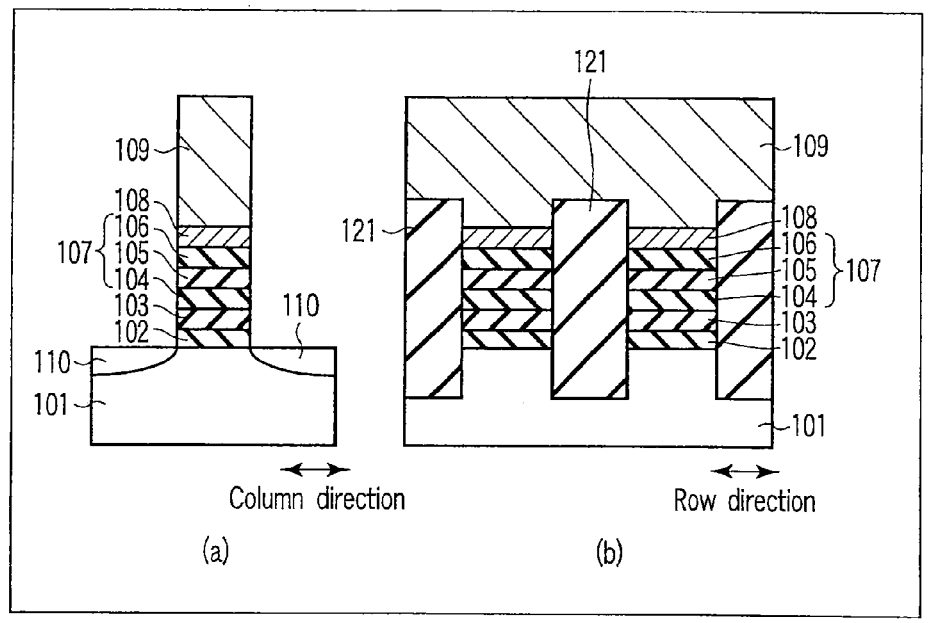
FIG. 5 is a cross sectional view showing a cell structure of the embodiment 1.

FIG. 5 shows a memory cell of the embodiment 1.

Figure 6:
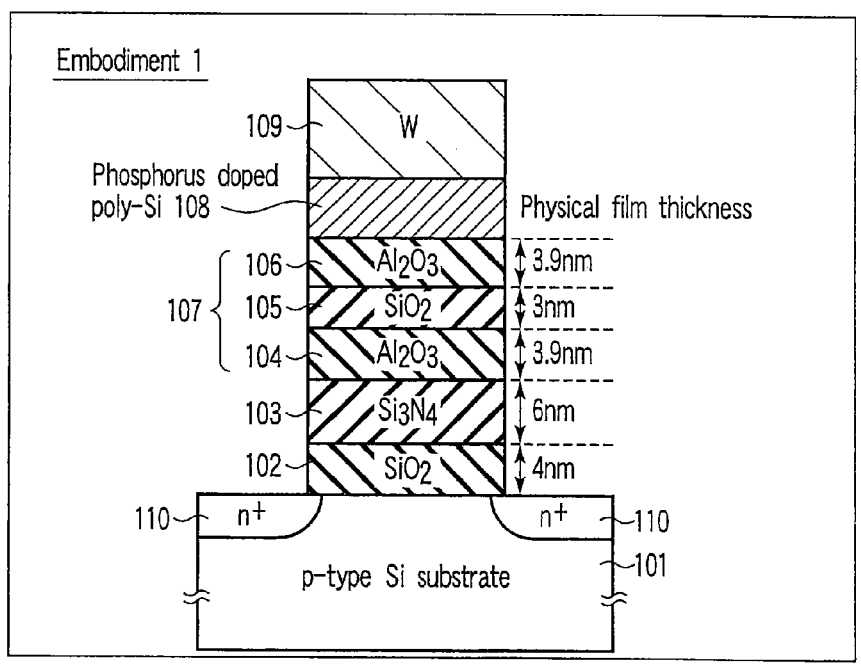
FIG. 6 is a cross sectional view (detailed view) showing a cell structure of the embodiment 1.

FIG. 5 (a) is a cross sectional view along the channel length direction, and FIG. 5 (b) is a cross sectional view along the channel width direction. Additionally, FIG. 6 shows a structure of FIG. 5 (a) in detail.

On a surface of a p type silicon substrate (including wells) 101, two source/drain diffusion layers 110 are provided separately from each other. Space between the source/drain diffusion layers 110 is a channel region, and when the memory cell becomes ON state, a channel for making the two source/drain diffusion layers 110 electrically conductive is formed in the channel region.

On the channel region, as the first insulating film (tunnel insulating film), for instance, a silicon oxide film ($SiO_2$) 102 with a thickness of 4 nm is provided. On the first insulating film 102, as the charge storage layer, for instance, a silicon nitride film ($Si_3N_4$) 103 with a thickness of 6 nm is provided.

On the charge storage layer 103, as the second insulating film (block insulating film), for instance, a laminated insulating film 107 formed of an alumina film 104 with a thickness of 3.9 nm, a silicon oxide film 105 with a thickness of 3 nm, and an alumina film 106 with a thickness of 3.9 nm is provided.

On the second insulating film 107, for instance, a control gate electrode 108 formed of the phosphorus-doped polycrystalline silicon film is provided. On the control gate electrode 108, for instance, a low resistance metal film 109 made of tungsten (W) is provided.

Additionally, a plurality of the first insulating films (tunnel insulating film) 102, the charge storage layers 103, the second insulating films (block insulating film) 107, and the control gate electrodes 108 are formed in the row direction, and these are separated from one another by the device isolation insulating layer 121 with the STI (Shallow Trench Isolation) structure.

The low resistance metal film 109 extending in the row direction works as the word line.

Note that it is desirable for the thickness of the first insulating film (tunnel insulating film) 102 used in the present embodiment to be in the range of 2 to 8 nm. Additionally, although the silicon oxide film is used as the first insulating film (tunnel insulating film) 102 in the present embodiment, instead of that, a silicon oxynitride film may be used.

Since a potential barrier for hole becomes small when using the silicon oxynitride film as the tunnel insulating film, an effect that erase operation of the memory cell becomes fast is realized.

Or additionally, as the first insulating film, a layered tunnel insulating film such as silicon oxide film/silicon nitride film/silicon oxide film (ONO film) may be used. In that case, the effect that a write operation and an erase operation become fast is obtained.

It is desirable for the thickness of the silicon nitride film as the charge storage layer 103 used in the present embodiment to be in the range of 3 to 10 nm. Additionally, the silicon nitride film as the charge storage layer 103 is not necessarily $Si_3N_4$ having a stoichiometrical composition, and the composition may be rich in Si for increasing in-film trap density, or the composition may be rich in nitrogen for deepening a trap level.

Additionally, the silicon nitride film as the charge storage layer 103 is not necessarily a film with uniform composition, and the silicon nitride film may be a laminated film or a continuous film in which a ratio between silicon and nitrogen varies in the thickness direction. Additionally, as for the charge storage layer 103, instead of the silicon nitride film, the silicon oxynitride film including a certain amount of oxygen may be used.

Furthermore, as for the charge storage layer 103, a high dielectric constant charge storage layer including Hf such as $HfO_2$, HfON, HfSiOx, HfSiON, HfAlOx, HfAlON, $ZrO_2$, ZrON, ZrSiOx, ZrSiON, ZrAlOx, ZrAlON and Zr may be used, and the high dielectric constant charge storage layer to which La is further added, such as La added HfSiOx and hafnium lanthanum oxide (HfLaOx), may be used.

Additionally, the charge storage layer 103 may be a laminated film or a continuous film formed of the silicon nitride film and the high dielectric constant charge storage layer.

For the control gate electrode 108, boron doped $p^+$ type polycrystalline silicon may be used instead of phosphorus or arsenic doped $n^+$ type polycrystalline silicon. Further, for the control gate electrode 108, silicide materials such as nickel silicide, cobalt silicide, tantalum silicide may be used, or metallic materials such as TaN, TiN may also be used.

Next, there will be described a method of manufacturing the memory cell of FIG. 5 and FIG. 6.

Figure 7:
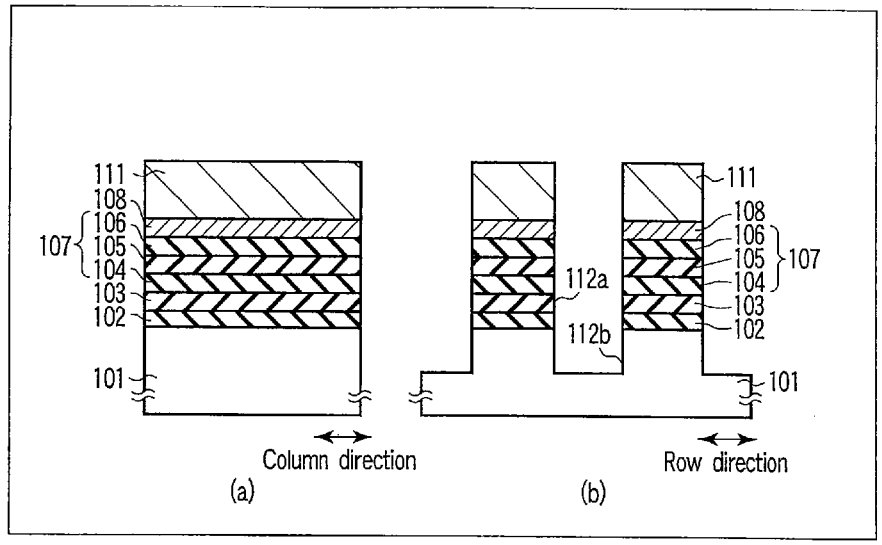
FIG. 7 is a cross sectional view showing a method of manufacturing a cell structure of the embodiment 1.

In FIGS. 7 to 11, FIGS. 7 (a) to 11 (a) are cross sectional views along the channel length direction, and FIGS. 7 (b) to 11 (b) are cross sectional views along the channel width direction.

First, as shown in FIG. 7, after cleaning a surface of the silicon substrate (including wells) 101 doped with p-type impurity, the silicon oxide film (the first insulating film) 102 with a thickness of 4 nm is formed by the thermal oxidation method within the temperature region of 800° C. to 1000° C.

Continuously, within the temperature region of 600° C. to 800° C., the silicon nitride film (charge storage layer) 103 with a thickness of 6 nm is formed on the first insulating film 102 by a LPCVD (low pressure chemical vapor deposition) method using dichlorosilane ($SiH_2Cl_2$) and ammonia ($NH_3$) as raw material gases.

Continuously, within the temperature region of 500° C. to 800° C., the alumina ($Al_2O_3$) film 104 with a thickness of 3.9 nm is formed by a MOCVD (metal organic chemical vapor deposition) method using TMA ($Al(CH_3)_3$) and $H_2O$ as raw materials. Continuously, within the temperature region of 600° C. to 800° C., the silicon oxide film ($SiO_2$) 105 with a thickness of 3 nm is formed by the LPCVD method using dichlorosilane ($SiH_2Cl_2$) and nitrogen monoxide ($N_2O$) as raw material gases. Continuously, within the temperature region of 500° C. to 800° C., the alumina ($Al_2O_3$) film 106 with a thickness of 3.9 nm is formed by the MOCVD method using TMA ($Al(CH_3)_3$) and $H_2O$ as raw materials.

As described above, alumina/silicon oxide/alumina laminated block insulating film 107 resulting in the second insulating film is formed.

Continuously, within the temperature region of 550° C. to 700° C., the phosphorus-doped polycrystalline silicon film (or, amorphous silicon film when temperature is in a low side) 108 working as the control gate electrode is formed by the LPCVD method using silane ($SiH_4$) and phosphine ($PH_3$) as raw materials.

Then, on the polycrystalline silicon film 108, a mask material 111 for processing the device isolation region is formed. A photo resist is formed on the mask material 111, and the photo resist is exposed and developed. Then, a pattern of the photo resist is transferred to the mask material 111 by RIE (reactive ion etching) method. After that, the photo resist is removed.

In this state, using the mask materials 111 as the mask, the control gate electrode 108, the second insulating film 107 (104, 105 and 106), the charge storage layer 103, and the tunnel insulating film 102 are etched sequentially by the RIE method, so that a slit 112a for separating adjacent memory cells in the row direction is formed.

Further, by the RIE method, a device isolation trench 112b with a depth of approximately 100 nm is formed while etching the silicon substrate 101.

Figure 8:
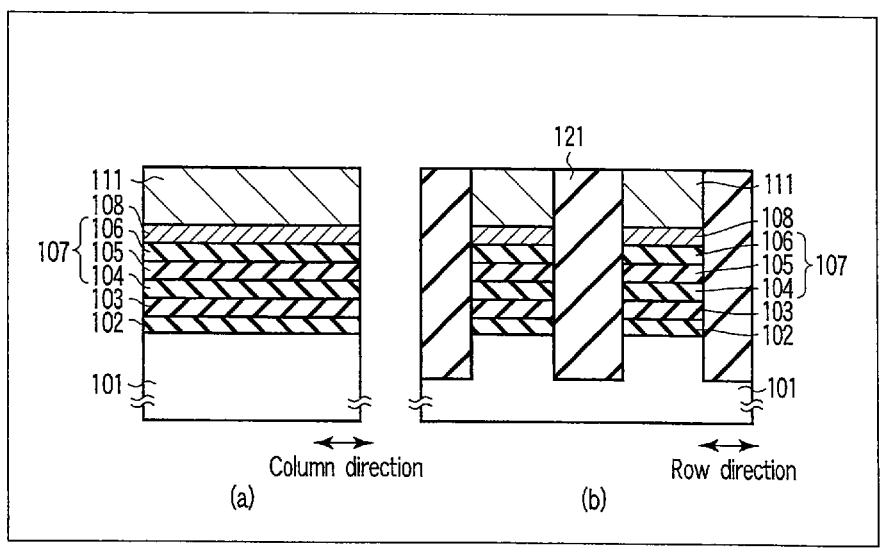
FIG. 8 is a cross sectional view showing a method of manufacturing a cell structure of the embodiment 1.

Next, as shown in FIG. 8, the silicon oxide film (buried oxide film) 121 filling completely the slit 112a and the device isolation trench 112b of FIG. 7 is formed by using the CVD method. Continuously, by a CMP (Chemical Mechanical Polishing) method, the silicon oxide film 121 is polished until the mask material 111 appears. Thus, the surface of the silicon oxide film 121 is flattened. After that, the mask material 111 is selectively removed.

Next, as shown in FIG. 9, on the polycrystalline silicon (control gate electrode) 108, the low resistance metal film (word line) 109 with a thickness of approximately 100 nm made of tungsten is formed by the CVD method using $WF_6$ or $W(CO)_6$ as a raw material gas within temperature region of 400° C. to 600° C., for instance.

Next, as shown in FIG. 10, by the CVD method, the mask material 131 is formed on the low resistance metal film 109. The photo resist is formed on the mask material 131, and the photo resist is exposed and developed. Then, by the RIE method, the pattern of the photo resist is transferred to the mask material 131. After that, the photo resist is removed.

Next, as shown in FIG. 11, using the mask material 131 as the mask, by the RIE method, a shape of the MONOS gate stack is formed while etching sequentially the low resistance metal film 109, the polycrystalline silicon film 108, the second insulating film (block insulating film) 107 (104, 105, and 106), the charge storage layer 103, and the first insulating film (tunnel oxide film) 102.

Hereinafter, by the CVD method, formation of silicon oxide on the side surface of the MONOS gate stack is performed. After that, the memory cell is completed by forming the $n^+$ type source/drain diffusion layers 110 on the surface region of the silicon substrate 101 in a self-aligned manner by using ion implantation method.

Finally, by the CVD method, an inter layer insulating film (not shown) covering the memory cell is formed.

Above-described manufacturing method is only one example. The memory cell of FIGS. 5 and 6 may be formed by other manufacturing methods in addition to this.

For instance, for the method of thermal oxidation of the first insulating film (tunnel insulating film), it is possible to use various kinds of methods such as wet oxidation (pirogenic (hydrogen burning) oxidation), plasma oxidation using $O_2$ or $H_2O$ as raw material gasses, in addition to dry $O_2$ oxidation. Further, a nitrided silicon oxide film (silicon oxynitride film) may be formed by performing a process of providing NO gas, $NH_3$ gas, or nitrogen plasma before or after the thermal oxidation.

Additionally, the composition of the silicon nitride film used as the charge storage layer can be varied by adjusting the flow ratio of dichlorosilane ($SiH_2Cl_2$) and ammonia ($NH_3$), which are raw material gasses of LPCVD.

Additionally, it is no problem that $Al_2O_3$, being one layer among the second insulating films (block insulating film), is formed by an ALD (atomic layer deposition) method using TMA ($Al(CH_3)_3$) and $H_2O$ as raw material gasses within the temperature region of 200° C. to 400° C., in addition to the method where $Al_2O_3$ is formed by the MOCVD method.

Similarly, it is no problem that $SiO_2$, being one layer among the second insulating films (block insulating film), is formed by an ALD (atomic layer deposition) method using BTBAS [bistertiary butylamino silane: $SiH_2(t\text{-BuNH})_2$] and ozone ($O_3$), or 3DMAS ($SiH(N(CH_3)_2)_3$) and ozone as raw material gasses within temperature region 200° C. to 500° C., in addition to the method where $SiO_2$ is formed by the MOCVD method.

Additionally, it is also no problem for the polycrystalline silicon used as the control gate electrode to be replaced by $p^+$ type polycrystalline silicon doped with boron, in addition to the $n^+$ type polycrystalline silicon doped with phosphorus.

Further, for the respective films forming the MONOS type gate stack structure described above, the raw material gasses used for the CVD method can be replaced by other gasses. Additionally, the CVD method can be replaced by a sputtering method. Moreover, a film formation of the respective layers described above is also capable of being formed by the methods such as a vapor deposition method, a laser ablation method, and an MBE method, or a combined method of these, in addition to the CVD method, and the sputtering method.

Next, it is shown that excellent performance on both write/erase characteristics and data retention characteristics can be obtained by the present embodiment, as compared with the memory cell provided with the second insulating film (block insulating film) formed of the single layer film or the laminated layer film of the high dielectric constant insulating film known until now.

(1-1) Current-Electric Field Characteristics of Respective Block Insulating Films FIG. 12 (a) shows a structure of the second insulating film (block insulating film) according to the present embodiment. The structure of the block insulating film is named as "AOA structure" for simplification below.

In the AOA structure of the present embodiment, the total physical thickness of alumina part is 7.8 nm, and the total physical thickness of silicon oxide film part is 3 nm. Provided that a relative dielectric constant of alumina is 10, and the relative dielectric constant of the silicon oxide film is 3.9, EOT (Equivalent Oxide Thickness) of the AOA structure of the present embodiment is 6 nm.

On the other hand, FIG. 12 (b) shows alumina single layer film having EOT (=6 nm) equal to that, and its physical thickness is 15.4 nm. Additionally, the respective FIGS. 13 (a) and 13 (b) and FIG. 14 (a) show ones in which total thickness of alumina and silicon oxide is equal, and the film constitution is changed, to the AOA structure of the present embodiment.

Figure 13:
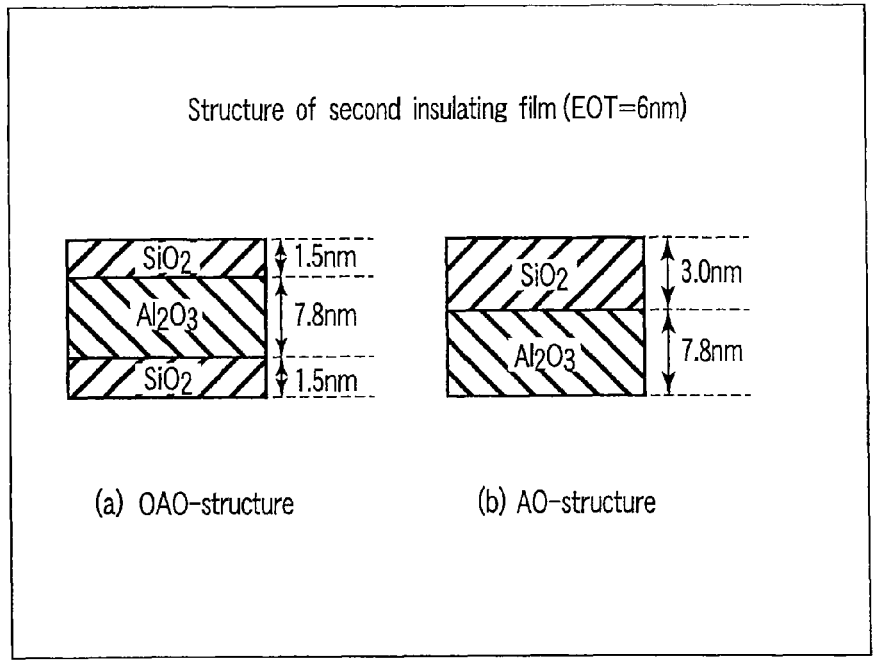
FIG. 13 is an explanation view showing a structure as an object of comparison of a leakage current.

FIG. 13 (a) consists of a lamination of the silicon oxide film with 1.5 nm, the alumina with 7.8 nm, and the silicon oxide film with 1.5 nm, that is named as "OAO structure" below.

FIG. 13 (b) consists of a lamination of the alumina with 7.8 nm, and the silicon oxide film with 3 nm, that is named as "AO structure" below.

Figure 14:
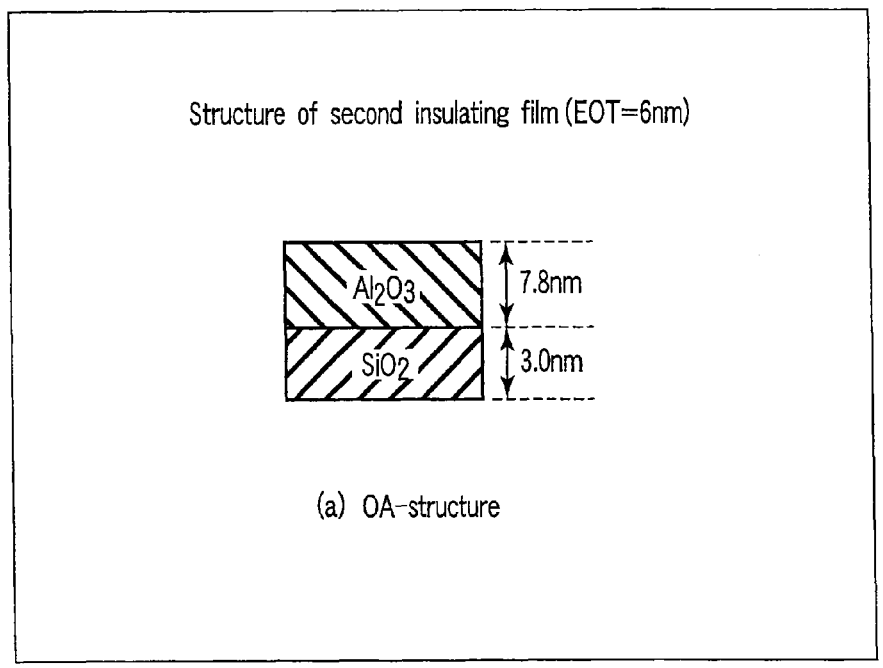
FIG. 14 is an explanation view showing a structure as an object of comparison of a leakage current.

FIG. 14 (a) consists of a lamination of the silicon oxide film with 3 nm, and the alumina with 7.8 nm, that is named as "OA structure" below.

For the above film structures, EOT is equal mutually, and its value is 6 nm.

Figure 15:
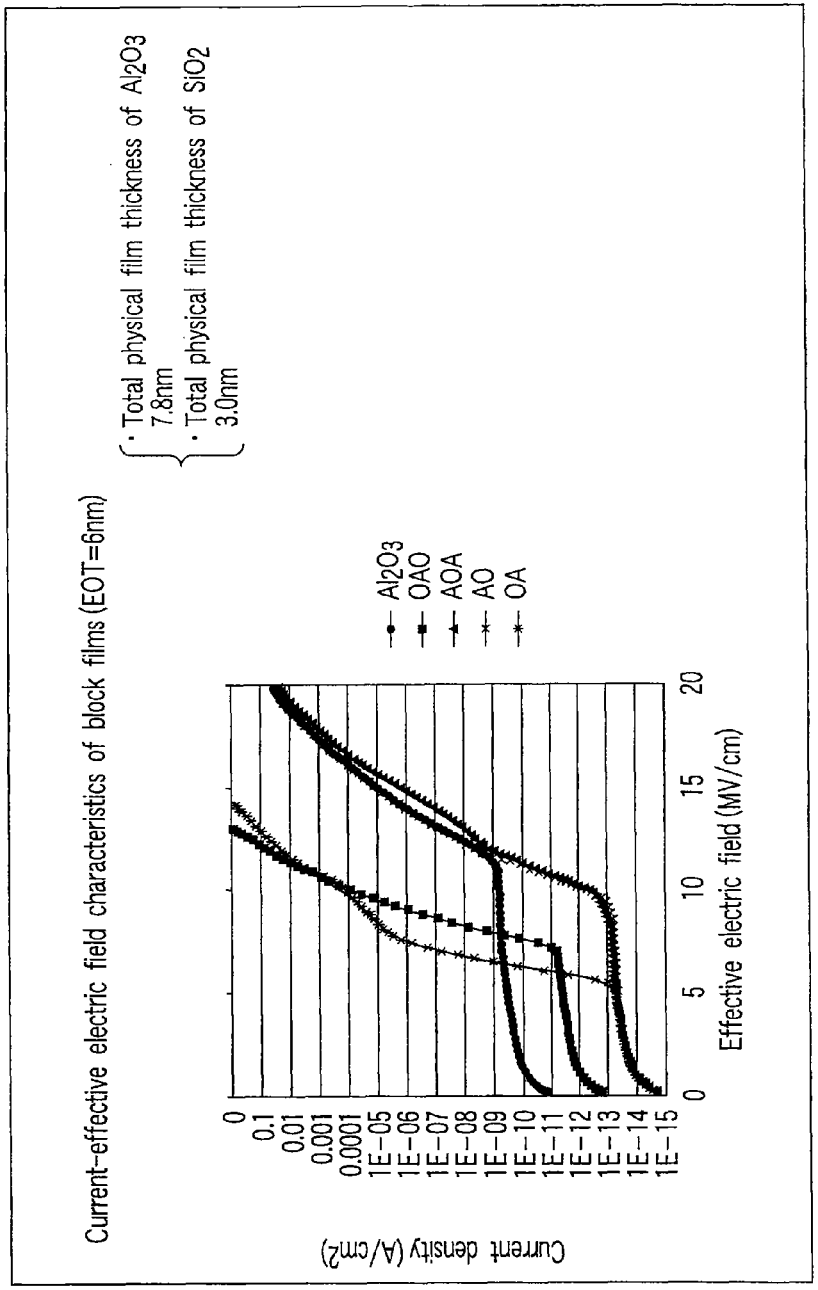
FIG. 15 is a characteristic view showing current-voltage characteristics of a block film.

Next, FIG. 15 shows current-electric field characteristics when the electrodes ($n^+$ polycrystalline silicon) with the work function of 4.05 eV are provided at both ends of these film structures.

Current characteristics are calculated under the following assumptions.

A current component proportional to the electric field appears in the low electric field region, as the leakage current via defects of alumina. The leakage current in the low electric field region decreases in accordance with the thickness of a silicon oxide sandwiched at the central part. This is because the silicon oxide has few defects, and tunneling conduction prevails at that part.

On the other hand, tunneling current flowing through the multi-layered film is the main mechanism of electric conduction in the high electric field region. Tunneling probability in this case is obtained by applying WKB (Wentzel-Kramers-Brillouin) approximation to the multi-laminated film.

Note that it is confirmed that among current characteristics obtained by this calculation method, the characteristics of the alumina single layer film preferably agree with the current-electric field characteristics obtained by an experiment.

When looking at the results of FIG. 15, the leakage current in the low electric field region (typically, region where effective electric field is not more than 5 MV/cm) is determined by the thickness of the silicon oxide film existing continuously. In this example, the leakage current is the least for "AOA structure", "OA structure" and "AO structure" where the silicon oxide films with a thickness of 3 nm exist continuously.

On the other hand, the leakage current in the high electric field region (typically, region where effective electric field is about 15 MV/cm) is the most for "OA structure", and "OAO structure". This is because the silicon oxide film with low dielectric constant exists at the edge of electron injection (cathode edge) in these structures.

As compared with that case, in the alumina single layer film, the leakage current becomes smaller in many orders of magnitude; the alumina single layer film is suited for suppression of high electric field leakage current.

Then, remarkable point is that, for the block insulating film of the "AOA structure" of the present embodiment, the leakage current in the high electric field region becomes further smaller as compared with the alumina single layer film and "AO structure".

The reason is that a potential barrier (barrier height) of the silicon oxide film provided at the central part of the block insulating film exists at the energy position which prevents tunneling of the electrons injected from the cathode edge. Thus the potential barrier of the silicon oxide film achieves function to suppress the leakage current.

There is no such effect for the alumina single layer. Such an effect cannot be obtained for "AO structure," either, since the silicon oxide film is located at near the anode edge.

(1-2) Characteristics Comparison of Memory Cells

Next, based on the current-electric field characteristics of such block insulating film, width (window) of attainable threshold voltage in the write/erase characteristics and a retention lifetime (time to half-decay of threshold voltage shift) in the data retention characteristics after write operation are calculated by simulation.

Figure 16:
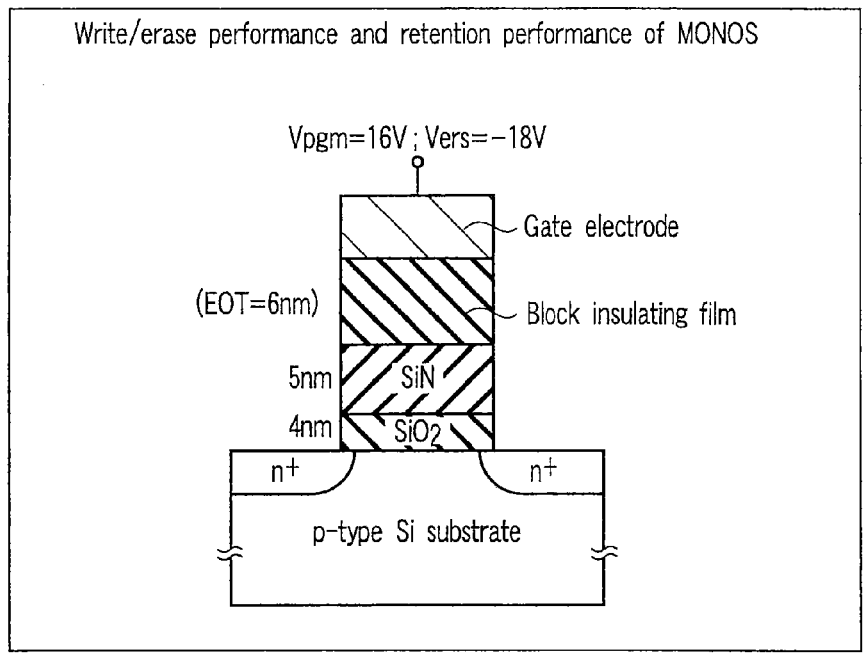
FIG. 16 is an explanation view showing a structure as an object of cell characteristics evaluation.

The memory cell used for the calculation has a structure shown in FIG. 16, in which "AOA structure" of the present embodiment is utilized for the second insulating film (block insulating film) of EOT=6 nm. In addition thereto, simulation is also performed for memory cells where the second insulating film (block insulating film) is substituted by the alumina single layer film, "OAO structure", "AO structure", and "OA structure." The respective characteristics are compared.

The work function of the control gate electrode is 4.05 eV ($n^+$ polycrystalline silicon). The voltage of +16V was provided for the control gate electrode during the write operation, while the voltage of −18V was provided for the control gate electrode during the erase operation.

Figure 17:
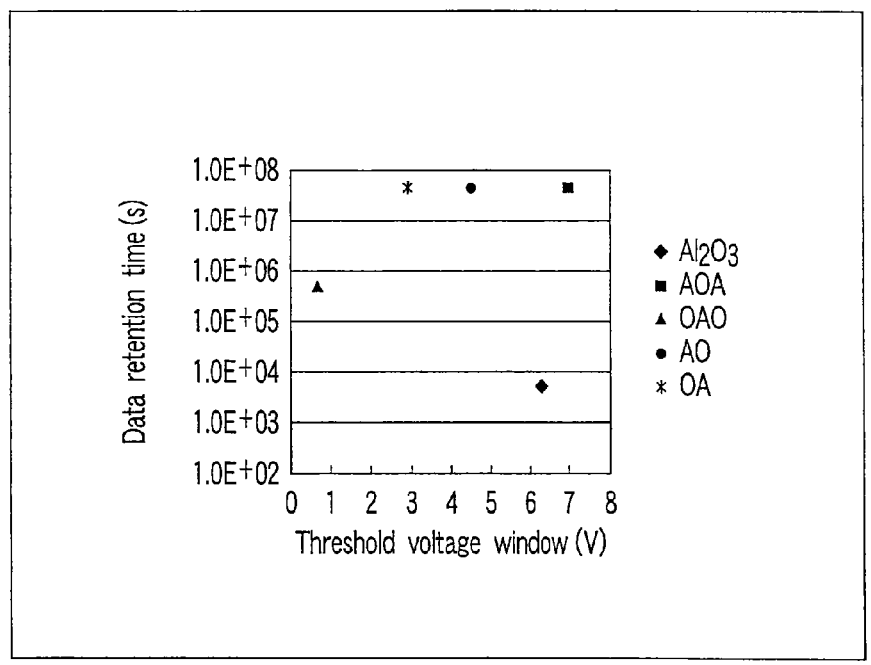
FIG. 17 is a view showing a calculation result of a threshold voltage window and a data retention lifetime.

The calculation result of the simulation is summarized in FIG. 17.

First, the attainable threshold voltage width ($V_{th}$ window) in the horizontal axis becomes extremely small in the memory cell with OAO film because the OAO film has characteristics in which large leakage current flows during both write and erase operations owing to symmetric nature of its structure. For the AO structure and the OA structure, attainable threshold voltage width as a total of write and erase operations does not become large, because the leakage current is large on one hand of write or erase operations (although it is small on the other hand) owing to non-symmetric nature of their structures.

In contrast, for the alumina single layer film, the large threshold voltage width is obtained due to the effect of leakage current suppression.

Since the present embodiment, as described previously, can further suppress the high electric field leakage current by the effect of a middle silicon oxide film layer, the threshold voltage width is largest among the memory cells with various kinds of block insulating films having equal EOT, and accordingly, the present embodiment realizes the most excellent memory cell in the write/erase characteristics.

On the other hand, since the data retention lifetime indicated in the vertical axis of FIG. 17, is mainly determined by the leakage current characteristics in the low electric field region, "AOA structure", "AO structure", and "OA structure" show the most excellent data retention characteristics, since these structures can suppress the low-field leakage current due to defects by introducing the middle silicon oxide film layer.

Based on the above result, it is concluded that "AOA structure" of the present embodiment realizes the memory cell achieving the most excellent performance among various kinds of block insulating layers having equal EOT, judging totally from write/erase characteristics and data retention characteristics.

(1-3) Optimum Thickness of Respective Layers in "AOA Structure" Block Insulating Film As shown in FIG. 17, the AOA structure shows excellent performance in various kinds of the laminated block insulating films. Then, there is investigated how the film thickness constitution should be in order to obtain the current-electric field characteristics in which the leakage current is most suppressed.

First, considered is the low electric field region.

Leakage current suppression in the low electric field region is determined by continuous thickness of the intermediate silicon oxide film. Accordingly, it is preferable for the silicon oxide film to be as thick as possible; however, when being excessively thick, EOT as the memory cell becomes large, and as a result, the applied voltages of the control gate electrode during write and erase operations become large. When considering the reduction of EOT as the memory cell, the thickness of the intermediate silicon oxide film should fall within the range of approximately 4 nm or less.

Next, considered is the high electric field region.

For the block insulating film of the "AOA structure" of the present embodiment, the leakage current of the AOA structure was estimated, while varying the thickness of the alumina layer at both ends and the thickness of the intermediate silicon oxide film layer within the range of 0 to 9 nm independently. In this evaluation, it is assumed that the AOA structure is symmetric in the thickness direction and that the thickness of two alumina layers (located above and below) is equal. Additionally, the electric field used to estimate the leakage current was an effective electric field (equivalent $SiO_2$ electric field) of 15 MV/cm, which is a typical electric field used for write and erase operations.

Figure 18:
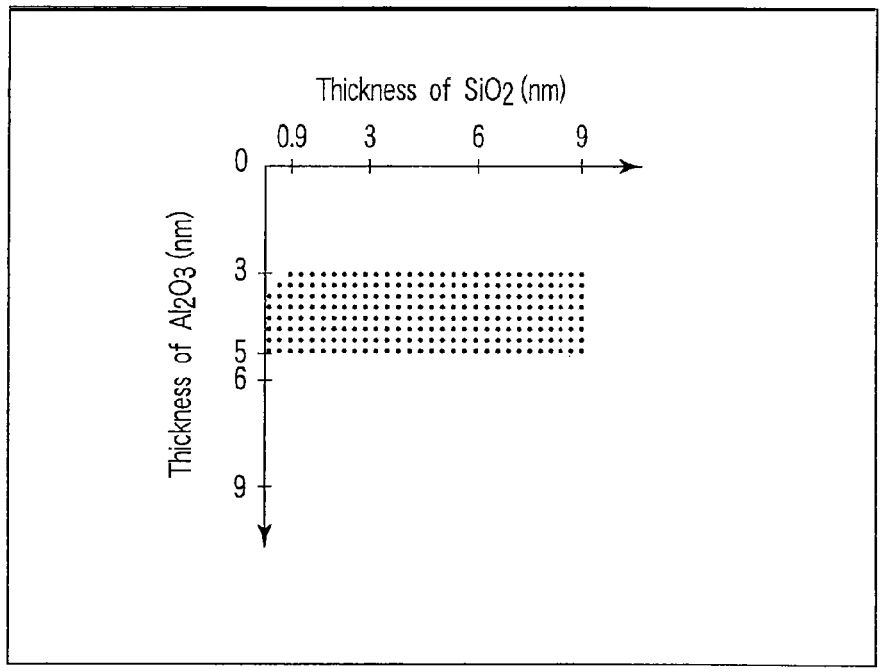
FIG. 18 is a view showing an appropriate thickness range of an alumina and a silicon oxide film.

Plotting of FIG. 18 shows a thickness range in which the leakage current in the AOA structure of the present embodiment becomes smaller than the alumina single layer film (EOT=6 nm) at the electric field of 15 MV/cm.

As understood from the result, the region from which the advantage of the AOA structure in the high electric field is achieved is a range that thickness of the alumina layer is within approximately 3 to 5 nm. Additionally, whatever thickness can be used for the middle $SiO_2$ layer when its thickness is 0.9 nm or more.

As described above, when considering the thickness range from the total viewpoint of high and low electric field regions, it is possible to achieve the best performance of the AOA structure by adopting the alumina thickness within the range of 3 to 5 nm, and additionally, by adopting the thickness of the middle silicon oxide film layer within the range of 0.9 to 4 nm.

(2) Embodiment 2

Figure 19:
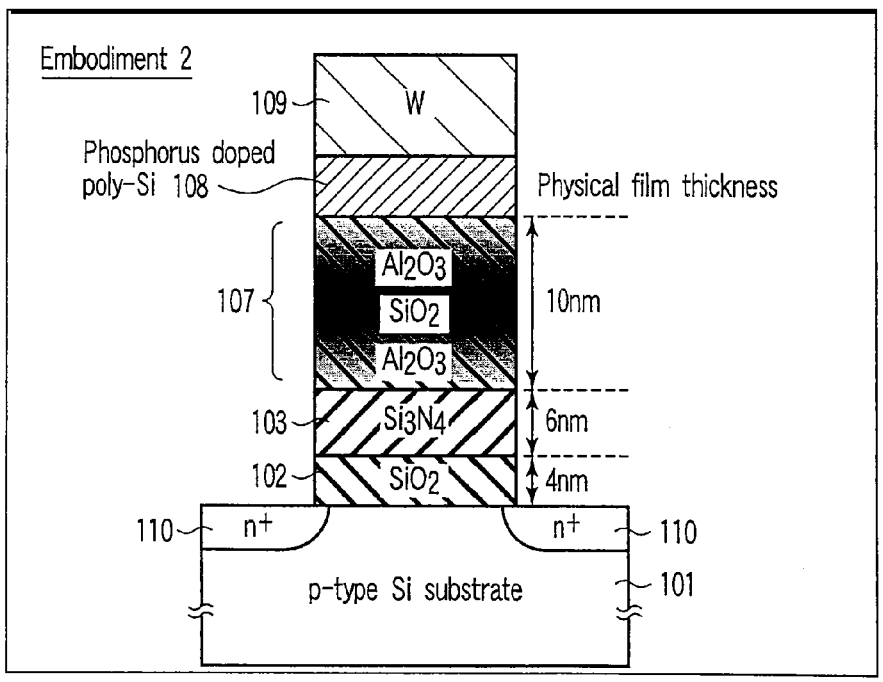
FIG. 19 is a cross sectional view showing a cell structure of an embodiment 2.

FIG. 19 shows a cross sectional view of a memory cell in the channel length direction of the embodiment 2. Note that in FIG. 19, the same symbols are assigned to the same parts as in FIG. 6, and their detailed description is omitted.

The present embodiment differs from the previously described embodiment 1 in that the second insulating film is composed of an insulating film having continuous compositional variation, instead of forming the clearly distinguishable three layers of the bottom layer (A), the middle layer (B), and the top layer (C).

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, as the second insulating film (block insulating film), an insulating film whose main components are Al, Si and O and whose composition varies continuously in the thickness direction is provided. The main components of the insulating film are $Al_2O_3$ in a bottom part coming into contact with the charge storage layer, additionally $SiO_2$ in a middle part, and again $Al_2O_3$ in a top part. The thickness of the second insulating film as a whole is 10 nm.

On the second insulating film 107, for instance, a control gate electrode 108 formed of a phosphorus-doped polycrystalline silicon film is provided. On the control gate electrode 108, for instance, a low resistance metal film 109 made of tungsten (W) is provided.

As for the first insulating film (tunnel insulating film) 102, the charge storage layer 103, and the control gate electrode 108 used for the present embodiment, modifications similar to the first embodiment are possible.

Next, for the method of manufacturing the memory cell of FIG. 19, there will be described different process steps from the embodiment 1.

Up to the formation of the charge storage layer, the processes same as the embodiment 1 are performed.

Continuously, within a temperature range of 200° C. to 500° C., the formation of the second insulating film is performed by combining the ALD method depositing $Al_2O_3$ using TMA and, $O_3$ or $H_2O$ as the raw materials, and the ALD method depositing $SiO_2$ using BTBAS or 3DMAS, and $O_3$ as the raw materials.

Specifically, for the bottom part, only the former ALD cycle is performed, for the middle part, only the later ALD cycle is performed, and for the top part, again only the former ALD cycle is performed. For part between the respective parts, each ALD is performed alternately while adjusting cycle number ratios continuously.

By the method described above, a continuous compositional variation film of Al, Si and O resulting in the second insulating film is formed. The process steps after this process are the same as that of the embodiment 1.

The above-described manufacturing method is only one example, and other manufacturing methods may be used.

For instance, the second insulating film (block insulating film) can also be formed by the MOCVD method in addition to ALD method. Additionally, with respect to the process steps other than forming the second insulating film, like the embodiment 1, replacement by other manufacturing methods may be performed.

(3) Embodiment 3

Figure 20:
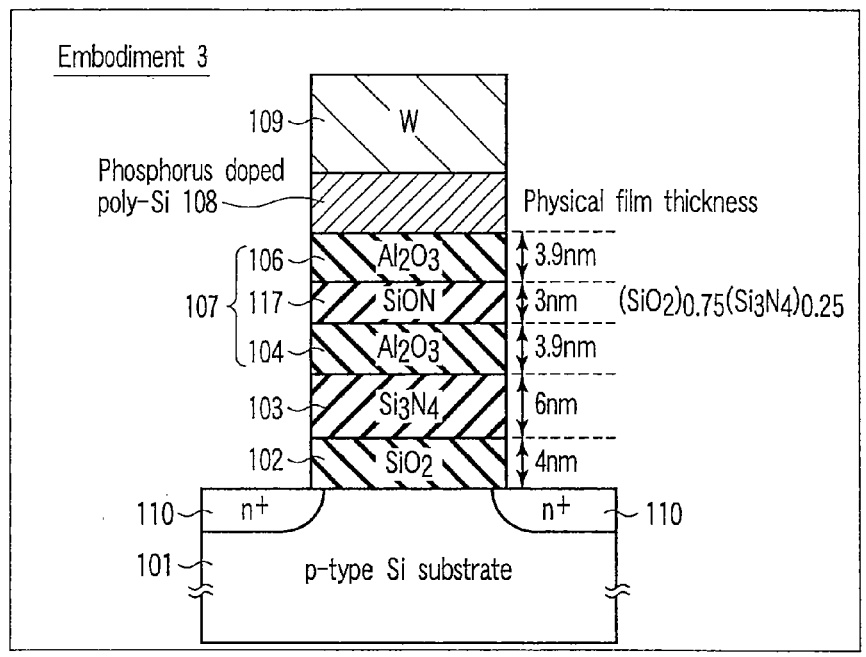
FIG. 20 is a cross sectional view showing a cell structure of an embodiment 3.

FIG. 20 shows a cross sectional view of the memory cell of an embodiment 3 in the channel length direction. Note that in FIG. 20, the same symbols are assigned to the same parts as in FIG. 6, and their detailed description will be omitted.

The present embodiment differs from the previously described embodiment 1 in that a silicon oxynitride film (SiON: $(SiO_2)_x(Si_3N_4)_{1-x}$ for the compositional expression) is used instead of the silicon oxide film ($SiO_2$) as the middle layer of the second insulating film.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, as the second insulating film (block insulating film), the second insulating film 107 as a laminated insulating film formed of, for instance, an alumina film 104 with a thickness of 3.9 nm, a silicon oxynitride film 117 whose composition is $(SiO_2)_{0.75}(Si_3N_4)_{0.25}$ with a thickness of 3 nm, and an alumina film 106 with a thickness of 3.9 nm is provided.

On the second insulating film 107, for instance, the control gate electrode 108 formed of a phosphorus-doped polycrystalline silicon film is provided. On the control gate electrode 108, for instance, a low resistance metal film 109 made of tungsten (W) is provided.

Modified examples relating to a constitution of the first insulating film (tunnel insulating film) 102, the charge storage layer 103, and the control gate electrode 108 used for the present embodiment are the same as those of the embodiment 1.

Additionally, the manufacturing method of the memory cell of FIG. 20 is approximately the same as the manufacturing method of the embodiment 1. However, the process step for forming the silicon oxynitride film as the middle layer of the second insulating film differs.

This process may be such that, for instance, in the temperature range of 600° C. to 800° C., after forming the silicon oxide film ($SiO_2$) by the LPCVD method using dichlorosilane ($SiH_2Cl_2$) and nitrogen monoxide ($N_2O$) as the raw material gasses, this wafer is exposed in nitrogen plasma.

Note that the above-described manufacturing method is only one example of the methods for forming the silicon oxynitride film, and using other manufacturing methods may be performed. Additionally, of course, as for the other films in addition to the silicon oxynitride of the second insulating film, other manufacturing methods may be used for the manufacturing method of the present embodiment, just as in the embodiment 1.

Next, there will be described optimum thickness of the respective films for this $Al_2O_3$/SiON/$Al_2O_3$ laminated block film.

Figure 21:
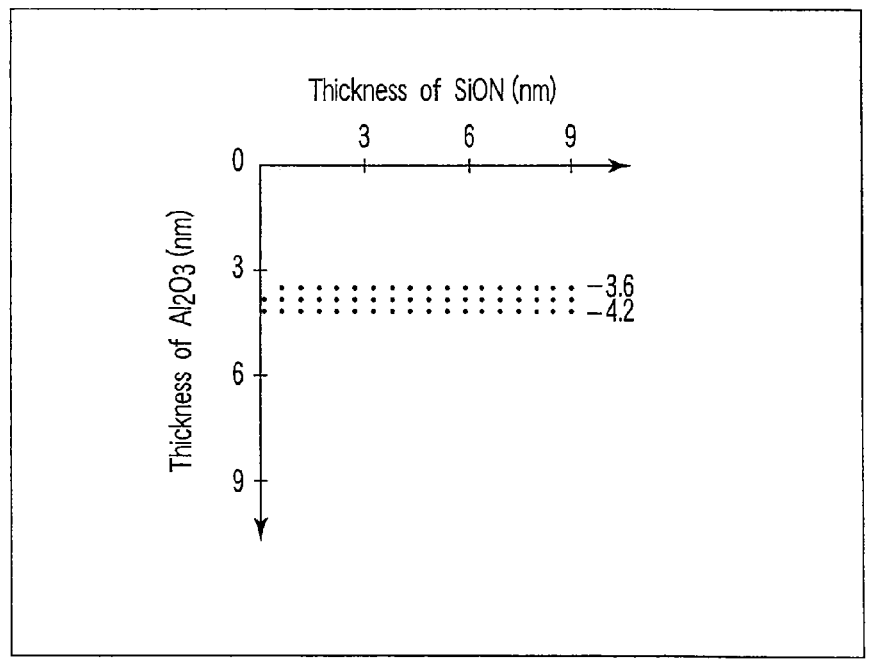
FIG. 21 is a view showing an appropriate thickness range of an alumina and a silicon oxynitride film.

FIG. 21 shows a result in which the behavior of the leakage current in the effective electric field $E_{eff}=15$ MV/cm is investigated by varying the thickness of both the alumina layer and the SiON layer under the condition that the thicknesses of two alumina layers in $Al_2O_3$/SiON/$Al_2O_3$ laminated block film are made equal. In this result, the composition of the middle SiON film is $(SiO_2)_{0.75}(Si_3N_4)_{0.25}$.

FIG. 21 indicates the range of the thickness in which the leakage current of the laminated block film decreases than that of the alumina single layer with equal EOT.

When viewing FIG. 21, without depending on the thickness of SiON, the leakage current decreases as compared with the single layer alumina film by making the thickness of alumina within the range of 4.2 nm from 3.6 nm.

Since the range of the alumina thickness from which superiority of such leakage current is obtained is different in accordance with composition of the SiON film of the middle layer, its situations are summarized as follows.

Figure 22:
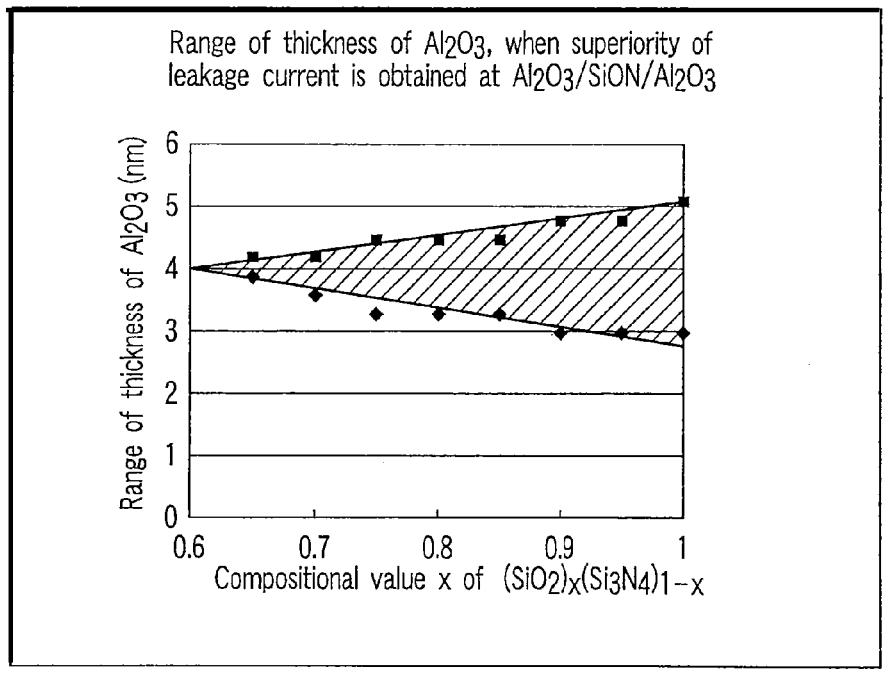
FIG. 22 is a view showing relation between range of thickness of alumina and compositional values of the silicon oxynitride film.

As understood from FIG. 22, when compositional value of $(SiO_2)_x(Si_3N_4)_{1-x}$ as the middle SiON layer is x<0.6, it is not possible to decrease the leakage current of the laminated block film structure than the leakage current of the single layer alumina film even if what thickness of alumina is used.

When the compositional value is x>0.6, the thickness region with the superiority of leakage current to that of the single-layer alumina film increases. The thickness region of alumina can be represented as the function of compositional value x of SiON film: that is, the thickness region of alumina is characterized as the minimum thickness: −3(x−0.6)+4 (nm), and maximum thickness: 2.5(x−0.6)+4 (nm).

Now, physical reason is investigated why superiority of the laminated block film appears only in the composition range of the middle layer SiON film x>0.6.

A conduction band barrier height $\phi$ of the silicon oxynitride film as the middle layer is represented as a function of the composition x, as follows.

$$\phi_b = 3.1 \frac{x}{3-2x} + 2.1\left(1 - \frac{x}{3-2x}\right)(eV) \quad (3)$$

On the other hand, the conduction band barrier height of the alumina film as the bottom and top layers is 2.4 (eV). From these considerations, x>0.56 is obtained as the condition that the barrier height of the silicon oxynitride film becomes larger than the barrier height of the alumina film.

This approximately agrees with the condition for the superiority of the leakage current obtained in the laminated block film. Therefore, it is found that the superiority of the leakage current in the laminated block film depends on the high barrier height of the middle layer.

(4) Embodiment 4

Figure 23:
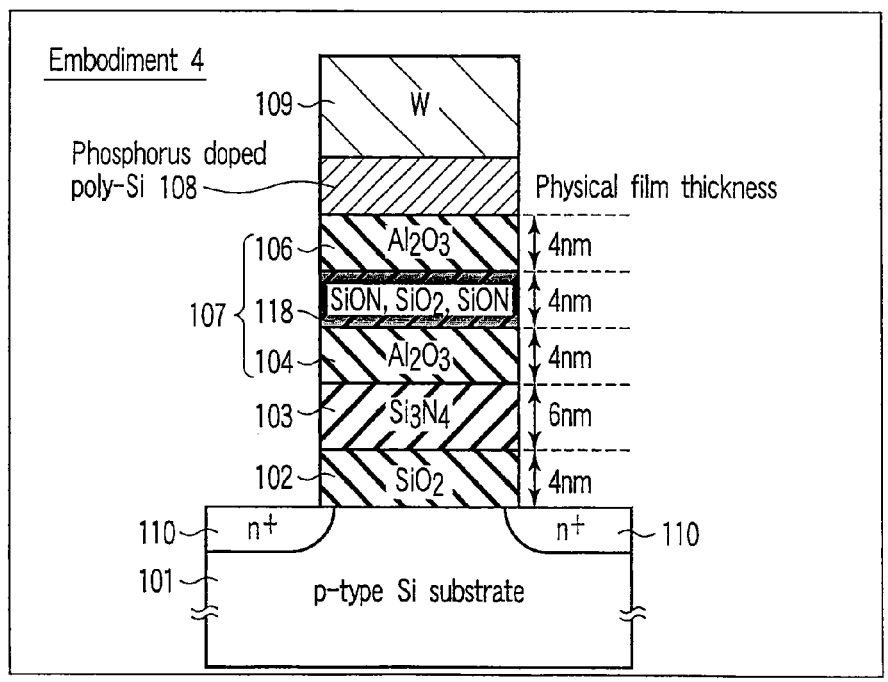
FIG. 23 is a cross sectional view showing a cell structure of an embodiment 4.

FIG. 23 shows a cross sectional view of the memory cell of the embodiment 4 in the channel length direction. Note that in FIG. 23, the same symbols are assigned to the same parts as in FIG. 6, and their detailed description will be omitted.

The present embodiment differs from previously described embodiment 1 in that the middle layer (B) of the second insulating film is comprised as the silicon oxynitride film whose composition varies continuously in the thickness direction.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, the second insulating film (block insulating film) 107 formed of three layers of the bottom layer (A), the middle layer (B) and the top layer (C) is provided. The bottom layer (A) 104 and the top layer (C) 106 of the second insulating film is alumina ($Al_2O_3$), and each thickness is 4 nm. Additionally, the composition of the middle layer (B) 118 of the second insulating layer is the silicon oxide film $SiO_2$ at the central part in the thickness direction, and is the silicon oxynitride film $(SiO_2)_x(Si_3N_4)_{1-x}$ (x=0.8) at both ends in the thickness direction. The thickness of the middle layer (B) 118 is 4 nm.

On the second insulating film 107, for instance, the control gate electrode 108 formed of the phosphorus-doped polycrystalline silicon film is provided. On the control gate electrode 108, for instance, the low resistance metal film 109 made of tungsten (W) is provided.

With respect to the first insulating film (tunnel insulating film) 102, the charge storage layer 103, and the control gate electrode 108 used for the present embodiment, modification like the embodiment 1 is possible.

Next, with respect to the manufacturing method of the memory cell of FIG. 23, the process step different from the embodiment 1 will be described.

Up to the formation of the charge storage layer, and the bottom layer (A) of the second insulating film, the processes same as the embodiment 1 are performed.

Continuously, within a temperature range of 200° C. to 500° C., the formation of the middle layer (B) of the second insulating film is performed by combining the ALD method depositing $Si_3N_4$ using BTBAS and $NH_3$ or 3DMAS and $NH_3$, and the ALD method depositing $SiO_2$ using BTBAS and $O_3$ or 3DMAS and $O_3$.

Specifically, for the bottom part of the middle layer (B), mainly the former ALD cycle is performed, for the middle part of the middle layer (B), only the later ALD cycle is performed, and for the top part of the middle layer (B), again mainly the former ALD cycle is performed. For part between the respective parts, each ALD is performed alternately while adjusting cycle number ratios continuously.

By the method described above, a continuous compositional variation film of Si, O and N as the middle layer of the second insulating film is formed.

The process steps after forming the top layer (C) of the second insulating film are the same as that of the embodiment 1.

The above-described manufacturing method is only one example, and other manufacturing methods may be used. For instance, the second insulating film (block insulating film) can also be formed by the MOCVD method in addition to ALD method. Additionally, as for the process steps in addition to the process of forming the second insulating film, replacement by other manufacturing methods may be performed, just as in the embodiment 1.

(5) Embodiment 5

FIG. 24 shows a cross sectional view of the memory cell of the embodiment 5 in the channel length direction. Note that in FIG. 24, the same symbols are assigned to the same parts as in FIG. 6, and their detailed description will be omitted.

The present embodiment differs from previously described embodiment 1 in that nitrogen added alumina is used for the bottom layer (A), and the top layer (C) of the second insulating film. By adding nitrogen to alumina, deterioration at the time of the electric field application is reduced, and dielectric breakdown is suppressed, so that effect of reliability improvement of the insulating film is obtained.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, the second insulating film (block insulating film) 107 formed of three layers of the bottom layer (A), the middle layer (B) and the top layer (C) is provided.

The bottom layer (A) 119 and the top layer (C) 120 of the second insulating film is aluminum oxynitride (AlON), and each thickness is 4 nm. Additionally, the middle layer (B) 105 of the second insulating film is the silicon oxide film $SiO_2$, and its thickness is 3 nm.

On the second insulating film 107, for instance, a control gate electrode 108 formed of a phosphorus-doped polycrystalline silicon film is provided. On the control gate electrode 108, for instance, a low resistance metal film 109 made of tungsten (W) is provided.

With respect to the first insulating film (tunnel insulating film) 102, the charge storage layer 103, and the control gate electrode 108 used for the present embodiment, modifications like the embodiment 1 may be performed.

Next, as for the manufacturing method of the memory cell of FIG. 24, the process steps different from the embodiment 1 will be described.

Up to the formation of the charge storage layer, the processes like the embodiment 1 are performed.

Continuously, the bottom layer (A) of the second insulating film is formed as follows. First, in the temperature range of 200° C. to 400° C., formation of alumina is performed by the ALD method using TMA and, $O_3$ or $H_2O$. Continuously, aluminum oxynitride (AlON) film is formed by performing $NH_3$ annealing to the alumina within the temperature range of 600° C. to 800° C.

Next, as the middle layer (B) of the second insulating film, the silicon oxide film ($SiO_2$) is formed by the LPCVD method using dichlorosilane ($SiH_2Cl_2$) and nitrogen monoxide ($N_2O$) in the temperature range of 600° C. to 800° C.

Continuously, the top layer (C) of the second insulating film is formed in such a way that, in the temperature range of 200° C. to 400° C., formation of alumina is performed by the ALD method using TMA and, $O_3$ or $H_2O$, and continuously, aluminum oxynitride (AlON) film is formed by performing $NH_3$ annealing to the alumina within the temperature range of 600° C. to 800° C.

The above-described manufacturing method is only one example, and other manufacturing methods may be used. For instance, the AlON film of the second insulating film (block insulating film) can also be formed by ALD method in which $Al_2O_3$ and AlN are formed alternately. Additionally, as for the processes other than the process step for forming the second insulating film, replacement by other manufacturing methods may be performed, just as in the embodiment 1.

(6) Embodiment 6

FIG. 25 shows a cross sectional view of the memory cell of the embodiment 6 in the channel length direction. Note that in FIG. 25, the same symbols are assigned to the same parts as in FIG. 6, and their detailed description will be omitted.

The present embodiment differs from previously described embodiment 1 in that Si added alumina is used for the bottom layer (A), and the top layer (C) of the second insulating film. By adding Si to alumina, the leakage current decreases through the defect reduction, and effect of improvement of dielectric breakdown strength is obtained.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, the second insulating film (block insulating film) 107 formed of three layers of the bottom layer (A), the middle layer (B) and the top layer (C) is provided.

The bottom layer (A) 122 and the top layer (C) 123 of the second insulating film are Si added alumina (AlSiO) films with a thickness of 4 nm, and their Si concentration is 10 at. %. Additionally, the middle layer (B) 105 of the second insulating film is the silicon oxide film $SiO_2$, and its thickness is 3 nm.

On the second insulating film 107, for instance, a control gate electrode 108 formed of a phosphorus-doped polycrystalline silicon film is provided. On the control gate electrode 108, for instance, a low resistance metal film 109 made of tungsten (W) is provided.

As for the first insulating film (tunnel insulating film) 102, the charge storage layer 103, and the control gate electrode 108 used for the present embodiment, modifications like the embodiment 1 may be performed.

Next, as for the manufacturing method of the memory cell of FIG. 25, the process steps different from the embodiment 1 will be described.

Up to the formation of the charge storage layer, the processes like the embodiment 1 are performed.

Continuously, the silicon added alumina of the bottom layer (A) of the second insulating film is formed in such a way that, within a temperature range of 200° C. to 400° C., there are alternate repetitions of the ALD method forming the alumina by using TMA and, $O_3$ or $H_2O$, and the ALD method forming silicon oxide film by using BTBAS or 3DMAS, and $O_3$. The silicon concentration in the film can be adjusted by a cycle ratio of repetition of the former ALD method and the later ALD method.

Next, as the middle layer (B) of the second insulating film, the silicon oxide film is formed by the LPCVD method using dichlorosilane ($SiH_2Cl_2$) and nitrogen monoxide ($N_2O$) within the temperature range of 600° C. to 800° C. Continuously, the top layer (C) of the second insulating film is formed by repeating the ALD methods like the bottom layer (A).

The above-described manufacturing method is only one example, and other manufacturing methods may be used.

For instance, the manufacturing method of AlSiO film of the second insulating film (block insulating film) can also be replaced by the MOCVD method in addition to ALD method. Additionally, as for the processes other than the process step for forming the second insulating film, replacement by other manufacturing methods may be performed, just as in the embodiment 1.

(7) Embodiment 7

Figure 26:
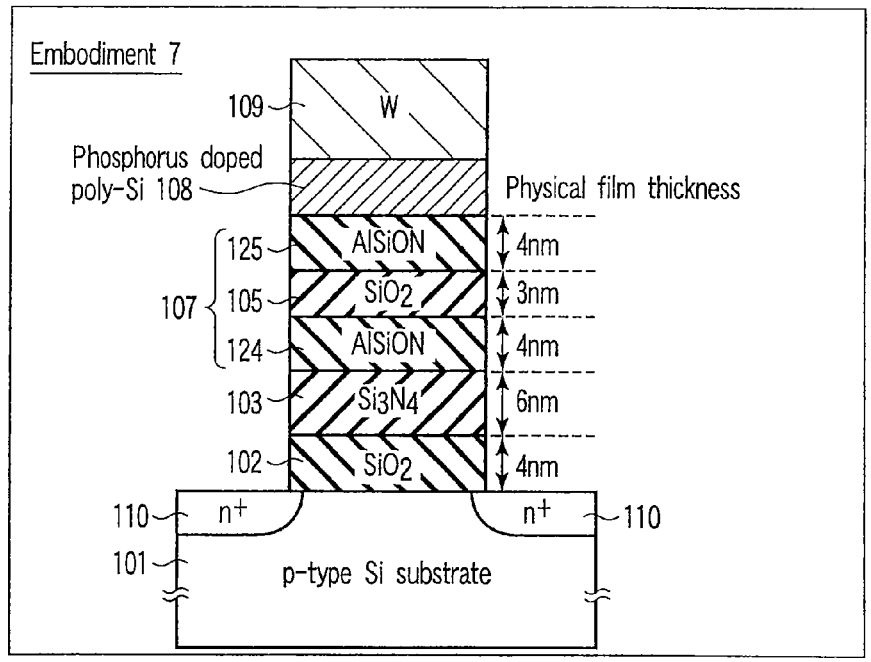
FIG. 26 is a cross sectional view showing a cell structure of an embodiment 7.

FIG. 26 shows a cross sectional view of the memory cell of the embodiment 7 in the channel length direction. Note that in FIG. 26, the same symbols are assigned to the same parts as in FIG. 6, and their detailed description will be omitted.

The present embodiment differs from previously described embodiment 1 in that silicon and nitrogen added alumina is used for the bottom layer (A), and the top layer (C) of the second insulating film. By adding Si and nitrogen to alumina, effect of reliability improvement such as decrease of the leakage current, and increase of dielectric breakdown strength, is obtained.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, the second insulating film (block insulating film) 107 formed of three layers of the bottom layer (A), the middle layer (B) and the top layer (C) is provided.

The bottom layer (A) 124 and the top layer (C) 125 of the second insulating film are Si and nitrogen added alumina (AlSiON) films with a thickness of 4 nm. Their Si concentration is 10 at. %, and their nitrogen concentration is approximately 10 at. %. Additionally, the middle layer (B) of the second insulating film is the silicon oxide film $SiO_2$, and its thickness is 3 nm.

On the second insulating film 107, for instance, a control gate electrode 108 formed of a phosphorus-doped polycrystalline silicon film is provided. On the control gate electrode 108, for instance, a low resistance metal film 109 made of tungsten (W) is provided.

As for the first insulating film (tunnel insulating film) 102, the charge storage layer 103, and the control gate electrode 108 used for the present embodiment, modifications like the embodiment 1 may be performed.

Next, as for the manufacturing method of the memory cell of FIG. 26, the process steps different from the embodiment 1 will be described.

Up to the formation of the charge storage layer, the processes like the embodiment 1 are performed. Continuously, as the bottom layer (A) of the second insulating film, the silicon added alumina is formed in such a way that, within a temperature range of 200° C. to 400° C., there are alternate repetitions of the ALD method forming the alumina by using TMA and, $O_3$ or $H_2O$, and the ALD method forming silicon oxide film by using BTBAS or 3DMAS, and $O_3$.

After that, nitrogen is introduced in the film by performing $NH_3$ annealing within the temperature range of 600° C. to 800° C. The silicon concentration in the film can be adjusted by the cycle ratio of repetitions of two kinds of ALD methods, and the nitrogen concentration in the film can be adjusted by temperature or time of the $NH_3$ annealing.

Next, as the middle layer (B) of the second insulating film, the silicon oxide film is formed by the LPCVD method using dichlorosilane ($SiH_2Cl_2$) and nitrogen monoxide ($N_2O$) in the temperature range of 600° C. to 800° C. Continuously, the top layer (C) of the second insulating film is formed by the same method as the bottom layer (A).

The above-described manufacturing method is only one example, and other manufacturing methods may be used.

For instance, the manufacturing method of AlSiON film of the second insulating film (block insulating film) can also be replaced by the MOCVD method in addition to ALD method, in the initial deposition process of AlSiO. Additionally, as for the processes other than the process step for forming the second insulating film, replacement by other manufacturing methods may be performed, just as in the embodiment 1.

(8) Embodiment 8

Figure 27:
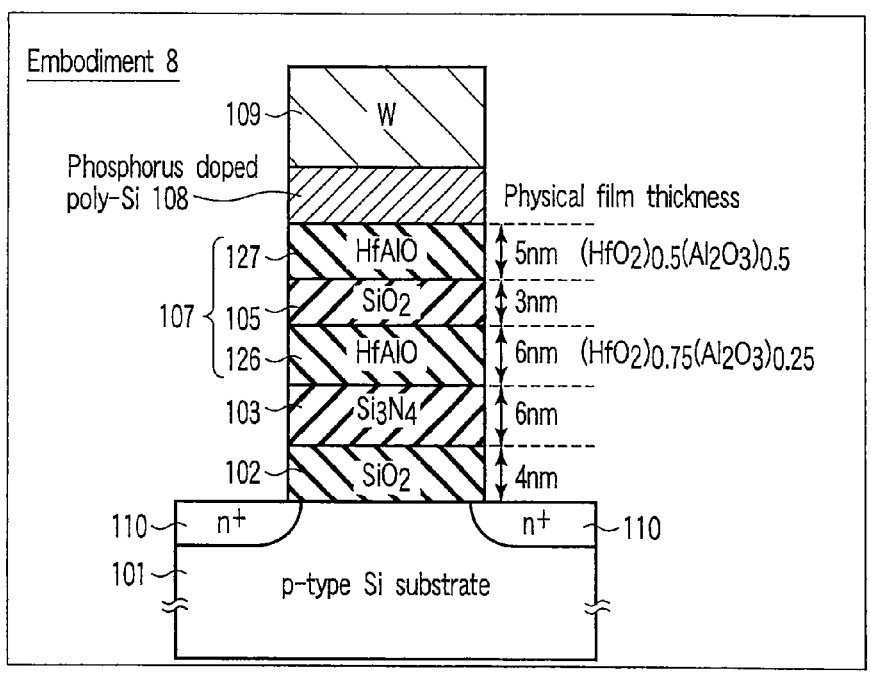
FIG. 27 is a cross sectional view showing a cell structure of an embodiment 8.

FIG. 27 shows a cross sectional view of the memory cell of the embodiment 8 in the channel length direction. Note that in FIG. 27, the same symbols are assigned to the same parts as in FIG. 6, and their detailed description will be omitted.

The present embodiment differs from previously described embodiment 1 in that hafnium aluminate film is used for the bottom layer (A), and the top layer (C) of the second insulating film. By using the hafnium aluminate film, there is obtained summed effect of property of alumina with relatively high reliability, and property of hafnia with relatively strong suppression of the leakage current in the high electric field region.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, the second insulating film (block insulating film) 107 formed of three layers of the bottom layer (A), the middle layer (B) and the top layer (C) is provided. The bottom layer (A) 126 of the second insulating film is hafnium aluminate whose composition is represented by $(HfO_2)_{0.75}(Al_2O_3)_{0.25}$, and its thickness is 6 nm. Additionally, the middle layer of the second insulating film is the silicon oxide film whose thickness is 3 nm. Additionally, the top layer (C) 127 of the second insulating film is hafnium aluminate whose composition is represented by $(HfO_2)_{0.5}(Al_2O_3)_{0.5}$, and its thickness is 5 nm.

On the second insulating film 107, for instance, a control gate electrode 108 formed of a phosphorus-doped polycrystalline silicon film is provided. On the control gate electrode 108, for instance, a low resistance metal film 109 made of tungsten (W) is provided.

As for the first insulating film (tunnel insulating film) 102, the charge storage layer 103, and the control gate electrode 108 used for the present embodiment, modifications like the embodiment 1 may be performed.

Next, as for the manufacturing method of the memory cell of FIG. 27, the process steps different from the embodiment 1 will be described.

Up to the formation of the charge storage layer, the processes like the embodiment 1 are performed.

Continuously, the hafnium aluminate of the bottom layer (A) of the second insulating film is formed by repeating a cycle by 1:3 of the ALD method of alumina formation using TMA and $H_2O$ in the temperature range of 200° C. to 400° C., and the ALD method of hafnia formation using $Hf[N(CH_3)_2]_4$ and $H_2O$.

Next, as for the middle layer (B) of the second insulating film, the silicon oxide film ($SiO_2$) is formed by the LPCVD method using dichlorosilane ($SiH_2Cl_2$) and $N_2O$ within the temperature range of 600° C. to 800° C.

Continuously, the hafnium aluminate of the top layer (C) of the second insulating film is formed by repeating a cycle by 2:2 of the ALD method of alumina formation using TMA and $H_2O$ in the temperature range of 200° C. to 400° C., and the ALD method of hafnia formation using $Hf[N(CH_3)_2]_4$ and $H_2O$.

Meanwhile, the above-described manufacturing method is only one example, and other manufacturing methods may be used.

For instance, the hafnium aluminate film of the second insulating film (block insulating film) can also be formed by the ALD method by using other precursors, or the MOCVD method instead of the ALD method. Additionally, as for the processes other than the process step for forming the second insulating film, replacement by other manufacturing methods may be performed, just as in the embodiment 1.

(9) Embodiment 9

FIG. 28 shows a cross sectional view of the memory cell of the embodiment 9 in the channel length direction. Note that in FIG. 28, the same symbols are assigned to the same parts as in FIG. 6, and their detailed description will be omitted.

The present embodiment differs from previously described embodiment 1 in that hafnia ($HfO_2$) is used instead of alumina ($Al_2O_3$) as the bottom layer (A), and the top layer (C) of the second insulating film.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, as the second insulating film (block insulating film), for instance, there is provided the laminated insulating film 107 comprised of a hafnia film 128 with a thickness of 7 nm, the silicon oxide film 105 with a thickness of 3 nm, and a hafnia film 129 with a thickness of 7 nm.

On the second insulating film 107, for instance, a control gate electrode 108 formed of a phosphorus-doped polycrystalline silicon film is provided. On the control gate electrode 108, for instance, a low resistance metal film 109 made of tungsten (W) is provided.

The first insulating film (tunnel insulating film) 102, the charge storage layer 103, and the control gate electrode 108 used for the present embodiment, can be modified in the same manner as the embodiment 1.

Next, as for the manufacturing method of the memory cell of FIG. 28, the process steps different from the embodiment 1 will be described.

Up to the formation of the charge storage layer, the processes like the embodiment 1 are performed.

Continuously, a hafnia ($HfO_2$) film 128 with a thickness of 7 nm is formed by the MOCVD method using $Hf[N(C_2H_5)_2]_4$ and $H_2O$ as the raw materials within the temperature range of 500° C. to 800° C. Continuously, the silicon oxide film ($SiO_2$) 105 with a thickness of 3 nm is formed by the LPCVD method using dichlorosilane ($SiH_2Cl_2$) and nitrogen monoxide ($N_2O$) as the raw material gasses in the temperature range of 600° C. to 800° C.

Continuously, a hafnia ($HfO_2$) film 129 with a thickness of 7 nm is formed by the MOCVD method using $Hf[N(C_2H_5)_2]_4$ and $H_2O$ as the raw materials within the temperature range of 500° C. to 800° C. As described above, the laminated block insulating film 107 of hafnia/silicon oxide film/hafnia resulting in the second insulating film is formed. The following processes after that are the same as that of the embodiment 1.

The above-described manufacturing method is only one example; other manufacturing methods may be performed. For instance, $HfO_2$ being one layer of the second insulating films (block insulating film) can also be formed by the ALD (atomic layer deposition) method using $Hf[N(C_2H_5)_2]_4$ and $H_2O$ (or $O_3$) as the raw material gasses in the temperature range of 200° C. to 400° C., in addition to MOCVD method.

Additionally, as for the processes other than the process step described above, replacement by other manufacturing methods may be performed, just as in the embodiment 1.

Next, there will be described the optimum thickness of the respective layers on the block film of this "HOH structure".

Decrease ratio of the leakage current as compared with the hafnia ($HfO_2$) single layer film is determined by the continuous thickness of the silicon oxide film as the middle layer. This is essentially the same as the embodiment 1. The thickness range of the intermediate silicon oxide film should be approximately 4 nm or less while considering balance between EOT increase and suppression amount of the leakage current in the low electric field region.

Additionally, as for the high electric field region, the leakage current of the "HOH structure" block insulating film of the present embodiment was estimated by varying the thickness of the hafnia layer at both ends and the thickness of the intermediate silicon oxide layer, respectively, in the range of 0 to 9 nm independently.

In this evaluation, it is assumed that the HOH structure is symmetrical in the thickness direction, and that the two hafnia layers located above and below have an equal thickness. Additionally, the electric field used for estimating the leakage current is a typical electric field in write and erase operations, since the effective electric field ($SiO_2$ equivalent electric field) 15 MV/cm is adopted as the representative electric field.

Plots of FIG. 29 indicate a thickness range in which the leakage current in the HOH structure of the present embodiment at the effective electric field of 15 MV/cm becomes smaller than that of the hafnia single layer film with equal EOT (EOT=5.5 nm).

It is understood from the result that the advantage of the HOH structure block film in the high electric field region is achieved in a range where thickness of the hafnia layer is within approximately 5.1 to 11.4 nm, and that whatever thickness is suitable for the $SiO_2$ layer when its thickness is 0.9 nm or more.

As described above, when considering the thickness range from the total viewpoints of the high electric region and the low electric region, the best performance of the HOH structure is achieved by adopting the hafnia thickness within the range of 5.1 to 11.4 nm, and additionally, by adopting the thickness of the middle silicon oxide film layer within the range of 0.9 to 4 nm.

(10) Embodiment 10

FIG. 30 shows a cross sectional view of the memory cell of the embodiment 10 in the channel length direction. Note that in FIG. 30, the same symbols are assigned to the same parts as in FIG. 6, and their detailed description will be omitted.

In the present embodiment, hafnia ($HfO_2$) is used as the bottom layer (A) and the top layer (C) of the second insulating film, and the middle layer (B) is the silicon oxynitride film. Others are the same as the embodiment 9.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, as the second insulating film (block insulating film), for instance, there is provided the laminated insulating film 107 formed of a hafnia film 128 with a thickness of 7 nm, the silicon oxynitride film 117 with a thickness of 3 nm and whose composition is $(SiO_2)_{0.6}(Si_3N_4)_{0.4}$, and a hafnia film 129 with a thickness of 7 nm.

On the second insulating film 107, for instance, a control gate electrode 108 formed of a phosphorus-doped polycrystalline silicon film is provided. On the control gate electrode 108, for instance, a low resistance metal film 109 made of tungsten (W) is provided.

The constitution of the first insulating film (tunnel insulating film) 102, the charge storage layer 103, and the control gate electrode 108 used for the present embodiment, may be modified in the same way as the embodiment 1.

Additionally, the manufacturing method of the memory cell of FIG. 30 is approximately the same as the manufacturing method of the embodiment 1 and the embodiment 9. However, the process step to form the silicon oxynitride film as the middle layer of the second insulating film is different.

This process is such that, for instance, in the temperature range of 600° C. to 800° C., after forming the silicon oxide film ($SiO_2$) by the LPCVD method using dichlorosilane ($SiH_2Cl_2$) and nitrogen monoxide ($N_2O$) as the raw material gasses, process to expose the wafer in nitrogen plasma may be performed.

Note that this manufacturing method is only one example of the methods to form the silicon oxynitride film, and accordingly, other manufacturing methods may be used. Additionally, with respect to other processes, the manufacturing method of the present embodiment may be replaced by other manufacturing methods, just as in the embodiment 1.

Next, there will be described optimum thickness of the respective layers in this $HfO_2/SiON/HfO_2$ laminated block film.

Behavior of the leakage current of the laminated block film was evaluated at the effective electric field $E_{eff}=15$ MV/cm, as a function of the composition value x of the middle SiON film: $(SiO_2)_x(Si_3N_4)_{1-x}$. In this evaluation, the thickness of the top and bottom $HfO_2$ films is equal. Then, the thickness range is investigated where the leakage current of the laminated block film decreases as compared with the leakage current of the hafnia single layer with equal EOT.

As understood from FIG. 31, when using the hafnia on both the bottom layer and the top layer of the second insulating film, there exists the region in which the leakage current of the laminated block film becomes superior to that of the hafnia single layer, regardless of the composition of the middle SiON layer (arbitrary x value). The hafnia region is represented by the minimum thickness: $-1.5x+6.5$ (nm), and the maximum thickness: $3.5x^2+7.8$ (nm) as functions of the composition x of the SiON film.

Note that when using hafnia for the bottom and top layers of the second insulating film, the barrier height of the intermediate SiON layer is always higher than the hafnia layers, because the conduction band offset of the SiON film is 2.1 eV even when the band offset becomes lowest (limit of $Si_3N_4$), whereas the conduction band offset of the hafnia to 1.9 eV. For that reason, additional barrier property is always obtained by inserting the SiON film as the middle layer. Therefore, it is conceivable that an effect of leakage current suppression is acquired.

(11) Embodiment 11

In the embodiment 1, the AOA structure is formed, and in the embodiment 9, HOH structure is formed; and as modifications thereof, it is suitable for the second insulating film to form AOH structure or HOA structure in which the high dielectric constant insulating film layers constituting the bottom layer (A) and the top layer (C) are appropriately combined. In this case, it is desirable for alumina (not hafnia) to be located at the control gate electrode side.

This is because hafnia is easy to possess defects caused by oxygen deficiency owing to its high ionicity. In comparison, the alumina possesses fewer defects and less frequency of charge capture and emission. Additionally, since the layer coming into contact with the charge storage layer can achieve function as part of the charge storage layer, the film with large number of traps may be suitable. However, it is necessary for the layer coming into contact with the control gate electrode to suppress the charge capture/emission.

Additionally, from the viewpoint of balance between write and erase operations, it is desirable for the Equivalent Oxide Thickness (EOT) of the hafnia and the alumina to be as near as possible.

FIG. 32 shows a cross sectional view of the memory cell of the embodiment 11 in the channel length direction. Note that in FIG. 32, the same symbols are assigned to the same parts as in FIG. 6, and their detailed description will be omitted.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, as the second insulating film (block insulating film), for instance, there is provided the laminated insulating film 107 formed of a hafnia film 128 with a thickness of 7 nm, the silicon oxynitride film 105 with a thickness of 3 nm and an alumina film 106 with a thickness of 3.9 nm.

On the second insulating film 107, for instance, a control gate electrode 108 formed of a phosphorus-doped polycrystalline silicon film is provided. On the control gate electrode 108, for instance, a low resistance metal film 109 made of tungsten (W) is provided.

Detailed description is omitted here, since the manufacturing method of the memory cell shown in FIG. 32 is one of appropriate combinations of the embodiment 1 and the embodiment 9.

(12) Embodiment 12

FIG. 33 shows a cross sectional view of the memory cell of the embodiment 12 in the channel length direction. Note that in FIG. 33, the same symbols are assigned to the same parts as in FIG. 6, and their detailed description will be omitted.

The present embodiment has characteristics as being such that the top layer (C) of the second insulating film in contact with the control gate electrode is formed of the silicon nitride film, and additionally, a material with large work function is adopted as the control gate electrode.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, as the second insulating film (block insulating film), the second insulating film 107 as the laminated insulating film formed of, for instance, the alumina film 104 with a thickness of 4 nm, the silicon oxide film 105 with a thickness of 3 nm, and the silicon nitride film 113 with a thickness of 3 nm is provided.

On the second insulating film 107, for instance, as the conductive materials with large work function, the control gate electrode 116 made of tungsten nitride (WN) is provided. On the control gate electrode 116, for instance, the low resistance metal film 109 made of tungsten (W) is provided.

As for the modified examples of the first insulating film (tunnel insulating film) 102, and the charge storage layer 103 in the present embodiment, the modifications same as the embodiment 1 may be used.

As for the modified example of the control gate electrode, it is possible to use the conductive materials as the modified examples shown in the embodiment 1, or other metals, metal nitrides, metal silicides whose work functions are 4.6 eV or more.

For instance, the control gate electrode may be formed of, instead of WN, materials including elements of one kind or more selected from Pt, W, Ir, Ru, Re, Mo, Ti, Ta, Ni, and Co, silicide of materials including elements of one kind or more selected from Pt, W, Ti, Ta, Ni, and Co, carbide of materials including elements of one kind or more selected from W, Ti and Ta, nitride of materials including elements of one kind or more selected from W, Mo, Ti, and Ta, siliconitride of a material including Ti, oxide of materials including elements of one kind or more selected from Ir, and Ru, or compounds thereof or composites thereof.

For instance, the control gate electrode may be formed of Pt, W, Ir, $IrO_2$, Ru, $RuO_2$, Re, TaC, Mo, $MoN_x$, $MoSi_x$, TiN, TiC, TiSiN, TiCN, Ni, $Ni_xSi$, $PtSi_x$, WC, WN, $WSi_x$ and the like.

Next, there will be described the different process steps from the embodiment 1 with respect to the manufacturing method of the memory cell of FIG. 33.

Formation of the first insulating film, and the charge storage layer is the same as that of embodiment 1.

In the forming process of the second insulating film, on the silicon oxide middle layer, for instance, the silicon nitride film 118 with a thickness of 3 nm is deposited by LPCVD method using dichlorosilane $SiH_2Cl_2$ and ammonia ($NH_3$) within the temperature range of 500° C. to 800° C. Next, as the control gate electrode 116, for instance, tungsten nitride (WN) with a thickness of 10 nm is formed by the MOCVD method using, for instance, $W(CO)_6$ and $NH_3$ as the raw materials.

After that, the low resistance metal film (word line) 109 made of tungsten with a thickness of approximately 100 nm is formed by MOCVD method using $WF_6$ or $W(CO)_6$ as raw material gas within the temperature range of 400° C. to 600° C.

The above-described manufacturing method is only one example; other manufacturing methods may be used, just as in the embodiment 1.

As for the raw material gas used for the CVD method, it is also possible to use other raw material gases for substitution. For instance, the silicon nitride film 113 may be formed by the LPCVD method using silane ($SiH_4$) and ammonia ($NH_3$) as the raw material gasses instead of the LPCVD method using dichlorosilane ($SiH_2Cl_2$) and ammonia ($NH_3$). Additionally, there are various forming methods such as the ALD (atomic layer deposition) method using BTBAS and ammonia ($NH_3$), or 3DMAS and ammonia ($NH_3$) within the temperature range of 400° C. to 600° C.

Next, for the $Al_2O_3/SiO_2/Si_3N_4$ laminated block film, there is investigated the condition in which the leakage current decreases than that of the single layer alumina film, in the electron injection from the control gate electrode (negative gate voltage).

Here, behavior of the leakage current of the laminated block film was evaluated at the effective electric field $E_{eff}$=15 MV/cm, while varying the work function of the control gate electrode. Here, the alumina thickness of the bottom layer (A) of the laminated block film was set to be 4 nm.

FIG. 34 plots the thickness region of the silicon nitride film and the silicon oxide film in which the leakage current of the laminated block film decreases as compared with the alumina single layer film having equal EOT (Equivalent Oxide Thickness) when the work function of the control gate electrode is 4.75 eV.

As understood from the drawing, the advantage of decreasing the leakage current can be obtained as compared with the alumina single layer film, by making the thickness of the silicon nitride top layer (C) within the range of 2.1 to 3.6 nm, which is irrelevant to the thickness of the $SiO_2$ middle layer (B).

FIG. 35 shows how the region of the optimum silicon nitride film thickness varies when the work function of the control gate is varied.

From this drawing, it is understood that, in order to obtain the superiority of the leakage current by the laminated block film, it is necessary for the work function of the control gate electrode to be made at least 4.6 eV or more. Additionally, when the work function of the control gate electrode is 4.6 eV or more, the optimum thickness range of the silicon nitride film is represented by the minimum thickness: $-5.2(x-4.6)+3$ nm, and the maximum thickness: $28(x-4.6)^2+3$ (nm).

(13) Embodiment 13

FIG. 36 shows a cross sectional view of the memory cell of the embodiment 13 in the channel length direction. Note that in FIG. 36, the same symbols are assigned to the same parts as in FIG. 6, and their detailed description will be omitted.

The present embodiment has characteristics as being such that the top layer (C) of the second insulating film coming into contact with the control gate electrode is formed of the aluminum silicate (AlSiO) film, and that TaN as a material with large work function is adopted as the control gate electrode.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, as the second insulating film (block insulating film), the second insulating film 107 as a laminated insulating film formed of, for instance, an alumina film 104 with a thickness of 4 nm, a silicon oxide film 105 with a thickness of 3 nm, and aluminum silicate film 114 whose composition is $(Al_2O_3)_{0.5}(SiO_2)_{0.5}$ with a thickness of 3 nm is provided.

On the second insulating film 107, for instance, as a conductive material with relatively large work function, the control gate electrode 115 formed of tantalum nitride (TaN) is provided. On the control gate electrode 115, for instance, a barrier metal 116 made of tungsten nitride (WN), and the low resistance metal film 109 made of tungsten (W) are provided.

As for the modified examples of the first insulating film (tunnel insulating film) 102, and the charge storage layer 103, they are the same as those of the embodiment 1. Additionally, as for the modified examples of the control gate electrode, it is possible to use the conductive materials as shown in the modified examples of the embodiment 1 and the embodiment 12.

For instance, instead of the respective WN and TaN layers, the control gate electrode may be formed of, materials including elements of one kind or more selected from Pt, W, Ir, Ru, Re, Mo, Ti, Ta, Ni, and Co, silicide of materials including elements of one kind or more selected from Pt, W, Ti, Ta, Ni, and Co, carbide of materials including elements of one kind or more selected from W, Ti and Ta, nitride of materials including elements of one kind or more selected from W, Mo, Ti, and Ta, siliconitride of a material including Ti, oxide of materials including elements of one kind or more selected from Ir, and Ru, or compounds thereof or composites thereof.

For instance, the control gate electrode may be formed of Pt, W, Ir, $IrO_2$, Ru, $RuO_2$, Re, TaC, Mo, $MoN_x$, $MoSi_x$, TiN, TiC, TiSiN, TiCN, Ni, $Ni_xSi$, $PtSi_x$, WC, WN, $WSi_x$ and the like.

Next, there will be described the different process steps from the embodiment 1 with respect to the manufacturing method of the memory cell of FIG. 36.

Formation of the first insulating film, and the charge storage layer is the same as that of embodiment 1.

For the forming process of the second insulating film, an aluminum silicate film 114 with a thickness of approximately 3 nm is deposited by the ALD method using, for instance, TMA, BTBAS and $H_2O$ within a temperature range 200° C. to 400° C., onto the silicon oxide film of the middle layer. Note that in this case, 3DMAS may be substituted for BTBAS.

Next, as the control gate electrode 115, for instance, tantalum nitride (TaN) film with a thickness of 10 nm is formed by the MOCVD method using, for instance, $Ta(N(CH_3)_2)_5$ and $NH_3$ as the raw materials. As the barrier metal 116, tungsten nitride (WN) with a thickness of 10 nm is formed thereon by the MOCVD method using $W(CO)_6$ and $NH_3$ as the raw materials.

After that, the low resistance metal film (word line) 109 with a thickness of approximately 100 nm made of tungsten is formed by, for instance, the MOCVD method using $WF_6$ or $W(CO)_6$ as the raw material gas within a temperature range 400° C. to 600° C.

Note that the above-described manufacturing method is only one example; other manufacturing methods may be used. Additionally, with respect to the raw material gas used for the CVD method, it is possible to use other raw material gas.

Next, for the $Al_2O_3/SiO_2/AlSiO$ laminated block film, there is investigated how the relation between the composition of AlSiO and the work function of the control gate electrode should be.

FIG. 37 shows current-effective electric field characteristics as a function of the compositional value x of the aluminum silicate film $(Al_2O_3)_x(SiO_2)_{1-x}$. The electrode work function in this case was set to be 4.05 eV ($n^+$ poly-gate electrode). It is understood that the leakage current decreases as the compositional ratio x increases (i.e. as the ratio of $Al_2O_3$ component in the aluminum silicate increases). Next, FIG. 38 shows dependence of the leakage current (FN tunneling current) on the work function of the control gate electrode at the effective electric field $E_{eff}=15$ MV/cm, when the electrons are injected to the laminated block film from the control gate electrode (negative gate voltage application).

As reference of comparison, a parallel line in the horizontal axis direction indicates the leakage current (FN tunneling current) when the control gate electrode is $n^+$ polycrystalline silicon, and the insulating film coming into contact with the control gate electrode is the alumina film.

As understood from this result, with exception when the film composition of the aluminum silicate is extremely close to $SiO_2$ (when the compositional value x is close to zero), it is possible to suppress the leakage current of the laminated block film as compared with the alumina single layer film ($n^+$ poly-gate electrode) by increasing the work function of the control gate electrode.

Figure 38:
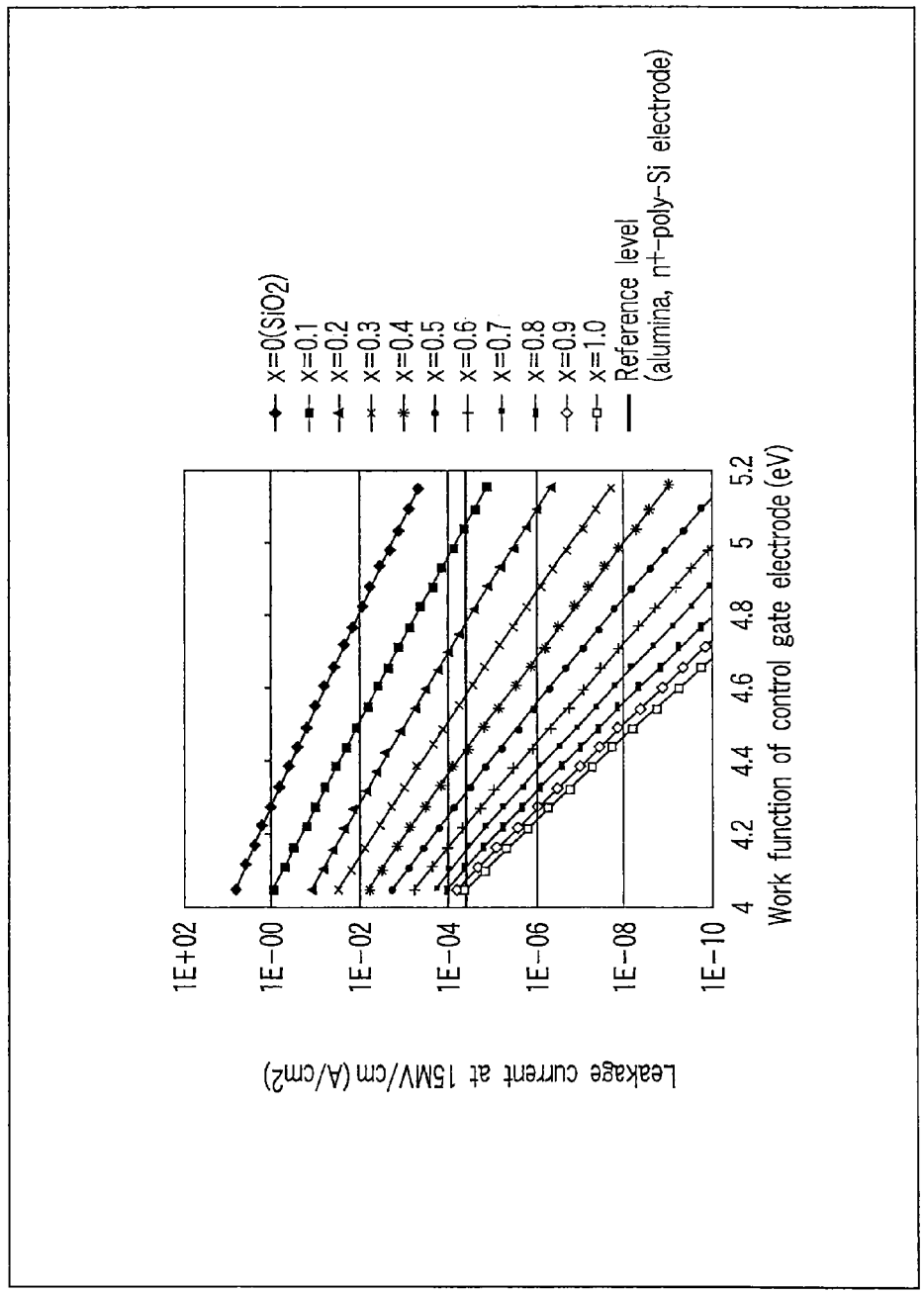
FIG. 38 is a view showing relation between a leakage current of aluminum silicate and a work function of a control gate electrode.
Figure 39:
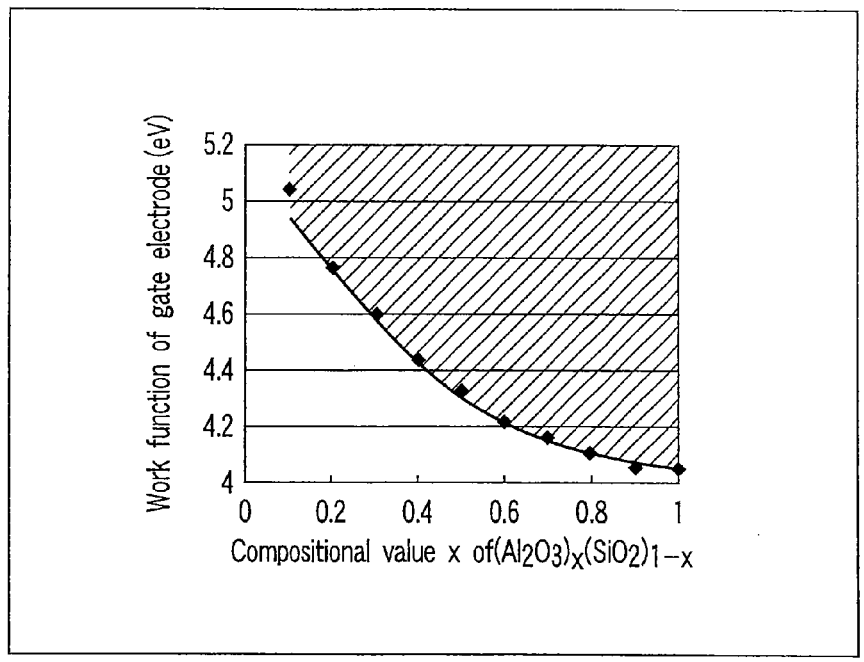
FIG. 39 is a view showing relation between a compositional ratio and a work function.

Based on the calculation of FIG. 38, FIG. 39 shows necessary work function of the control gate electrode as a function of the aluminum silicate composition, in order to realize the leakage current which is less than the comparison reference (alumina single layer film, with $n^+$ poly-gate electrode) during the electron injection from the control gate electrode.

It is understood that, as in the present embodiment, when the composition of the aluminum silicate is x=0.5, the work function of the control gate electrode should be approximately 4.3 eV or more. Thus, TaN of the present embodiment (work function 4.5 eV) meets this condition.

(14) Embodiment 14

Figure 40:
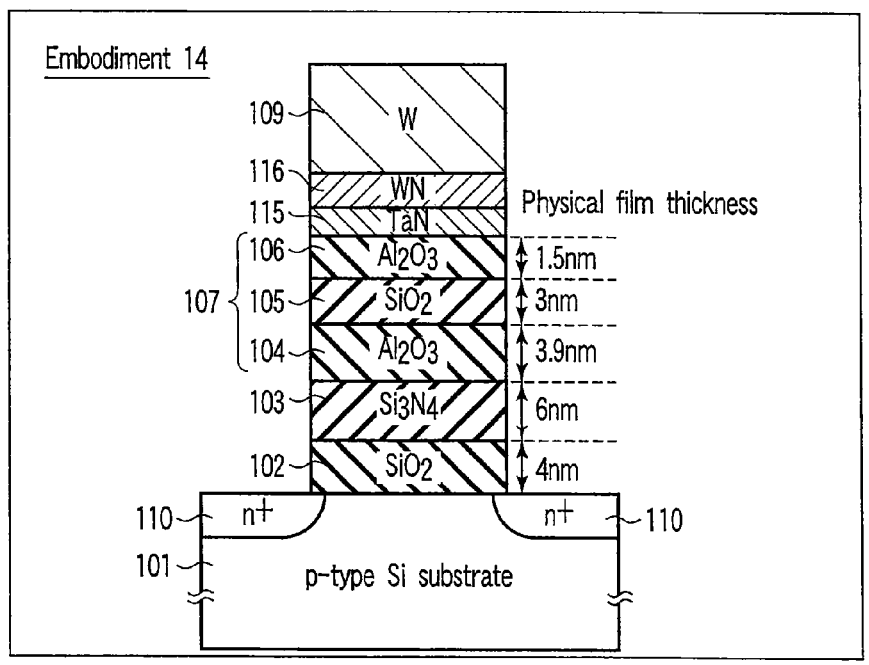
FIG. 40 is a cross sectional view showing a cell structure of an embodiment 14.

FIG. 40 shows a cross sectional view of the memory cell of the embodiment 14 in the channel length direction. Note that in FIG. 40, the same symbols are assigned to the same parts as in FIG. 6, and their detailed description will be omitted.

The present embodiment is different from the previously described embodiment 1 in the following points.

One of the above points is that the thickness of alumina ($Al_2O_3$) of the top layer (A) and the bottom layer (C) of the second insulating film differs. The other of the points is that the work function of the control gate is made large by replacing the control gate electrode from the phosphorus-doped polycrystalline silicon to the tantalum nitride (TaN).

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

On the charge storage layer 103, as the second insulating film (block insulating film), for instance, there is provided the laminated insulating film 107 comprised of an alumina film 104 with a thickness of 3.9 nm, the silicon oxynitride film 105 with a thickness of 3 nm and an alumina film 106 with a thickness of 1.5 nm.

On the second insulating film 107, for instance, as the conductive material with relatively large work function, the control gate electrode 115 made of tantalum nitride (TaN) is provided. On the control gate electrode 115, for instance, a barrier metal 116 made of tungsten nitride (WN), and the low resistance metal film 109 made of tungsten (W) are provided.

Modified examples of the first insulating film (tunnel insulating film) 102, and the charge storage layer 103, are the same as in the embodiment 1.

For instance, the control gate electrode may be formed of, instead of the respective layers of WN and TaN, materials including elements of one kind or more selected from Pt, W, Ir, Ru, Re, Mo, Ti, Ta, Ni, and Co, silicide of materials including elements of one kind or more selected from Pt, W, Ti, Ta, Ni, and Co, carbide of materials including elements of one kind or more selected from W, Ti and Ta, nitride of materials including elements of one kind or more selected from W, Mo, Ti, and Ta, siliconitride of a material including Ti, oxide of materials including elements of one kind or more selected from Ir, and Ru, or compounds thereof or composites thereof.

For specific instances, the control gate electrode may be formed of Pt, W, Ir, $IrO_2$, Ru, $RuO_2$, Re, TaC, Mo, $MoN_x$, $MoSi_x$, TiN, TiC, TiSiN, TiCN, Ni, $Ni_xSi$, $PtSi_x$, WC, WN, $WSi_x$ and the like.

Next, there will be described the different process steps from the embodiment 1 with respect to the manufacturing method of the memory cell of FIG. 40.

Formation of the first insulating film, the charge storage layer, and the second insulating film is the same as that of embodiment 1.

In the forming process of the second insulating film, the second deposition time (or cycle number) of alumina is adjusted, and the alumina film with a thickness of 1.5 nm is deposited. Next, as the control gate electrode 115, for instance, the tantalum nitride (TaN) film with a thickness of 10 nm is formed by the MOCVD method using $Ta[N(CH_3)_2]_5$ as the raw material.

Next, as the barrier metal 116, for instance, tungsten nitride (WN) with a thickness of 10 nm is formed by the MOCVD method using $W(CO)_6$ and $NH_3$ as the raw material.

After that, the low resistance metal film (word line) 109 with a thickness of approximately 100 nm made of tungsten is formed by the MOCVD method using $WF_6$ or $W(CO)_6$ as the raw material gas within the temperature range 400° C. to 600° C.

The above-described manufacturing method is only one example, and other manufacturing methods may be used, just as in the embodiment 1.

(15) Embodiment 15

Figure 41:
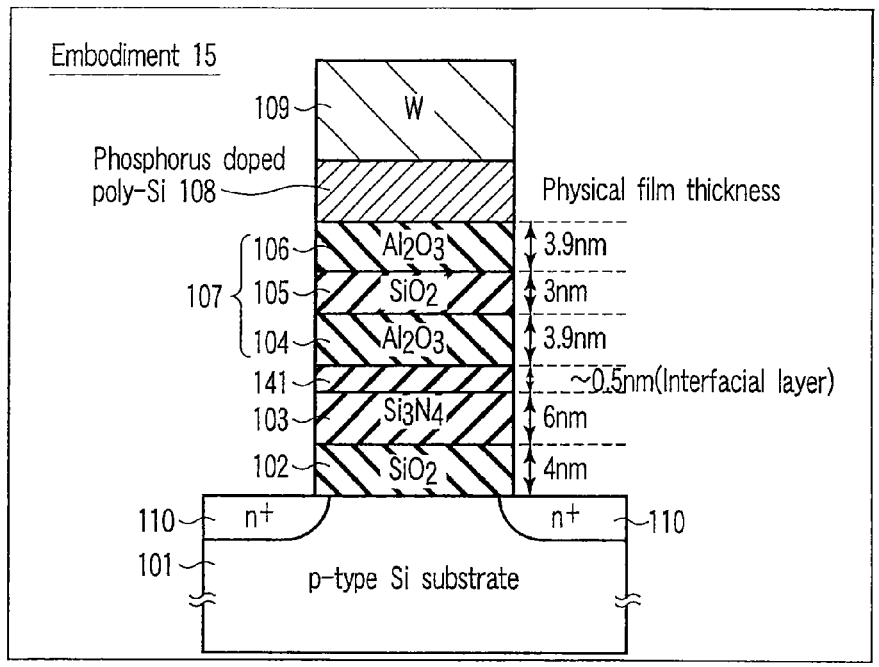
FIG. 41 is a cross sectional view showing a cell structure of an embodiment 15.

FIG. 41 shows a cross sectional view of the memory cell of the embodiment 15 in the channel length direction. Note that in FIG. 41, the same symbols are assigned to the same parts as in FIG. 6, and their detailed description will be omitted.

The present embodiment differs from the previously described embodiment 1 in that an ultrathin interface layer is provided on the charge storage layer. Effects of increasing trap density of the charge storage layer can be obtained by disposing the ultrathin interface layer.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided. On the first insulating film 102, as the charge storage layer, for instance, the silicon nitride film ($Si_3N_4$) 103 with a thickness of 6 nm is provided.

An ultrathin interface layer 141 with a thickness of approximately 0.5 nm is provided on the charge storage layer 103. On the ultrathin interface layer 141, as the second insulating film (block insulating film), the second insulating film 107 formed of three layers of the bottom layer (A), the middle layer (B), and the top layer (C) is provided. The bottom layer (A) 104 of the second insulating layer 107 is alumina with a thickness of 3.9 nm. Additionally, the middle layer (B) 105 of the second insulating film is the silicon oxide film with a thickness of 3 nm. Additionally, the top layer (C) 106 of the second insulating film is alumina with a thickness of 3.9 nm.

On the second insulating film 107, for instance, the control gate electrode 108 formed of the phosphorus-doped polycrystalline silicon film is provided. On the control gate electrode 108, for instance, the low resistance metal film 109 made of tungsten (W) is provided.

The first insulating film (tunnel insulating film) 102, the charge storage layer 103, and the control gate electrode 108, used for the present embodiment may be modified in the same way as the embodiment 1.

Next, there will be described different process steps from the embodiment 1 with respect to the manufacturing method of the memory cell of FIG. 41.

The same process as the embodiment 1 is performed up to the formation of the charge storage layer.

Continuously, an interface layer formed of an ultrathin silicon oxide film is formed on the surface of the silicon nitride film as the charge storage layer in such a way that the wafer is exposed to oxidation atmosphere within the temperature range 200° C. to 500° C.

As for the oxidation atmosphere, oxygen or ozone is caused to flow in a chamber for forming alumina on the nitride film; and the wafer surface may be exposed to the gasses under the control of gas-flow duration, before forming alumina by the ALD method.

Next, alumina of the bottom layer (A) 104 of the second insulating film is formed by the ALD method using TMA and, $O_3$ or $H_2O$ within the temperature range of 200° C. to 400° C.

Continuously, as for the middle layer (B) 105 of the second insulating film, the silicon oxide film is formed by the LPCVD method using dichlorosilane ($SiH_2Cl_2$) and $N_2O$ within the temperature range of 600° C. to 800° C.

Like the bottom layer (A), alumina of the top layer (C) 106 of the second insulating film is formed by the ALD method using TMA and, $O_3$ or $H_2O$ within the temperature range of 200° C. to 400° C.

Note that the above-described manufacturing method is only one example, and accordingly, other manufacturing methods may be used.

For instance, the ultrathin interface layer on the charge storage layer may be formed by using $H_2O$ instead of oxygen or ozone. Additionally, the alumina film of the second insulating film (block insulating film) may be formed by the ALD method using other precursors, or the MOCVD method instead of the ALD method.

With respect to the process steps besides the formation of the second insulating film, other manufacturing methods may be used, just as in the embodiment 1.

Note that an ultrathin interfacial oxidized film layer may be formed and inserted between the silicon nitride film as the charge storage layer and the alumina layer thereon. This is because the silicon nitride film is oxidized unintentionally due to the deposition of the alumina layer. When the thickness of the interfacial oxidized film layer is approximately 1 nm or less, it can be regarded as the modification of the present embodiment.

(16) Embodiment 16

Figure 42:
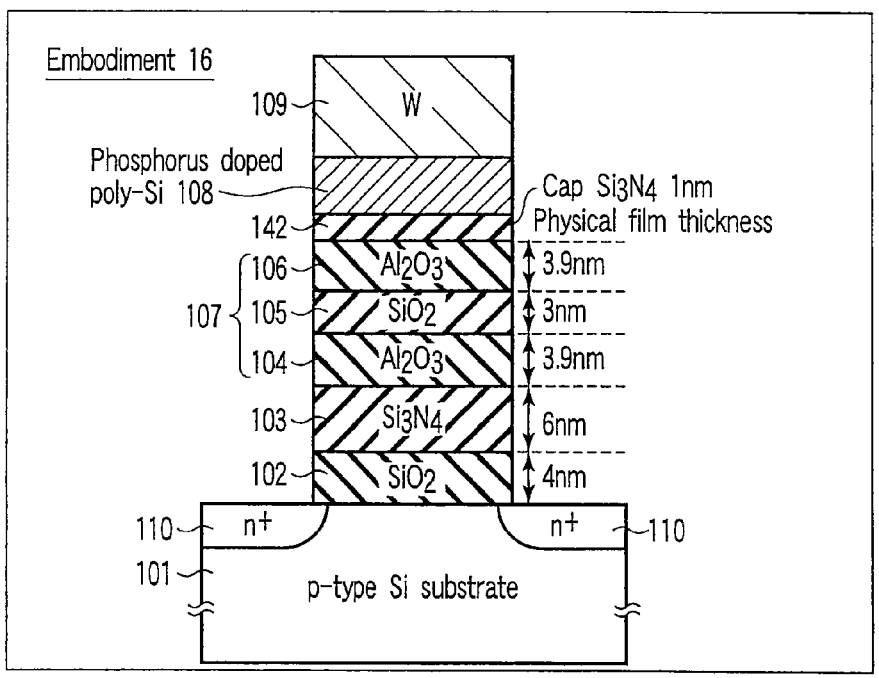
FIG. 42 is a cross sectional view showing a cell structure of an embodiment 16.

FIG. 42 shows a cross sectional view of the memory cell of the embodiment 16 in the channel length direction. Note that in FIG. 42, the same symbols are assigned to the same parts as in FIG. 6, and their detailed description will be omitted.

As for the embodiment 16, an ultrathin silicon nitride film 142 for reaction prevention is further inserted between the upper side alumina layer of the second insulating film and the control gate electrode, in addition to the constitution of the embodiment 1.

The ultrathin silicon nitride film may be formed in the same process as the silicon nitride film of the charge storage layer.

Since the embodiment 16 does not differ from the embodiment 1 except that the reaction prevention layer is inserted, detailed description is omitted.

Note that it is also conceivable to insert the ultrathin film as the reaction prevention layer between the second insulating film and the charge storage layer, in addition to the case in which the ultrathin film as the reaction prevention layer is inserted between the second insulating film and the control gate electrode as shown in this embodiment.

(17) Embodiment 17

Figure 43:
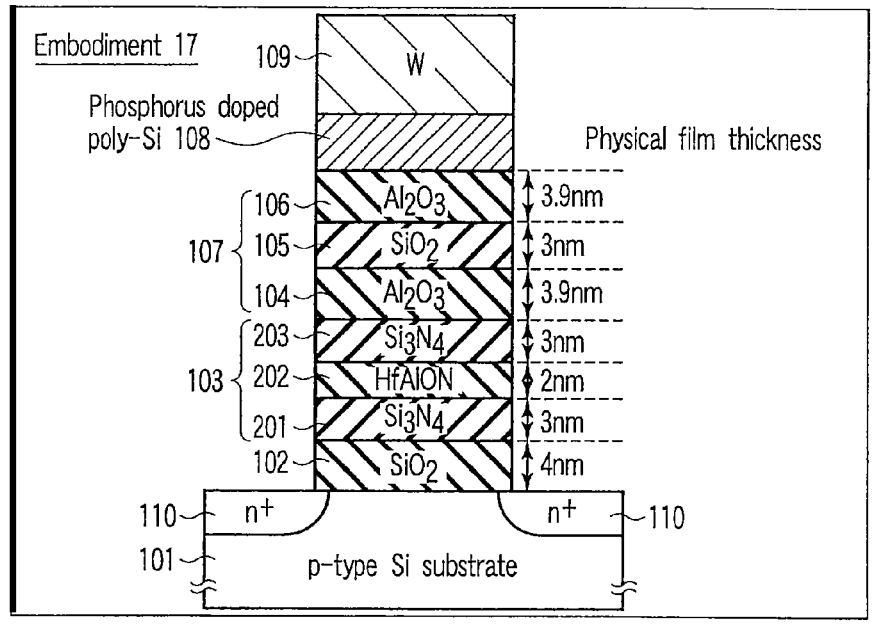
FIG. 43 is a cross sectional view showing a cell structure of an embodiment 17.

FIG. 43 shows a cross sectional view of the memory cell of the embodiment 17 in the channel length direction. Note that in FIG. 43, the same symbols are assigned to the same parts as in FIG. 6, and their detailed description will be omitted.

The present embodiment differs from the previously described embodiment 1 in that the charge storage layer is formed of a plurality of layers. When the charge storage layer is formed of the plurality of layers, the performance of the MONOS memory cell is improved. That is described in, for instance, Z. L. Huo, J. K. Yang, S. H. Lim, S. J. Baik, J. Lee, J. H. Han, I. S. Yeo, U. I. Chung, J. T. Moon, B. I. Ryu, "Band Engineered Charge Trap Layer for highly Reliable MLC Flash Memory," 8B-1, 2007 Symposium on VLSI Technology (2007).

By combining the second insulating film and the plurality of charge storage layers of the present invention, not only the performances of write/erase/data-retention are improved, but also it becomes possible to reduce the thickness of the respective films of the charge storage layer formed of the plurality of layers. This is a result corresponding to the high blocking performance of the leakage current in the second insulating film (block insulating film). Due to the thickness reduction of the charge storage layer, the Equivalent Oxide Thickness of MONOS as a whole decreases. Accordingly, new effect of decreasing the voltage of the control gate electrode is obtained.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided.

The charge storage layer 103 which is comprised of, for example, a stack layer of silicon nitride ($Si_3N_4$) 201 with a thickness of 3 nm, HfAlON film 202 with a thickness of 2 nm and silicon nitride ($Si_3N_4$) 203 with a thickness of 3 nm is provided on the silicon oxide film 102.

On the charge storage layer 103, as the second insulating film (block insulating film) 107, the insulating film formed of three layers of the bottom layer (A), the middle layer (B) and the top layer (C) is provided. The bottom layer (A) 104 of the second insulating film 107 is alumina, with a thickness of 3.9 nm. Additionally, the middle layer (B) 105 of the second insulating film 107 is the silicon oxide film with a thickness of 3 nm. Additionally, the top layer (C) 106 of the second insulating film 107 is alumina with a thickness of 3.9 nm.

On the second insulating film 107, for instance, the control gate electrode 108 formed of the phosphorus-doped polycrystalline silicon film is provided. On the control gate electrode 108, for instance, the low resistance metal film 109 made of tungsten (W) is provided.

The first insulating film (tunnel insulating film) 102, the charge storage layer 103, and the control gate electrode 108, used for the present embodiment may be modified in the same way as the embodiment 1.

Next, there will be described different process steps from the embodiment 1 with respect to the manufacturing method of the memory cell of FIG. 43.

The silicon nitride film at lower side of the charge storage layer is formed by the LPCVD method using dichlorosilane ($SiH_2Cl_2$) and $NH_3$ within the temperature range of 600° C. to 800° C.

Continuously, as for HfAlON, the hafnium aluminate is formed by repeating a cycle by 3:1 of the ALD method of alumina formation using TMA and $H_2O$, and the ALD method of hafnium formation using $Hf[N(CH_3)_2]_4$ and $H_2O$ within the temperature range of 200° C. to 400° C. After that, $NH_3$ annealing is performed within the temperature range of 600° C. to 800° C.

Next, the silicon nitride film at upper side of the charge storage layer, like the lower side silicon nitride film, is formed by the LPCVD method using dichlorosilane ($SiH_2Cl_2$) and $NH_3$ within the temperature of 600° C. to 800° C.

Next, alumina of the bottom layer (A) of the second insulating layer is formed by the ALD method using TMA and, $O_3$ or $H_2O$ within the temperature range 200° C. to 400° C.

Continuously, as for the middle layer (B) of the second insulating film, the silicon oxide film is formed by the LPCVD method using dichlorosilane ($SiH_2Cl_2$) and $N_2O$ within the temperature of 600° C. to 800° C.

Like the bottom layer (A), alumina of the top layer (C) of the second insulating film is formed by the ALD method using TMA and, $O_3$ or $H_2O$ within the temperature range 200° C. to 400° C.

Note that the above-described manufacturing method is only one example, and accordingly, other manufacturing methods may be used.

For instance, as for the precursor in the ALD method, other raw materials may be used. It is also possible to replace the LPCVD method by the ALD method. As for the process steps besides the laminated charge storage layer and the formation of the second insulating film, other manufacturing methods may be used, just as in the embodiment 1.

Note that the laminated charge storage layer is not necessarily to be three layers. For instance, the laminated charge storage layer may be formed of two layers of the silicon nitride film ($Si_3N_4$) and HfAlON film. That is, the laminated charge storage layer may be formed in such a configuration that the silicon nitride film of either one of the top layer or the bottom layer is eliminated. These configurations are all regarded as modifications of the present embodiment.

(18) Embodiment 18

Figure 44:
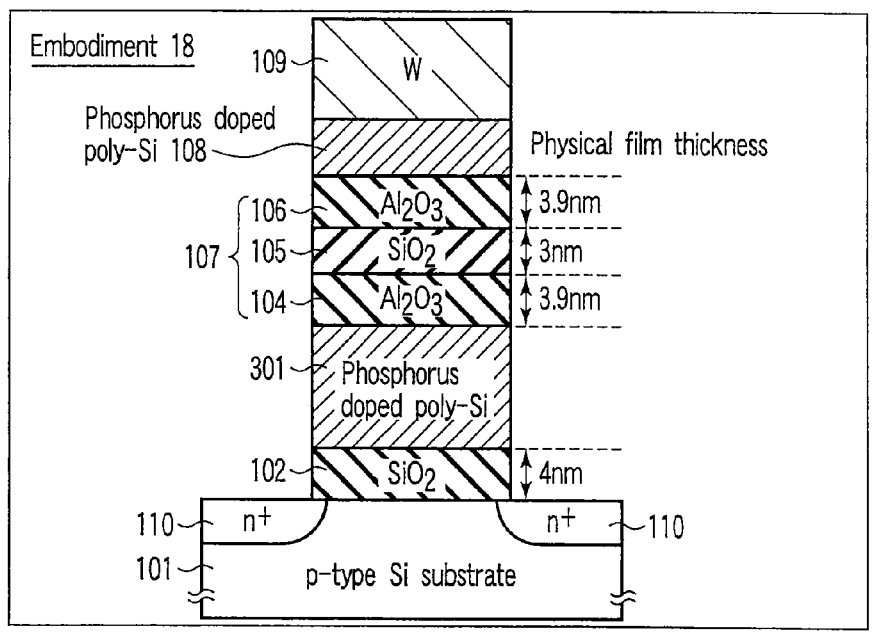
FIG. 44 is a cross sectional view showing a cell structure of an embodiment 18.

FIG. 44 shows a cross sectional view of the memory cell of the embodiment 18 in the channel length direction. Note that in FIG. 44, the same symbols are assigned to the same parts as in FIG. 6, and their detailed description will be omitted.

The present embodiment differs from the previously described embodiment 1 in that the charge storage layer is formed of the polycrystalline silicon not the insulating film.

This means that the present invention is capable of obtaining the effect of performance improvement not only in the MONOS type memory but also in the floating gate flash memory.

On a surface of p-type silicon substrate (including wells) 101, two source/drain diffusion layers 110 are provided separately from each other. On the channel region between the source/drain diffusion layers 110, as the first insulating film (tunnel insulating film), for instance, the silicon oxide film ($SiO_2$) 102 with a thickness of 4 nm is provided.

On the first insulating film 102, as the charge storage layer 301, for instance, the phosphorus-doped polycrystalline silicon with a thickness of 20 nm is provided.

On the charge storage layer 301, as the second insulating film (block insulating film) 107, the insulating film formed of three layers of the bottom layer (A), the middle layer (B) and the top layer (C) is provided. The bottom layer (A) 104 of the second insulating film 107 is alumina, whose thickness is 3.9 nm. Additionally, the middle layer (B) 105 of the second insulating film 107 is the silicon oxide film with a thickness of 3 nm. Additionally, the top layer (C) 106 of the second insulating film 107 is alumina whose thickness is 3.9 nm.

On the second insulating film 107, for instance, the control gate electrode 108 formed of the phosphorus-doped polycrystalline silicon film is provided. On the control gate electrode 108, for instance, the low resistance metal film 109 made of tungsten (W) is provided.

The first insulating film (tunnel insulating film) 102, and the control gate electrode 108, used for the present embodiment may be modified in the same way as the embodiment 1.

Next, there will be described different process steps from the embodiment 1 as to the manufacturing method of the memory cell of FIG. 44.

The polycrystalline silicon of the charge storage layer is formed by the LPCVD method using, for instance, silane ($SiH_4$), and phosphine ($PH_3$) as the raw material gasses within the temperature range of 550° C. to 700° C.

Next, alumina of the bottom layer (A) of the second insulating film is formed by the ALD method using TMA and, $O_3$ or $H_2O$ within the temperature range of 200° C. to 400° C.

Continuously, as for the middle layer (B) of the second insulating film, the silicon oxide film is formed by the LPCVD method using dichlorosilane ($SiH_2Cl_2$) and $N_2O$ within the temperature range of 600° C. to 800° C.

Like the bottom layer (A), alumina of the top layer (C) of the second insulating film is formed by the ALD method using TMA and, $O_3$ or $H_2O$ within the temperature range of 200° C. to 400° C.

Note that the above-described manufacturing method is only one example, and accordingly, other manufacturing methods may be used.

For instance, other raw materials may substitute for the precursors in the ALD method, and it is possible to replace the LPCVD method with the ALD method. Additionally, as for the processes besides the process steps for forming the laminated charge storage layer and the second insulating film, other manufacturing method may be used, just as the embodiment 1.

Note that the floating gate made of single-layered polycrystalline silicon is used as the charge storage layer in the present embodiment; and instead of that, an embodiment in which the floating gate is divided into some pieces may also be regarded as one of the modifications of the present embodiment. For instance, using dots of polycrystalline silicon (or metal) as the charge storage layer corresponds to such case.

(19) Others

With respect to the embodiments 1 to 18, supplemental description will be done as follows.

Advantage of Continuous Composition:

The advantage of making the second insulating film in the above-described embodiments into the continuous composition is that the interface defects can be decreased by forming the bottom layer (A), the middle layer (B), and the top layer (C) of the second insulating film into the continuous composition. Note that in some cases, defects may exist at the interfaces of the bottom layer (A), the middle layer (B), and the top layer (C) of the second insulating film depending on the forming method. Therefore, it is expected that the insulating film with high dielectric breakdown strength, and low leakage current can be obtained (for instance, refer to K. Iwamoto, A, Ogawa, T. Nabatame, H. Satake and A. Toriumi, "Performance improvement of n-MOSFETs with constituent gradient $HfO_2/SiO_2$ interface", Microelectronic Engineering 80, 202 (2005)).

Effect of Increasing Silicon Composition:

It is known empirically that as for so-called high-k insulating film (metal oxide), large number of defects exist in the film. Further, theoretically, according to the bond constraint theory, it is known that the insulating film with large coordination number has large strain. Accompanied with this, large number of defects are generated (G. Lucovsky, Y. Wu, H. Niimi, V. Misra, L. C. Phillips, "Bonding constraints and defect formation at interfaces between crystalline silicon and advanced single layer and composite gate dielectrics," Appl. Phys. Lett. 74, 2005 (1999)). The high-k insulating film has larger average coordination number as compared with the insulating film of the silicon oxide film system. Therefore, the high-k insulating film inevitably results in the film with large number of defects.

For that reason, increasing the composition of silicon in the middle layer (B) of the second insulating layer is effective to decrease the defect density of the middle layer.

Effect of Nitrogen Segregation at Interface:

When the gate stack structure of the flash memory cell is subjected to a high temperature heating process, metal elements included in the high-k insulating film of the bottom layer (A) and the top layer (C) of the second insulating film diffuse into the middle layer (B). Additionally, vice versa, the silicon element included in the middle layer (B) diffuses into the bottom layer (A) and the top layer (C).

Thus, the respective atoms have a tendency to diffuse toward regions with low concentration. By increasing nitrogen concentration in the vicinity of the interface between the bottom layer (A) and the middle layer (B), and in the vicinity of the interface between the top layer (C) and the middle layer (B), it is possible to form the second insulating film with high controllability while preventing the inter-diffusion caused by the high temperature heating process at the time of manufacturing memory cell.

When Hf is included in the bottom layer (A) and the top layer (C), it is desirable that such disposition of the nitrogen distribution is performed because Hf has faster diffusion speed as compared with Al.

By introducing nitrogen into the bottom layer (A) and the top layer (C), it is possible to suppress the diffusion of the metal element in the high temperature heating process at the time of manufacturing the memory cell. Additionally, when the introduced nitrogen is appropriate amount, it is possible to increase dielectric strength of the high-k insulating film of the bottom layer (A) and the top layer (C), or to suppress the leakage current in the low electric field region by decreasing the defect density.

When introducing silicon into the film, the same effect is obtained. It is desirable that silicon is added in the degree that the dielectric constant does not decrease remarkably.

Figure 45:
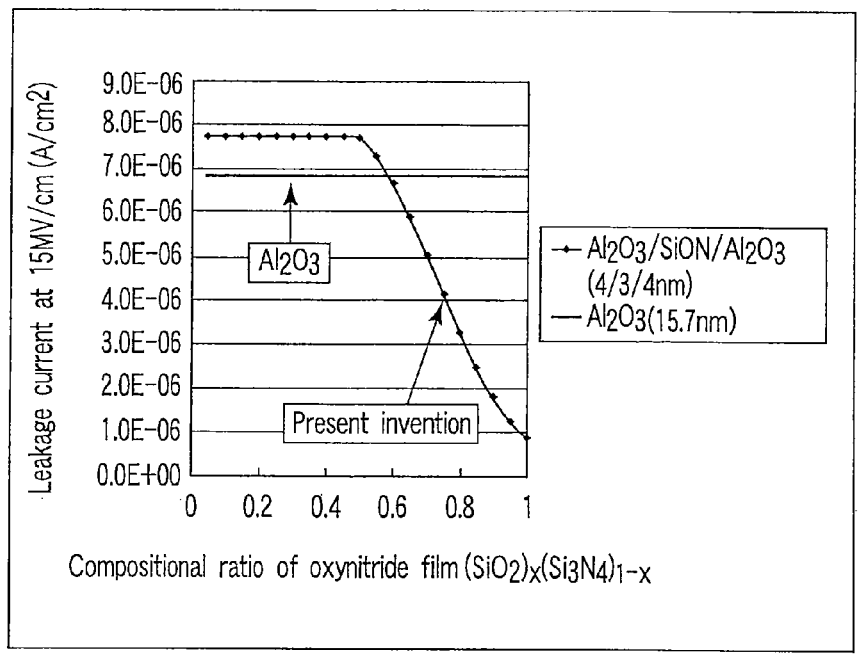
FIG. 45 is a view showing relation between a compositional ratio of an oxynitride film and a leakage current.

Determination Factor of Composition and Thickness Range of the Middle Layer:

In $Al_2O_3/SiON/Al_2O_3$ structure, when the compositional ratio x of the silicon oxynitride film $(SiO_2)_x(Si_3N_4)_{1-x}$ is 0.6 or more, the leakage current in the high electric field region becomes smaller than that of the $Al_2O_3$ single layer film. The reason is that, as shown in FIG. 45, in the oxidized film side (side in which x is large) than the compositional ratio of 0.6, the barrier height of the middle layer (B) becomes larger than the barrier height of $Al_2O_3$.

As for the range of the optimum thickness of the silicon oxide film of the middle layer (B), whatever thickness may be suitable when the film thickness is approximately 1 nm or more, from the viewpoint of decreasing the high electric field leakage current. This is because, in the middle layer (B), the leakage current may flow mainly as FN (Fowler-Nordheim) tunneling current, thereby the leakage current has no thickness dependence.

On the other hand, from the viewpoint of decreasing the low electric field leakage current, thicker middle layer (B) is desirable. Note that, in particular, the blocking effect of the middle layer (B) against the low electric field leakage current of the high-k insulating films at the bottom layer (A) and the top layer (C) is lost when the equivalent oxide thickness of the middle layer (B) is 1.5 nm or less, since the tunnel current flows through the middle layer (B) even in the low electric field region.

However, when the middle layer (B) is made excessively thick, the equivalent oxide thickness of the flash memory cell becomes excessively large, and the voltage applied to the control gate electrode also becomes large. Accordingly, it is desirable that the middle layer (B) may be made 4 to 5 nm or less in the equivalent $SiO_2$ thickness.

From the above discussion, the range of the optimum thickness of the silicon oxide film of the middle layer (B) is within the range of 1.5 nm to 5 nm.

Advantage of using hafnium aluminate (HfAlO) for the bottom layer and the top layer:

When the bottom layer (A) and the top layer (C) are $Al_2O_3$, the in-film defects are relatively small; and however, height of dielectric constant is limited. On the other hand, when the bottom layer (A) and the top layer (C) are $HfO_2$, the dielectric constant is high; and however, the in-film defects are relatively large.

Accordingly, it is also possible to find the optimum characteristics by using hafnium aluminate becoming middle of the both, adjusted to device specifications demanded by the flash memory.

Optimum Thickness Range of HfAlO:

For structure of HfAlO/$SiO_2$/HfAlO, it is possible to obtain the superiority of the high electric field leakage current as compared with the HfAlO single layer film.

Figure 46:
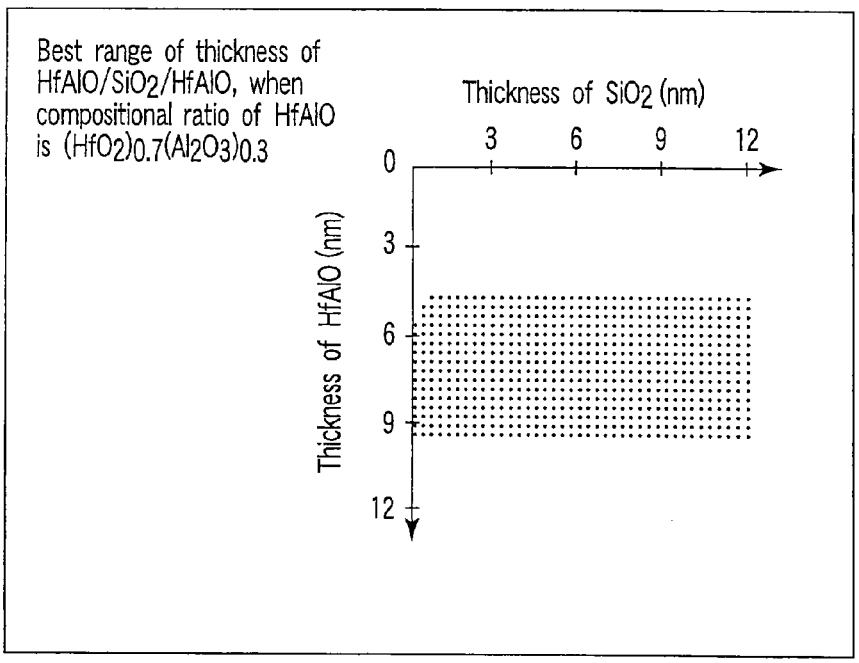
FIG. 46 is a view showing range of an optimum thickness of HfAlO and $SiO_2$.

FIGS. 46 and 47 show the range of the optimum thickness of HfAlO from which the leakage current superiority is obtained, when the compositions of HfAlO of the bottom layer (A) and the top layer (C) are equal.

Effect of Interfacial Layer on the Charge Storage Layer and its Optimum Thickness:

There may be some cases in which unexpected interfacial layer is formed on the charge storage layer. This is because, when the charge storage layer is the silicon nitride film, its surface is oxidized during the formation of the bottom layer (A) of the second insulating film, since the formation is generally performed in an oxidizing atmosphere.

Such an interfacial layer provides the following effects when it is formed with suitable controllability.

One is that, by forming the interfacial layer, it is possible to decrease roughness of the silicon nitride film as a base of the second insulating film. When the roughness of the base decreases, it is possible to decrease characteristic variation of the memory cell. The other one is that, by forming the interfacial layer, traps are formed between the silicon nitride film and the interfacial layer, so that it is possible to improve the function of the silicon nitride film as the charge storage layer (for instance, refer to E. Suzuki, Y. Hayashi, K. Ishii and T. Tsuchiya, "Traps created at the interface between the nitride and the oxide on the nitride by thermal oxidation", Appl. Phys. Lett. 42, 608 (1983)).

However, when the interfacial layer with a low dielectric constant is excessively thick, the effect of the present invention is reduced. When the interfacial layer exists, the thickness thereof is made 1 nm or less, and desirably 0.5 nm or less.

Materials of Reaction Prevention Layer:

It is desirable that the reaction prevention layer is formed of the silicon nitride film.

The reason is that the silicon nitride film prevents the metal elements and silicon from diffusing, where examples of metal elements are Hf, Al in a high-k insulator.

Additionally, silicon nitride can suppress the diffusion of metal elements and silicon between the control gate and the top layer (C) of the second insulating film, when the control gate electrode is also, for instance, FUSI (fully-silicided material), and metal materials such as TaN, in addition to the polycrystalline silicon.

3. APPLICATION EXAMPLE

The examples of the present invention is mainly applicable to the nonvolatile semiconductor memories having the memory cell whose charge storage layer is formed of the insulating film, and particularly among them, applicable to the flash memory with NAND type device constitution. In the embodiments of the present invention, the examples of the silicon nitride film as the charge storage layer are shown. However, the charge storage layer is not necessarily the silicon nitride film. It is also possible to apply the present invention to the case of the charge storage layer of a high dielectric constant insulating film. For instance, the charge storage layer may be formed of an insulating film including Hf, and nitrogen may be added thereto. Further, the present invention is applicable to the case in which the charge storage layer is formed of the laminated film or continuous film of the high dielectric constant insulating film and the silicon nitride film. Furthermore, the charge storage layer is not necessarily the insulating film layer having definite thickness. The present invention is also applicable to, for instance, "interface trap type memory" which uses electron capture centers existing on the boundary between the tunnel insulating film and the block insulating film, instead of the charge storage layer.

Further, since the present invention is basically the invention for the block insulating film existing between the charge storage layer and the control gate electrode, the object to which the present invention is applied is not necessarily the memory cell of MONOS type, and SONOS type.

Therefore, the second insulating film in the present invention, for instance, is capable of being applied as inter-poly insulating film of a floating gate type memory cell. Additionally, the second insulating film in the present invention is capable of being used as the block insulating film of a nano-dot type memory cell.

Additionally, since the present invention has characteristics in constitution method of the second insulating film, the present invention can be used regardless of dopant impurity distribution in the substrate. Therefore, for instance, the present invention is effective for NAND cell of D-type in which the memory cell has no source/drain diffusion layer.

Based on the same consideration, additionally, the stack gate structure according to the examples of the present invention is not necessarily formed on the silicon (Si) substrate. For instance, the stack gate structure of the present invention may be formed on the well region formed on the silicon substrate.

Additionally, instead of the silicon substrate, SiGe substrate, Ge substrate, SiGeC substrate and the like may be used, and the stack gate structure of the present invention may be formed on the well region in these substrates.

Further, in the examples of the present invention, it is possible to use SOI (silicon on insulator) substrate, SGOI (silicon-germanium on insulator) substrate, GOI (germanium on insulator) substrate and the like in which a thin film semiconductor is formed on the insulating film, and the stack gate structure of the present invention may be formed on the well region in these substrates.

Additionally, the examples of the present invention describe the memory cell gate stack structure of the n-channel transistor on the p-type silicon substrate (including well region); however, the memory cell gate stack structure of the p-channel transistor on the n-type silicon substrate (including well region) can be substituted for the above structure. In this case, the conductive type of the source or the drain diffusion layer is the p-type.

Additionally, the examples of the present invention are the invention relating to element technology in the memory cell, so that the invention does not depend on a manner of connection in the circuit level of the memory cell. Therefore, the examples of the present invention is widely applicable to the nonvolatile semiconductor memory of NOR type, AND type and DINOR type, 2-tr (transistor) type flash memory in which advantages of NOR type and NAND type are fused together, and further, 3-tr NAND type having a structure in which one memory cell is sandwiched by two selection transistors, in addition to the NAND type nonvolatile semiconductor memory.

Furthermore, since the second insulating film of the present invention has characteristics of decreasing the leakage current for both the high electric field region and the low electric field region, the application object is not necessarily limited to the nonvolatile semiconductor memory; and the second insulating film may be used as, for instance, the insulating film of a DRAM capacitor, the gate insulating film of a CMOS transistor and the like.

4. OTHERS

The examples of the invention can be materialized by modifying the respective constituents within the range of not departing from the gist.

Additionally, the stack gate structure according to the examples of the present invention is not necessarily formed on the silicon (Si) substrate. For instance, the stack gate structure of the present invention may be formed on the well region formed on the silicon substrate. Additionally, instead of the silicon substrate, SiGe substrate, Ge substrate, SiGeC substrate and the like may be used, and the stack gate structure of the present invention may be formed on the well region in these substrates.

Further, in the examples of the present invention, it is possible to use SOI (silicon on insulator) substrate, SGOI (silicon-germanium on insulator) substrate, GOI (germanium on insulator) substrate and the like in which a thin film semiconductor is formed on the insulating film, and the stack gate structure of the present invention may be formed on the well region in these substrates.

Additionally, the examples of the present invention describe the memory cell gate stack structure of the n-channel transistor on the p-type silicon substrate (including well region); however, the memory cell gate stack structure of the p-channel transistor on the n-type silicon substrate (including well region) can be substituted for the above structure. In this case, the conductive type of the source or the drain diffusion layer is the p-type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a semiconductor region;
    a first insulating film on the semiconductor region;
    a charge storage layer on the first insulating film;
    a second insulating film on the charge storage layer; and
    a control gate electrode on the second insulating film,
    wherein the second insulating film includes a bottom layer (A) formed of Hf-oxide, a top layer (C) formed of Hf-oxide, and a middle layer (B) formed of $(SiO_2)_x(Si_3N_4)_{1-x}$ ($0.75 \leq x \leq 1$), the middle layer (B) is between the bottom layer (A) and the top layer (C),
    the charge storage layer is formed of a plurality of layers, and
    the control gate electrode includes a first layer comprising Ta, and a second layer comprising W, the first layer is contact with the top layer C, and the second layer is contact with the first layer.

2. The device of claim 1,
    wherein one of the plurality of layers of the charge storage layer is formed of silicon nitride.

3. The device of claim 1,
    wherein one of the plurality of layers of the charge storage layer is formed of polycrystalline silicon.

4. The device of claim 1,
    wherein one of the plurality of layers of the charge storage layer is formed of a phosphorus-doped polycrystalline silicon.

5. The device of claim 1,
    wherein one of the plurality of layers of the charge storage layer is formed of metal dots.

6. The device of claim 1,
    wherein the first insulating film is formed of silicon oxynitride.

7. The device of claim 1,
    wherein the bottom layer (A) and the top layer (C) have an equal thickness.

8. The device of claim 7,
    wherein the thickness of bottom layer (A) and the top layer (C) are within a range of 5.1 nm to 11.4 nm.

9. The device of claim 1,
    wherein the thickness of the bottom layer (A) and the top layer (C) differs.

10. The device of claim 1,
    wherein the thickness of the bottom layer (A) is thicker than the thickness of the top layer (C).

11. A nonvolatile semiconductor memory device comprising:
    a semiconductor region;
    a first insulating film on the semiconductor region;
    a charge storage layer on the first insulating film;
    a second insulating film on the charge storage layer; and
    a control gate electrode on the second insulating film, wherein the second insulating film includes a bottom layer (A) formed of Hf-oxide, a top layer (C) formed of Hf-oxide, and a middle layer (B) formed of $(SiO_2)_x(Si_3N_4)_{1-x}$ ($0.75 \leq x \leq 1$), the middle layer (B) is between the bottom layer (A) and the top layer (C), the charge storage layer is formed of a plurality of layers and one of the plurality of layers includes metal dots, and the control gate electrode includes a first layer comprising Ta, and a second layer comprising W, the first layer is contact with the top layer C, and the second layer is contact with the first layer.

12. The device of claim 11, wherein one of the plurality of layers of the charge storage layer is formed of silicon nitride.

13. The device of claim 11, wherein one of the plurality of layers of the charge storage layer is formed of polycrystalline silicon.

14. The device of claim 11, wherein one of the plurality of layers of the charge storage layer is formed of a phosphorus-doped polycrystalline silicon.

15. The device of claim 11, wherein the first insulating film is formed of silicon oxynitride.

16. The device of claim 11, wherein the bottom layer (A) and the top layer (C) have an equal thickness.

17. The device of claim 15, wherein the thickness of bottom layer (A) and the top layer (C) are within a range of 5.1 nm to 11.4 nm.

18. The device of claim 11, wherein the thickness of the bottom layer (A) and the top layer (C) differs.

19. The device of claim 11, wherein the thickness of the bottom layer (A) is thicker than the thickness of the top layer (C).

* * * * *